(12) United States Patent
Koike et al.

(10) Patent No.: US 7,910,940 B2
(45) Date of Patent: Mar. 22, 2011

(54) SEMICONDUCTOR LIGHT-EMITTING DEVICE

(75) Inventors: Susumu Koike, Osaka (JP); Masaaki Suzuki, Osaka (JP); Tadaaki Ikeda, Kagoshima (JP); Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 557 days.

(21) Appl. No.: 11/995,924

(22) PCT Filed: Jul. 27, 2006

(86) PCT No.: PCT/JP2006/314844
§ 371 (c)(1),
(2), (4) Date: Jan. 16, 2008

(87) PCT Pub. No.: WO2007/018039
PCT Pub. Date: Feb. 15, 2007

(65) Prior Publication Data
US 2009/0256166 A1 Oct. 15, 2009

(30) Foreign Application Priority Data

Aug. 5, 2005 (JP) .................................. 2005-228748
Jun. 14, 2006 (JP) .................................. 2006-164958

(51) Int. Cl.
*H01L 21/00* (2006.01)
(52) U.S. Cl. ............................ 257/98; 257/89; 257/81
(58) Field of Classification Search ................ 257/98, 257/89, 81
See application file for complete search history.

(56) References Cited

U.S. PATENT DOCUMENTS

| 6,245,259 | B1 * | 6/2001 | Hohn et al. .............. 252/301.36 |
| 6,852,376 | B2 * | 2/2005 | Chien et al. .................... 428/1.3 |
| 7,083,490 | B2 * | 8/2006 | Mueller et al. .................. 445/24 |
| 7,091,661 | B2 * | 8/2006 | Ouderkirk et al. ............. 313/512 |
| 7,102,152 | B2 * | 9/2006 | Chua et al. ....................... 257/14 |
| 7,245,072 | B2 * | 7/2007 | Ouderkirk et al. ............. 313/502 |
| 7,318,651 | B2 * | 1/2008 | Chua et al. ....................... 362/11 |
| 7,345,319 | B2 * | 3/2008 | Okada ............................. 257/98 |
| 7,427,366 | B2 * | 9/2008 | Tian et al. ............... 252/301.4 S |
| 7,495,383 | B2 * | 2/2009 | Chua et al. .................... 313/503 |

(Continued)

FOREIGN PATENT DOCUMENTS

JP 49-122292 11/1974

(Continued)

OTHER PUBLICATIONS

Tadatomo, K., et al., "Development of White LED Fabricated by RGB Phosphor and Near Ultra-Violet LED," Mitsubishi Cable Industries Review, Jul. 2002, p. 35-41, vol. 99.

(Continued)

*Primary Examiner* — Laura M Menz
(74) *Attorney, Agent, or Firm* — McDermott Will & Emery LLP

(57) ABSTRACT

A semiconductor light-emitting device 10 has a semiconductor chip 12 for emitting light having a wavelength in blue to ultraviolet regions, and a sealing portion 16 formed in at least a partial region on a passage path on which the light is passed. The sealing portion 16 includes a sealing material 16d which is a composite material including a matrix material 16a made of a resin, nano-particles 16b made of an inorganic material which are distributed in the matrix material 16a, the nano-particle 16b having an effective particle size which is ¼ or less of the wavelength of the light in the matrix material 16a, and a fluorescent material 16c.

15 Claims, 27 Drawing Sheets

U.S. PATENT DOCUMENTS

| | | | |
|---|---|---|---|
| 7,498,734 B2 * | 3/2009 | Suehiro et al. | 313/502 |
| 7,560,859 B2 * | 7/2009 | Saito et al. | 313/498 |
| 7,656,580 B2 * | 2/2010 | Chang | 359/452 |
| 7,679,277 B2 * | 3/2010 | Morioka et al. | 313/486 |
| 7,713,442 B2 * | 5/2010 | Tian et al. | 252/301.4 R |
| 7,795,625 B2 * | 9/2010 | Suzuki | 257/81 |
| 2001/0048966 A1 | 12/2001 | Trumble et al. | |
| 2004/0071937 A1 * | 4/2004 | Chien et al. | 428/143 |
| 2004/0094757 A1 * | 5/2004 | Braune et al. | 257/13 |
| 2005/0127378 A1 * | 6/2005 | Suehiro et al. | 257/81 |
| 2006/0157686 A1 * | 7/2006 | Jang et al. | 257/14 |
| 2007/0041191 A1 * | 2/2007 | Okada | 362/260 |
| 2008/0030860 A1 * | 2/2008 | Chang | 359/599 |
| 2008/0152933 A1 * | 6/2008 | Mizuno et al. | 428/480 |
| 2009/0045422 A1 * | 2/2009 | Kato et al. | 257/98 |
| 2009/0050911 A1 * | 2/2009 | Chakraborty | 257/89 |
| 2009/0256166 A1 * | 10/2009 | Koike et al. | 257/98 |
| 2009/0278147 A1 * | 11/2009 | Suzuki | 257/98 |

FOREIGN PATENT DOCUMENTS

| | | |
|---|---|---|
| JP | 59-69936 | 4/1984 |
| JP | 7-99345 | 4/1995 |
| JP | 7-297451 | 11/1995 |
| JP | 9-153645 | 6/1997 |
| JP | 10-93146 | 4/1998 |
| JP | 10-112557 | 4/1998 |
| JP | 10-190065 | 7/1998 |
| JP | 10-261821 | 9/1998 |
| JP | 11-31845 | 2/1999 |
| JP | 11-40858 | 2/1999 |
| JP | 11-46019 | 2/1999 |
| JP | 11-87778 | 3/1999 |
| JP | 11-177146 | 7/1999 |
| JP | 2000-49389 | 2/2000 |
| JP | 2000-164937 | 6/2000 |
| JP | 2001-177157 | 6/2001 |
| JP | 2001-298216 | 10/2001 |
| JP | 2003-519717 | 6/2003 |
| JP | 2004-31989 | 1/2004 |
| JP | 2004-71908 | 3/2004 |
| JP | 2005-93724 | 4/2005 |
| JP | 2005-167091 | 6/2005 |
| JP | 2005-197317 | 7/2005 |
| JP | 2005-524737 | 8/2005 |
| JP | 3775081 | 3/2006 |

OTHER PUBLICATIONS

Sugimoto, M., et al., "High-Output White LED Light Source," Matsushita Electric Works Technical Report, p. 4-9, vol. 53, No. 1.

* cited by examiner (a)

(b)

(a)

(b)

US 7,910,940 B2

SEMICONDUCTOR LIGHT-EMITTING DEVICE

RELATED APPLICATIONS

This application is the U.S. National Phase under 35 U.S.C. §371 of International Application No. PCT/JP2006/314844, filed on Jul. 27, 2006, which in turn claims the benefit of Japanese Application No. 2005-228748, filed on Aug. 5, 2005, Japanese Application No. 2006-164958, filed on Jun. 14, 2006, and the disclosures of which applications are incorporated by reference herein.

TECHNICAL FIELD

The present invention relates to a semiconductor light-emitting device in which a semiconductor chip, such as an LED (Light Emitting Diode) chip or the like, is packaged.

BACKGROUND ART

In recent years, a white LED device has come into practice and attracted attention because they would be expected to replace fluorescent lamps. The development of an LED chip which employs a gallium nitride (GaN)-based compound semiconductor and emits light in blue to ultraviolet regions has spurred the commercialization of the white LED device.

There are mainly two methods for obtaining white light by using the LED chip which emits light in blue to ultraviolet regions (see, for example, Non-Patent Document 1). In a first method, white light is obtained from blue light which is radiated by a blue LED chip and yellow light which is obtained by exciting a fluorescent material (cerium-doped yttrium aluminum garnet (YAG:Ce), etc.) using the blue light. In a second method, white light is obtained by exciting a plurality of fluorescent materials using light which is radiated by an LED chip which emits light in a violet region to an ultraviolet region to obtain red, green, and blue (three primary colors) light. Fluorescent materials includes $Y_2O_2S$:Eu (abbreviated as P22-RE3) for red, ZnS:Cu, Al (abbreviated as P22-GN4) or $(Ba, Mg)Al_{10}O_{17}$:Eu, Mn (abbreviated as LP-G3) for green, and $(Sr,Ca,Ba,Mg)_{10}(PO_4)_6Cl_2$:Eu (abbreviated as LP-B1) or $(Ba,Mg)Al_{10}O_7$:Eu (abbreviated as LP-B4) for blue.

The white LED device is achieved by packaging the LED chip which emits light in blue to ultraviolet regions and the fluorescent material using a sealing resin material. The package is formed of a sealing resin material which is shaped into a bullet (see, for example, Non-Patent Document 2).

Hereinafter, the conventional white LED device having the bullet-shaped package will be described with reference to FIG. 45.

As shown in FIG. 45, in the conventional white LED device 100, an LED chip 102 which emits light in blue to ultraviolet regions is fixed via a chip fixing paste material 103, such as a Ag paste material, an insulating paste material or the like, to a bottom surface of a cup-shaped die pad portion provided at one end of a first lead frame 101A.

A first electrode 104A and a second electrode 104B are formed on an upper surface of the LED chip 102. The first electrode 104A is electrically connected via a first wire 105A to the first lead frame 101A, and the second electrode 104B is electrically connected via a second wire 105B to a second lead frame 100B which is paired with the first lead frame 101A.

The LED chip 102 is sealed by a resin material 105 which is molded in the shape of a bullet. The resin material 105 is generally a resin material transparent to visual light, such as an epoxy resin, a silicone resin or the like. Also, a fluorescent material 106, such as those described above, is kneaded into the resin material 105 (see, for example, Patent Document 1).

Non-Patent Document 1; Kazuyuki Tadatomo et al., "Mitsubishi Cable Industries Review", Vol. 99, July 2002, pp. 35-41
Non-Patent Document 2: Masaru Sugimoto et al., "Matsushita Electric Works Technical Report", Vol. 53, No. 1, pp. 4-9
Patent Document 1: Japanese Unexamined Patent Application Publication No. 2004-71908
Patent Document 2: Japanese Unexamined Patent Application Publication No. 2005-93724

DISCLOSURE OF THE INVENTION

Problems to be Solved by the Invention

However, the conventional white LED device 100 has the following problems when an epoxy resin or a silicone resin is employed as the sealing resin material 105.

When the epoxy resin is used, the color of the material is changed into yellow. Specifically, the color of the epoxy resin is changed into yellow by light in blue to ultraviolet regions radiated by the LED chip 102, so that the luminance of light emitted from the white LED device 100 is reduced or the color tone is changed. Therefore, light resistance and heat resistance are required for the sealing resin material 105.

Also, when the chip fixing paste material 103 is a resin, the color of the chip fixing paste material 103 is changed by light radiated from the LED chip 102, leading to a reduction in light emission luminance or a deterioration in intensity.

Further, not only the resin material 105 and the fluorescent material 106 of the semiconductor light-emitting device, but also the chip fixing paste material 103 which is a resin, are degraded by externally incident light in an ultraviolet region.

Also, since silicone resins have a lower optical refractive index than that of epoxy resins, light radiated by the LED chip 102 is more likely to be totally reflected by the silicone resin, so that light extraction efficiency from the LED chip 102 is reduced (see, for example, Patent Document 2).

Note that, even when an epoxy resin is used, since the refractive index of the epoxy resin is much smaller than the refractive index of an LED chip (particularly, GaN-based semiconductors), the light extraction efficiency is not sufficient.

Also, the light extraction efficiency is not sufficient in LED chips having light emission wavelengths longer than blue as well as in LED chips having light emission wavelengths in blue to ultraviolet regions.

In view of the above-described conventional problems, an object of the present invention is to improve the light resistance, heat resistance and light extraction efficiency of a sealing material for sealing a semiconductor chip in which a light emitting device is formed.

Solution to the Problems

To achieve the above-described object, the present invention provides a semiconductor light-emitting device in which particles made of an inorganic material and having an effective particle size of ¼ or less of a light emission wavelength are included in a matrix material of a sealing portion.

Specifically, a first semiconductor light-emitting device according to the present invention comprises a semiconductor chip for emitting light having a wavelength in blue to ultraviolet regions, and a sealing portion formed in at least a partial region on a passage path on which the light is passed. The sealing portion includes a sealing material which is a composite material including a matrix material and particles made of an inorganic material which are distributed in the matrix material, the particle having an effective particle size which is ¼ or less of the wavelength of the light in the matrix material, and a fluorescent material.

According to the first semiconductor light-emitting device, the particles distributed in the matrix material of the sealing portion are made of an inorganic material. Therefore, the light resistance and heat resistance of the sealing portion are improved as compared to when the particle made of the inorganic material is not included. In addition, since the effective particle size of the particles distributed in the matrix material is ¼ or less of the wavelength of light emitted from the semiconductor chip, the transparency of the sealing portion is not impaired. In other words, the light extraction efficiency is not impaired. Note that, when the particle size is sufficiently smaller than the light wavelength, the composite material in which the inorganic particles are distributed can be considered as a uniform medium having no variation in refractive index. Also, if the particle size is ¼ or less of the light wavelength, scattering of light in the composite material is only Rayleigh scattering, so that the translucency is unlikely to be degraded.

In the first semiconductor light-emitting device, the sealing portion is preferably formed, covering surroundings of the semiconductor chip.

Thereby, the mechanical strength of the sealing portion is increased, and the heat resistance is improved, so that the sealing portion is unlikely to be peeled off and a crack is unlikely to occur.

In the first semiconductor light-emitting device, the sealing portion is preferably formed, contacting the semiconductor chip.

Even when the sealing portion and the semiconductor chip contact each other, a difference in thermal expansion coefficient between the sealing portion and the semiconductor chip is reduced as compared to when the particles are not included in the matrix material of the sealing portion, so that the sealing portion is unlikely to be peeled off and a crack is unlikely to occur.

In the first semiconductor light-emitting device, the sealing portion preferably comprises a first sealing portion made of the sealing material, and a second sealing portion formed outside the first sealing portion and including the fluorescent material.

By thus providing the first sealing portion made of the sealing material (composite material) near the semiconductor chip, i.e., in a portion having a relatively high optical density, a high level of light extraction efficiency from the semiconductor chip can be achieved and high levels of light resistance and heat resistance can be obtained. Further, by providing the second sealing portion having a higher level of transparency than that of the composite material and including the fluorescent material far from the semiconductor chip, i.e., in a portion having a relatively low optical density, the transmittance of light in the second sealing portion can be improved. As a result, the light extraction efficiency from the semiconductor light-emitting device can be improved.

When the first sealing portion is made of the composite material, the semiconductor light-emitting device preferably further comprises a reflection member for reflecting the light which is provided below and lateral to the semiconductor chip in the first sealing portion.

Thereby, the particle included in the composite material of the first sealing portion near the semiconductor chip attenuates spectra in blue to ultraviolet regions as described below, so that spectra having short wavelengths in a red region or the like are relatively increased. This phenomenon is herein referred to as a filter effect. Thereby, an average color rendering index (Ra) can be increased and color temperature can be decreased.

Further, in this case, the sealing material is preferably an underlying layer, wherein the semiconductor chip is fixed to the underlying layer via a paste material having transparency and is held by the reflection member.

Even when the composite material is used as the underlying layer, since the paste material for fixing the semiconductor chip is transparent, the filter effect of the particle included in the underlying layer can increase the average color rendering index (Ra) and decrease the color temperature.

Also, in the first semiconductor light-emitting device, the sealing portion preferably comprises a first sealing portion including the sealing material, and a second sealing portion formed outside the first sealing portion.

Thereby, the particle for absorbing light in an ultraviolet region which is included in the composite material of the first sealing portion can suppress degradation of the sealing material including a resin or the like due to ultraviolet light.

Also, in the first semiconductor light-emitting device the sealing portion preferably comprises a first sealing portion including the fluorescent material, and a second sealing portion formed outside the first sealing portion and including the sealing material.

Thereby, the particle included in the composite material of the second sealing portion formed outside the first sealing portion attenuates spectra in blue to ultraviolet regions, so that spectra having short wavelengths in a red region or the like are relatively increased, i.e., the filter effect can be obtained. Thereby, the average color rendering index (Ra) can be improved and the color temperature can be decreased.

A second semiconductor light-emitting device according to the present invention comprises a semiconductor chip for emitting light, and a sealing portion formed in at least a partial region on a passage path on which the light is passed. The sealing portion includes a sealing material which is a composite material including a matrix material and particles made of an inorganic material which are distributed in the matrix material, the particle having an effective particle size which is ¼ or less of a wavelength of the light in the matrix material, and comprises a first sealing portion for covering the semiconductor chip and a second sealing portion formed outside the first sealing portion. A first refractive index with respect to the wavelength of the light in the first sealing portion is larger than a second refractive index with respect to the wavelength of the light in the second sealing portion.

According to the second semiconductor light-emitting device, the sealing portion includes the particles made of an inorganic material which are distributed in the matrix material and have an effective particle size of ¼ of the light wavelength in the matrix material, as in the first semiconductor light-emitting device. Therefore, the light resistance and heat resistance of the sealing portion are improved and the transparency of the sealing portion is not impaired. In addition, since the first refractive index with respect to the light wavelength in the first sealing portion is larger than the second refractive index with respect to the light wavelength in the second sealing portion, the refractive index of the whole sealing portion is high in an inner region near the semiconductor chip and low in a region outside the inner region. Therefore, due to the low refractive index of the outer region, the total reflection of radiated light from the semiconductor chip is reduced, so that the light extraction efficiency is improved.

In the second semiconductor light-emitting device, the particle included in the first sealing portion and the particle included in the second sealing portion preferably have different compositions.

For example, when particles having a refractive index larger than that of particles included in the second sealing portion are included in the first sealing portion, the refractive index of the first sealing portion can be reliably caused to be larger than that of the second sealing portion.

Also, in the second semiconductor light-emitting device, the proportion of the particles in the composite material of the first sealing portion is preferably higher than the proportion of the particles in the composite material of the second sealing portion.

Thereby, the refractive index of the first sealing portion can be reliably caused to be larger than that of the second sealing portion.

A third semiconductor light-emitting device according to the present invention comprises a semiconductor chip for emitting light, and a sealing portion formed in at least a partial region on a passage path on which the light is passed. The sealing portion includes a sealing material which is a composite material including a matrix material and particles made of an inorganic material which are distributed in the matrix material, the particle having an effective particle size which is ¼ or less of a wavelength of the light in the matrix material, and has a refractive index with respect to the wavelength of the light, the refractive index being set to become smaller from an inner region near the semiconductor chip to an outer region.

According to the third semiconductor light-emitting device, the sealing portion includes the particles made of an inorganic material which are distributed in the matrix material and have an effective particle size of ¼ of the light wavelength in the matrix material, as in the first semiconductor light-emitting device. Therefore, the light resistance and heat resistance of the sealing portion are improved and the transparency of the sealing portion is not impaired. In addition, since the refractive index with respect to the light wavelength is set to become smaller from an inner region near the semiconductor chip to an outer region, the refractive index of the whole sealing portion is high in an inner region near the semiconductor chip and low in a region outside the inner region. Therefore, due to the low refractive index of the outer region, the total reflection of radiated light from the semiconductor chip is reduced, so that the light extraction efficiency is improved.

In the third semiconductor light-emitting device, a proportion of the particles in the composite material of the sealing portion is preferably higher in the inner region near the semiconductor chip than in the outer region.

Thereby, the refractive index of the inner region can be reliably caused to be larger than that of the outer region in the sealing portion.

Also, in the third semiconductor light-emitting device, of the particles included in the sealing portion, the particle included in the inner region of the sealing portion and the particle included in the outer region preferably have different compositions.

For example, when particles having a composition having a refractive index larger than that of the particle included in the outer region of the sealing portion are included in the inner region of the sealing portion, the refractive index of the inner region can be reliably caused to be larger than that of the outer region in the sealing portion.

A fourth semiconductor light-emitting device comprises a semiconductor chip for emitting light, and a sealing portion formed in at least a partial region on a passage path on which the light is passed. The sealing portion includes a sealing material which is a composite material including a matrix material and particles made of an inorganic material which are distributed in the matrix material, the particle having an effective particle size which is ¼ or less of a wavelength of the light in the matrix material, and comprises a first sealing portion for covering the semiconductor chip and a second sealing portion formed outside the first sealing portion. The particle included in the second sealing portion is made of a material which absorbs light in an ultraviolet region.

According to the fourth semiconductor light-emitting device, the second sealing portion includes particles made of a material which absorbs light in an ultraviolet region, so that emission of undesired ultraviolet light can be suppressed when light emitted by the semiconductor chip includes wavelength components in an ultraviolet region. Also, external incident ultraviolet light is absorbed by the particle added to the second sealing portion, so that degradation of the sealing material or the like can be prevented.

In the fourth semiconductor light-emitting device, the second sealing portion is preferably formed, covering an upper, lower and lateral portions of the semiconductor chip.

A fifth semiconductor light-emitting device comprises a semiconductor chip for emitting light having a wavelength in blue to ultraviolet regions, a sealing portion formed in at least a partial region on a passage path on which the light is passed, a holding material for holding the semiconductor chip, and a paste material having transparency for fixing the semiconductor chip and the holding material. The paste material includes a composite material including a matrix material and particles made of an inorganic material which are distributed in the matrix material, the particle having an effective particle size which is ¼ or less of the wavelength of the light in the matrix material. The particle is made of a material for absorbing light in an ultraviolet region.

According to the fifth semiconductor light-emitting device, the paste material having transparency for fixing the semiconductor chip and the holding material includes a composite material including particles made of an inorganic material. The particle is made of a material for absorbing light in an ultraviolet region. Therefore, a degradation in the paste material due to ultraviolet light and a reduction in light emission luminance can be suppressed. Also, since the paste material is transparent, light emitted from the semiconductor chip can be output via the paste material to the outside, resulting in an improvement in light extraction efficiency. Also, the paste material including the composite material improves heat radiation performance in which heat generated from the semiconductor chip is radiated to the holding material.

In the second or third semiconductor light-emitting device, the sealing portion preferably includes a fluorescent material.

Thereby, when radiated light from the semiconductor chip is light in a blue region or an ultraviolet region, the fluorescent material can be excited to obtain white light.

In the first to third semiconductor light-emitting devices, the particle is preferably made of an inorganic compound.

Thereby, the range of options for the material for improving light resistance, heat resistance, or mechanical strength can be broadened.

In the first to third semiconductor light-emitting devices, the matrix material preferably includes a resin material.

Thereby, the molding performance of the sealing portion is improved.

In this case, the resin material is preferably an inorganic polymer material. Thereby, the light resistance and the heat resistance can be easily improved.

Also, in this case, the resin material is preferably an organic polymer material. Thereby, the molding performance is easily improved.

In the first to third semiconductor light-emitting devices, the matrix material is preferably transparent to visual light.

Thereby, the transparency of the sealing portion is further improved, so that the light extraction efficiency is further improved.

In the first to third semiconductor light-emitting devices, the composite material is preferably transparent to visual light.

Thereby, since the transparency of the sealing portion is further improved, the light extraction efficiency is further improved.

In the first to third semiconductor light-emitting devices, preferably, a refractive index with respect to the light wavelength of the particle is larger than a refractive index with respect to the light wavelength of the matrix material, and is smaller than or equal to a refractive index of the semiconductor chip.

Thereby, the refractive index of the sealing portion is higher than when the particle is not added, so that the light extraction efficiency is further improved.

In the first to third semiconductor light-emitting devices, a proportion of the particles in the composite material is preferably 5% by volume or more and 60% by volume or less.

Thereby, the light resistance and heat resistance of the composite material can be improved while its transparency is sufficiently secured. Note that the proportion of the particles in the composite material is more preferably 10% by volume or more and 50% by volume or less, even more preferably 20% by volume or more and 40% by volume or less.

In the first or third semiconductor light-emitting device, the sealing portion preferably has a hemispherical outer shape.

Thereby, an effect of suppression of total reflection of radiated light from the semiconductor chip can be enhanced.

Also, in the first or third semiconductor light-emitting device, the sealing portion preferably has a quadrangular outer shape.

Thereby, the sealing material including the composite material can be applied by a printing method or the like, so that formation is facilitated. Also, since the upper surface is flat, it is easy to handle the device.

In the first semiconductor light-emitting device which has a first sealing portion and a second sealing portion or in the third semiconductor light-emitting device, the first sealing portion and the second sealing portion preferably have a hemispherical outer shape.

In the first semiconductor light-emitting device which has a first sealing portion and a second sealing portion or in the third semiconductor light-emitting device, preferably, the first sealing portion has a cross-section having a quadrangular outer shape, and the second sealing portion has a hemispherical outer shape.

In the first semiconductor light-emitting device which has a first sealing portion and a second sealing portion or in the third semiconductor light-emitting device, the first sealing portion and the second sealing portion preferably have a quadrangular outer shape.

In the first semiconductor light-emitting device which has a first sealing portion and a second sealing portion or in the third semiconductor light-emitting device, preferably, the first sealing portion has a hemispherical outer shape, and the second sealing portion has a quadrangular outer shape.

The first to third semiconductor light-emitting devices preferably further comprises a reflection member for reflecting the light provided in a region lateral to the semiconductor chip of the sealing portion.

Thereby, the light extraction efficiency is further improved.

In this case, the sealing portion preferably has a reverse taper shape such that a cross-sectional shape of the sealing portion becomes wider from a lower portion thereof to an upper portion thereof.

EFFECT OF THE INVENTION

According to the semiconductor light-emitting device of the present invention, a semiconductor light-emitting device, such as a long-life and high-luminance white LED or the like, can be achieved.

Figure 1:
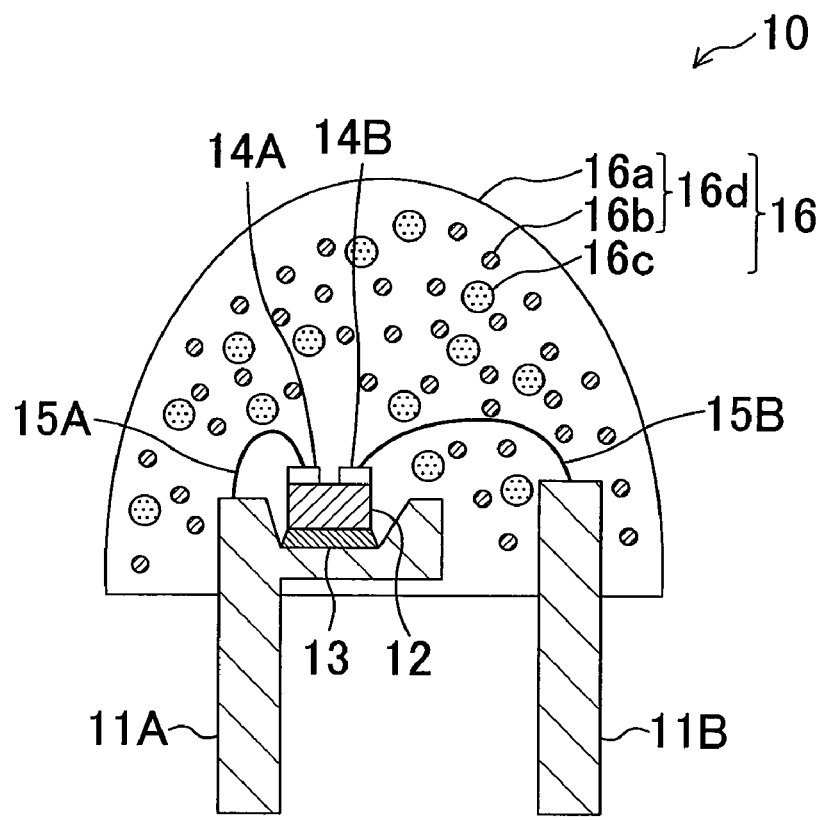
FIG. 1 A schematic cross-sectional view of a structure of a semiconductor light-emitting device according to a first embodiment of the present invention.

DESCRIPTION OF THE REFERENCE CHARACTERS 10 semiconductor light-emitting device
11A first lead frame
11B second lead frame
12 LED chip
13 chip fixing paste material
14A first electrode
14B second electrode
15A first wire
15B second wire
16 sealing portion
16a matrix material
16b nano-particle (first nano-particle)
16b1 primary nano-particle
16b2 complex nano-particle
16c fluorescent material
16d sealing material
17b second nano-particle
20 semiconductor light-emitting device
25 resin material
26 sealing portion
27 fluorescent material layer 26A first sealing portion
26B second sealing portion
30 semiconductor light-emitting device
30A semiconductor light-emitting device
30B semiconductor light-emitting device
30C semiconductor light-emitting device
30D semiconductor light-emitting device
30E semiconductor light-emitting device
30F semiconductor light-emitting device
30G semiconductor light-emitting device
31 substrate
32A first wiring
32B second wiring
40 semiconductor light-emitting device
40A semiconductor light-emitting device
40B semiconductor light-emitting device
40C semiconductor light-emitting device
40D semiconductor light-emitting device
40E semiconductor light-emitting device
40F semiconductor light-emitting device
41A first bump
41B second bump
50 semiconductor light-emitting device
50A semiconductor light-emitting device
50B semiconductor light-emitting device
50C semiconductor light-emitting device
50D semiconductor light-emitting device
50E semiconductor light-emitting device
50F semiconductor light-emitting device
50G semiconductor light-emitting device
50H semiconductor light-emitting device
50I semiconductor light-emitting device
50J semiconductor light-emitting device
50K semiconductor light-emitting device
50L semiconductor light-emitting device
51 case material
51a hollow portion
51b interstice portion
52A first lead
52B second lead
53 sub-mount material
54A first sub-mount electrode
54B first sub-mount electrode
55 paste material
60A semiconductor light-emitting device
60B semiconductor light-emitting device
60C semiconductor light-emitting device
60D semiconductor light-emitting device
60E semiconductor light-emitting device
70 (first) lens
71 second lens
80 semiconductor light-emitting device
80A semiconductor light-emitting device
81 reflector
81a reflection portion
81b interstice portion

BEST MODE FOR CARRYING OUT THE
INVENTION

First Embodiment

A semiconductor light-emitting device according to a first embodiment of the present invention will be described with reference to the accompanying drawings.

FIG. 1 is a schematic cross-sectional view of a structure of a white LED device which is the semiconductor light-emitting device of the first embodiment of the present invention. As shown in FIG. 1, in the white LED device 10 of the first embodiment, an LED chip 12 is fixed and held via a chip fixing paste material 13, such as a Ag paste material, an insulating paste material or the like, to a bottom surface of a cup-shaped die pad portion provided at an upper end portion of a first lead frame 11A.

As the LED chip 12, an LED chip is employed which is formed of, for example, a GaN-based compound semiconductor, and emits light having a wavelength in blue to ultraviolet regions.

A first electrode 14A and a second electrode 14B are formed on an upper surface of the LED chip 12. The first electrode 14A is electrically connected via a first wire 15A to the first lead frame 11A, and the second electrode 14B is electrically connected via a second wire 15B to a second lead frame 11B which is paired with the first lead frame 11A.

The LED chip 12 is sealed by a sealing portion 16 which is molded in the shape of a bullet so that the die pad portion of the first lead frame 11A and an upper end portion of the second lead frame 11B are covered.

The sealing portion 16 comprises a sealing material 16d which is a composite material including a matrix material 16a and nano-particles 16b made of an inorganic material which are uniformly distributed in the matrix material 16a, and a fluorescent material 16c.

Light having a wavelength in blue to ultraviolet regions radiated from the LED chip 12 (hereinafter referred to as radiated light) excites the fluorescent material 16c located on an emission pathway in the sealing portion 16. Excited light and the radiated light are mixed, or excited light waves having a plurality of colors are mixed, so that white light is obtained from the white LED device 10.

Figure 2:
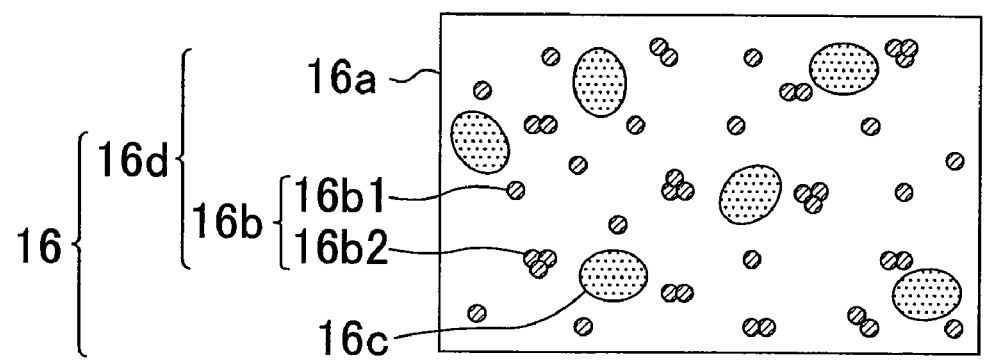
FIG. 2 An enlarged cross-sectional view of a sealing portion in the semiconductor light-emitting device of the first embodiment of the present invention.

FIG. 2 is a partially enlarged view of the sealing portion 16. As shown in FIG. 2, the nano-particles 16b made of an inorganic material include primary nano-particles 16b1 and complex nano-particles 16b2 which are aggregates of the primary nano-particles 16b1. Therefore, the uniform distribution of the nano-particles 16b in the matrix material 16a means that the primary nano-particles 16b1 and the complex nano-particles 16b2 are substantially uniformly distributed, independently of their locations.

Examples of the matrix material 16a include a resin material which is an organic polymer material and is transparent to visual light (e.g., an epoxy resin, an acrylic resin, a cycloolefin resin, etc.), and a resin material which is an inorganic polymer material (e.g., a silicone resin, etc.).

Here, the effective particle size of the nano-particle 16b is set to be smaller than or equal to ¼ of the wavelength of radiated light from the LED chip 12, i.e., the wavelength in the matrix material 16a.

For example, it is assumed that the wavelength of radiated light from the LED chip 12 is 400 nm in the air, and the matrix material 16a is an epoxy resin. In this case, since the epoxy resin has a refractive index of about 1.5, the wavelength of radiated light in the matrix material 16a is 267 nm. Therefore, when the effective particle size of the nano-particle 16b is caused to be smaller than or equal to 67 nm, the size can be set to be smaller than or equal to ¼ of the wavelength in the matrix material 16a.

Note that the effective particle size of the nano-particle 16b is not limited to ¼ or less of the wavelength in the matrix material 16a. If the effective particle size of the nano-particle 16b is set to be 1 nm or more and 100 nm or less, the effect of the present invention can be obtained. In order to obtain a more sufficient level of transparency to radiated light having a wavelength in blue to ultraviolet regions, the effective particle size of the nano-particle 16b may be preferably 1 nm or more and 50 nm or less.

In this case, if the particle size of the nano-particle is less than 1 nm, then when the nano-particle is made of a material which exhibits a quantum effect, fluorescent light may be generated, thereby affecting characteristics. Note that the particle size and the effective particle size of the nano-particle 16b added to the matrix material 16a can be determined by an electron microscope or the like.

The particle size of the primary nano-particle 16b1 is preferably 1 nm or more and 100 nm or less, and more preferably, the substantial effective particle size is 1 nm or more and 50 nm or less. Note that the value of the effective particle size of the primary nano-particle 16b1 can be obtained by particle size measurement employing a particle size distribution analyzer in solution, or in addition, particle size measurement employing a gas adsorption method in powder, or particle size measurement in which observation is performed using an electron microscope.

More preferably, if the primary nano-particles 16b1 have an average particle size of 1 nm or more and 10 nm or less, and almost all primary nano-particles 16b1 are uniformly distributed without aggregation, Rayleigh scattering is more reduced, preferably resulting in a sufficient level of transparency. In this state, the uniform distribution can be confirmed by observing the composite material using a transmission electron microscope.

Figure 3:
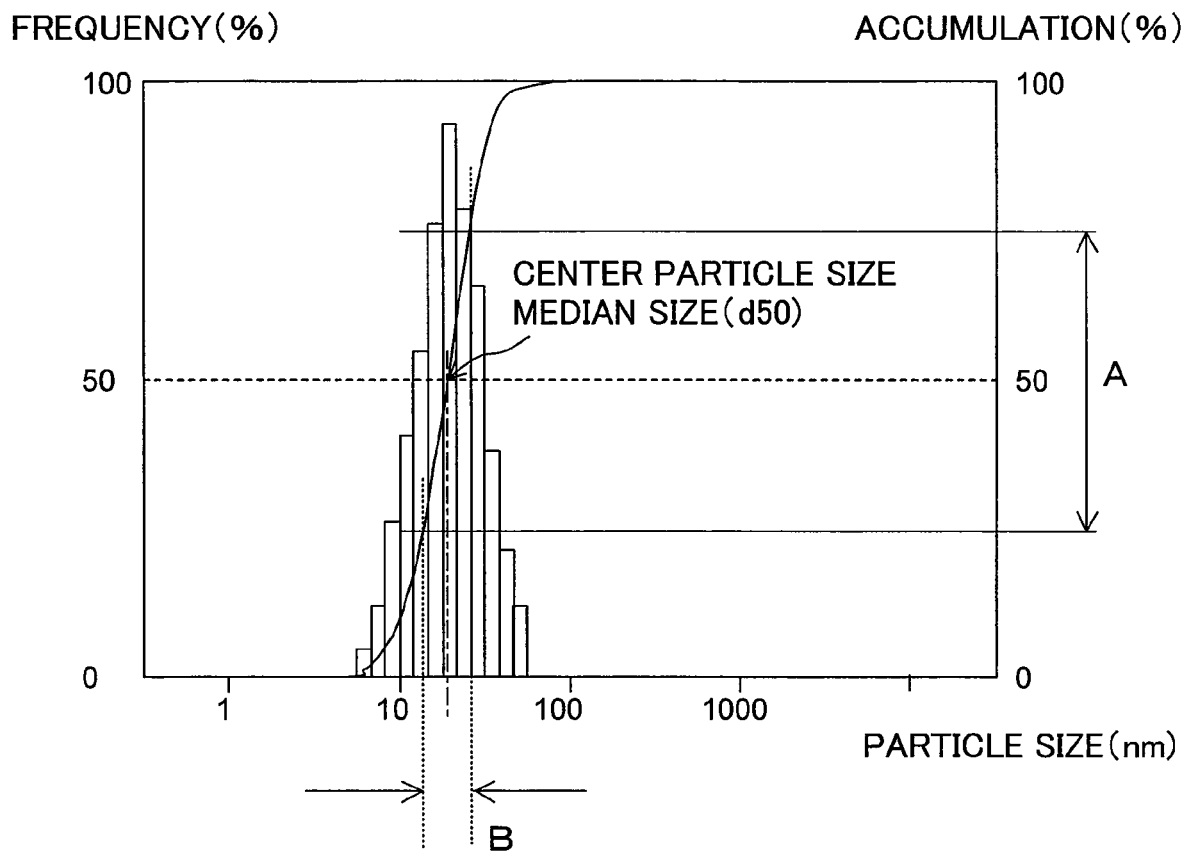
FIG. 3 A graph for describing an effective particle size of nano-particles added to the sealing portion in the semiconductor light-emitting device of first embodiment of the present invention.

The effective particle size will be now described with reference to FIG. 3. In FIG. 3, the horizontal axis represents the particle sizes of the nano-particles 16b, the left vertical axis represents the frequencies of the nano-particles 16b with respect to the particle sizes on the horizontal axis, and the right vertical axis represents the cumulative frequencies of the particle sizes. The effective particle size refers to a particle size range B in which cumulative frequencies are present within a range A which covers 50% of the particle size frequency distribution (particle frequencies) of all nano-particles 16b around a center particle size (median size: d50) which is a particle size whose cumulative frequency is 50% in the particle size frequency distribution. The same is true of the effective particle size of the primary nano-particle 16b1. The precise value of the effective particle size may require measurement of, for example, 200 or more nano-particles 16b or primary nano-particles 16b1.

The nano-particle 16b may be, for example, made of at least one type of inorganic material selected from the group consisting of inorganic oxides, metal nitrides, metal carbides, carbon compounds, and sulfides.

Examples of inorganic oxides include titanium oxide (refractive index: 2.2 to 2.5), tantalum oxide (refractive index: 2.0 to 2.3), niobium oxide (refractive index: 2.1 to 2.3), tungsten oxide (refractive index: 2.2), zirconium oxide (refractive index: 2.1), zinc oxide (refractive index: 1.9 to 2.0), indium oxide (refractive index: 2.0), tin oxide (refractive index: 2.0), hafnium oxide (refractive index: 2.0), yttrium oxide (refractive index: 1.9), silicon oxide (refractive index: 1.4 to 1.5), aluminum oxide (refractive index: 1.7 to 1.8), and the like. A composite inorganic oxide of these can also be used. Examples of metal nitrides include silicon nitride (refractive index: 1.9 to 2.0) and the like. Examples of metal carbides include silicon carbide (refractive index: 2.6) and the like. Examples of carbon compounds include inorganic materials having translucency, such as diamond (refractive index: 3.0), diamond-like carbon (refractive index: 3.0), and the like, though they are made only of carbon. Examples of sulfides include copper sulfide, tin sulfide, and the like. Note that a refractive index added to the name of each inorganic material indicates a refractive index with respect to radiated light from the LED chip 12, i.e., radiated light having a wavelength in blue to ultraviolet regions.

Further, the nano-particle 16b may be an inorganic particle which includes, as a major ingredient, at least one oxide selected from the group consisting of titanium oxide, tantalum oxide, zirconium oxide, and zinc oxide described above as an inorganic compound for causing the sealing material 16d to have a high refractive index. These inorganic particles are easily available as many types of commercial products.

Note that an inorganic compound which is likely to exhibit a photocatalytic action due to ultraviolet light, such as titanium oxide, needs to have the rutile crystal structure, but not the anatase crystal structure having a strong photocatalytic action, or needs to be amorphous, or the surface of a nano-particle made of such an inorganic compound needs to be modified by an inorganic compound having an inactive photocatalytic action, such as silicon oxide ($SiO_2$), aluminum oxide (alumina: $Al_2O_3$) or the like.

The proportion of the nano-particles 16b in the sealing material 16d (composite material) is preferably 5% by volume or more and 60% by volume or less. If the proportion of the nano-particles 16b is excessively high, the transparency of the sealing material 16d decreases. Conversely, if the proportion of the nano-particles 16b is excessively low, the effect of addition of the nano-particles 16b is small.

Figure 4:
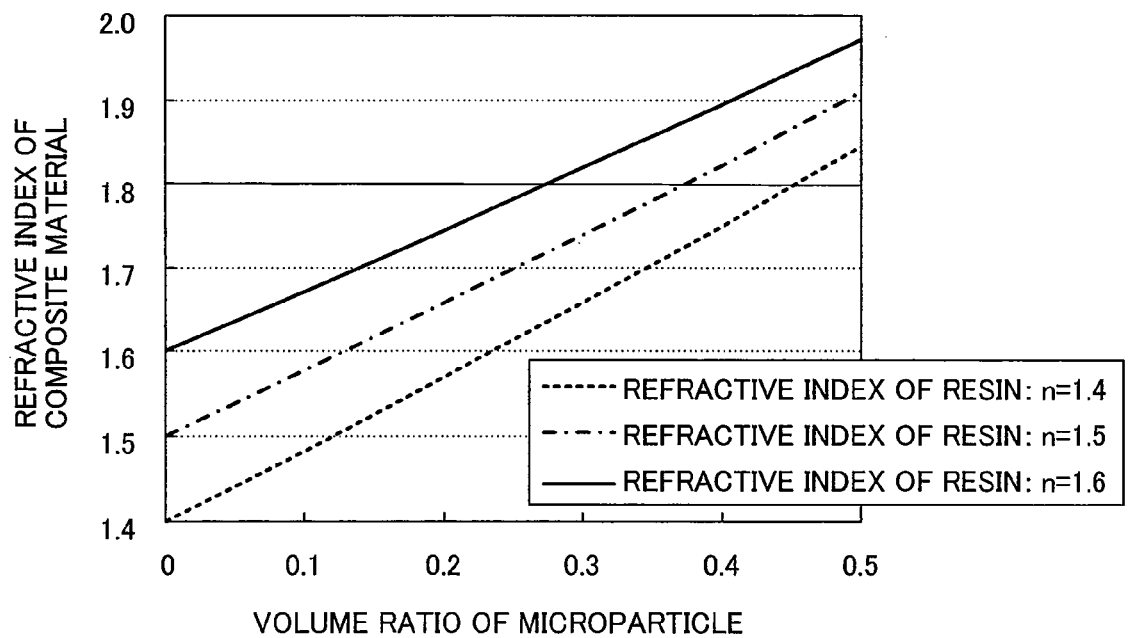
FIG. 4 A graph showing a relationship between a refractive index of the sealing portion (composite material) and an added amount (volume ratio) of nano-particles in the semiconductor light-emitting device of the first embodiment of the present invention.

FIG. 4 shows the results of calculation of changes in the refractive indices $n_c$ of composite materials with respect to the proportion of nano-particles 16b in sealing materials 16d (the composite materials), where, for example, the matrix materials 16a are made of materials having refractive indices of 1.4, 1.5 and 1.6, respectively, and the nano-particle 16b is made of titanium oxide ($TiO_2$) (refractive index: 2.4). The calculation is performed using Expression (1) below (Maxwell-Garnett Theory). Note that the refractive index of a composite material refers to an effective refractive index when the composite material is considered as a medium having a single refractive index.

$$n_c^2 = n_2^2 \times \{n_1^2 + 2n_2^2 + 2P_1(n_1^2 - n_2^2)\} / \{n_1^2 + 2n_2^2 - P_1(n_1^2 - n_2^2)\} \quad (1)$$

In Expression (1), $n_c$ represents the refractive index of the composite material, $n_1$ represents the refractive index of the nano-particle 16b, $n_2$ represents the refractive index of the matrix material 16a, and $P_1$ represents the proportion (by volume) of the nano-particles 16b in the composite material.

As can be seen from FIG. 4, the refractive index of the composite material may be caused to be 1.8 or more by setting the proportion of the nano-particles 16b in the composite material to be 46% by volume, 37% by volume, or 28% by volume when the refractive index of the matrix material 16a is 1.4, 1.5, or 1.6, respectively. Here, since general optical resins have refractive indices ranging from 1.4 to 1.7, it is considerably difficult to attain a refractive index exceeding 1.7 (e.g., 1.8 or more) when only optical resins are used. Therefore, the proportion of the nano-particles 16b in the composite material is preferably 5% by volume or more and 60% by volume or less, though the valid range varies depending on the material properties of the matrix material 16a and the nano-particle 16b. More preferably, the proportion is 10% by volume or more and 50% by volume or less. Further, when a general-purpose optical resin having a refractive index of 1.4 to 1.55 is used as the matrix material 16a, the proportion is more preferably about 20% by volume or more and 40% by volume or less.

The fluorescent material 16c may be a fluorescent material with which yellow light is obtained, such as YAG:Ce or the like, when the LED chip 12 outputs radiated light of blue. When radiated light in a violet region to an ultraviolet region is output, a plurality of types of fluorescent materials are used as the fluorescent material 16c. Specifically, $Y_2O_2S$:Eu can be used for red; ZnS:Cu, Al or $(Ba,Mg)Al_{10}O_7$:Eu, Mn can be used for green; and $(Sr,Ca,Ba,Mg)_{10}(PO_4)_6Cl_2$:Eu or $(Ba, Mg)Al_{10}O_7$:Eu can be used for blue.

According to the semiconductor light-emitting device of the first embodiment, the nano-particles 16b made of an inorganic material are uniformly distributed in the sealing material 16d included in the sealing portion 16, so that the light resistance and heat resistance of the sealing portion 16 are improved as compared to when the nano-particle 16b is not added. Also, since the effective particle size of the distributed nano-particles 16b is set to be ¼ or less of the wavelength of light radiated from the LED chip 12 (semiconductor chip), the transparency of the sealing portion 16 is not impaired, and therefore, the light extraction efficiency is not impaired.

Further, since the difference in thermal expansion coefficient between the sealing portion 16 and the LED chip 12 is smaller than when the nano-particle 16b is not added, the sealing portion 16 is unlikely to be peeled off the LED chip 12 and a crack is unlikely to occur in the sealing portion 16 (sealing material 16d).

Also, since the refractive index of the sealing portion 16 with respect to radiated light is higher than when the nano-particle 16b is not added, the light extraction efficiency is further improved.

Note that, if zinc oxide (ZnO), titanium oxide ($TiO_2$), or cerium oxide ($CeO_2$), which can absorb light in an ultraviolet region, is used as the nano-particle 16b added to the sealing portion 16, then when the matrix material 16a of the sealing material 16d is an organic polymer material, such as an epoxy resin or the like, discoloring due to light in an ultraviolet region can be suppressed.

Further, when transparency is imparted to the chip fixing paste material 13, radiated light from the LED chip 12 is not absorbed by the chip fixing paste material 13, so that the light extraction efficiency is improved. Note that the chip fixing paste material 13 having transparency can be obtained by causing a transparent paste material having, for example, an epoxy resin or a silicone resin as a major ingredient, a low-melting glass material, or a compound having a siloxane bond to react with each other using a catalyst (first step), subjecting the reaction product obtained in the first step to hydrolysis and dehydration-condensation (second step), and adding the nano-particle 16b for absorbing ultraviolet light to a low-temperature hardened glass material obtained by drying the product of the second step to obtain a composite material.

Also, by adding the nano-particle 16b to the chip fixing paste material 13, the heat radiation performance of the chip fixing paste material 13 is improved, and since ultraviolet light is absorbed by the nano-particle 16b, the light resistance (UV resistance) of the chip fixing paste material 13 is also improved.

Second Embodiment

Hereinafter, a semiconductor light-emitting device according to a second embodiment of the present invention will be described with reference to the drawings.

Figure 5:
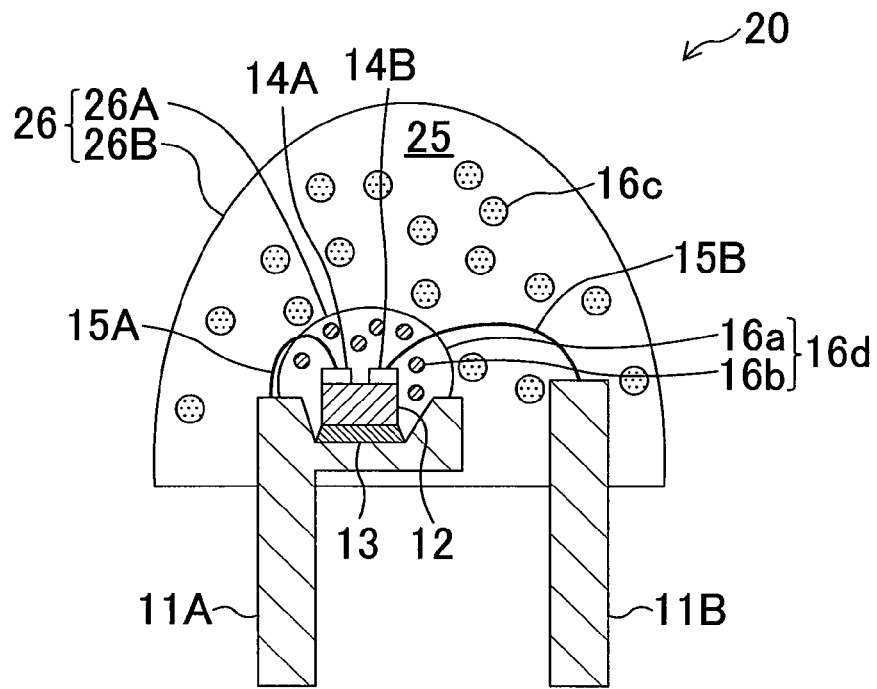
FIG. 5 A schematic cross-sectional view of a structure of a semiconductor light-emitting device according to a second embodiment of the present invention.

FIG. 5 is a schematic cross-sectional view of a structure of a white LED device which is the semiconductor light-emitting device of the second embodiment of the present invention. Note that the same parts as those shown in FIG. 1 are indicated by the same symbols and will not be described.

As shown in FIG. 5, in the semiconductor light-emitting device 20 of the second embodiment, the sealing portion 26 comprises a first sealing portion 26A which directly covers an LED chip 12 held on a die pad portion of a first lead frame 11A, and a second sealing portion 26B in the shape of a bullet which covers upper end portions of the first lead frame 11A (including the first sealing portion 26A) and a second lead frame 11B.

The first sealing portion 26A comprises a sealing material 16d which is a composite material including the nano-particles 16b of the first embodiment. The second sealing portion 26B comprises a resin material 25 into which a fluorescent material 16c is kneaded. The resin material 25 may be the same material that is used for the matrix material 16a of the first embodiment.

According to the semiconductor light-emitting device 20 of the second embodiment, the first sealing portion 26A made of the sealing material 16d which is a composite material is provided in a portion which is near the LED chip 12 and has a relatively high optical density, thereby making it possible to achieve a high level of light extraction efficiency from the LED chip 12 and high levels of light resistance and heat resistance as in the first embodiment.

Also, the second sealing portion 26B made of the resin material 25 having a higher level of transparency than that of the sealing material 16d is provided at a portion which is at a distance from the LED chip 12 and has a relatively low optical density, covering the first sealing portion 26A, so that the light transmittance of the second sealing portion 26B can be improved. As a result, the light extraction efficiency from the semiconductor light-emitting device 20 can be improved.

Note that, if the radiated light of the LED chip 12 has a wavelength longer than that in a blue region, then when zinc oxide, titanium oxide, or cerium oxide, which can absorb ultraviolet light, is used as the nano-particle 16b added to the first sealing portion 26A, the degradation of the matrix material 16a included in the first sealing portion 26A due to ultraviolet light can be suppressed. As a result, as the matrix material 16a, a material which has an excellent level of transparency but is likely to be changed into yellow due to ultraviolet light, such as an epoxy resin or the like, can be used.

Third Embodiment

Hereinafter, a semiconductor light-emitting device according to a third embodiment of the present invention will be described with reference to the drawings.

Figure 6:
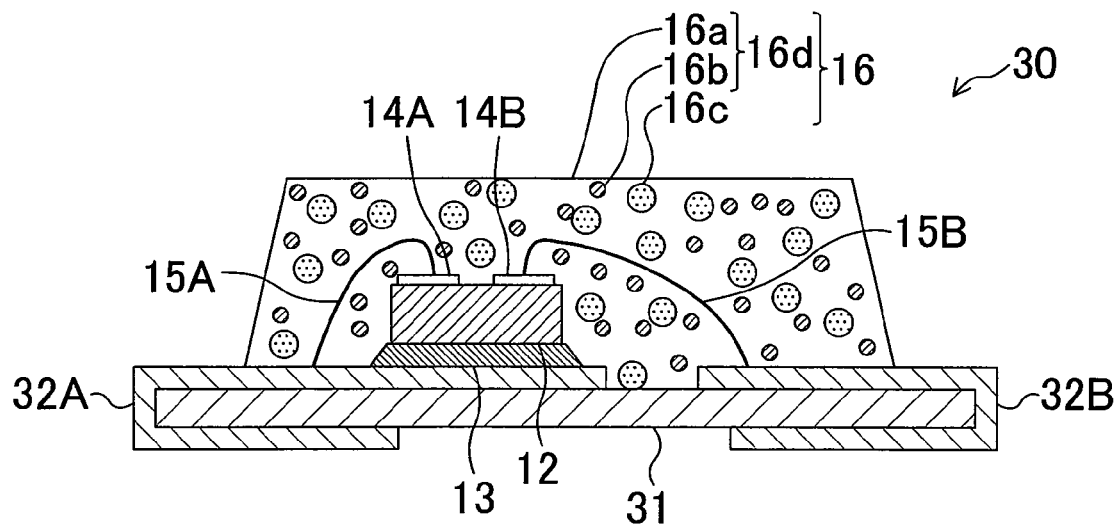
FIG. 6 A schematic cross-sectional view of a structure of a semiconductor light-emitting device according to a third embodiment of the present invention.

FIG. 6 shows a schematic cross-sectional view of a white LED device which is the semiconductor light-emitting device of the third embodiment of the present invention. Also here, the same parts as those shown in FIG. 1 are indicated by the same symbols and will not be described.

As shown in FIG. 6, in the semiconductor light-emitting device 30 of the third embodiment, an LED chip 12 is provided on a printed wiring board which has a substrate 31, and a first wiring 32A and a second wiring 32B selectively formed on a front surface and a rear surface of the substrate 31.

Specifically, the LED chip 12 is fixed via a chip fixing paste material 13 onto the first wiring 32A. Of a first electrode 14A and a second electrode 14B formed on an upper surface of the LED chip 12, the first electrode 14A is electrically connected via a first wire 15A to the first wiring 32A, and the second electrode 14B is electrically connected a the second wire 15B to the second wiring 32B.

The sealing portion 16 comprises a sealing material 16d which is a composite material including a matrix material 16a and nano-particles 16b made of an inorganic material which are uniformly distributed in the matrix material 16a, and a fluorescent material 16c. The materials constituting the sealing portion 16 may be similar to those constituting the sealing portion 16 of the first embodiment.

Surroundings of the LED chip 12 which is electrically connected to the first wiring 32A and the second wiring 32B are sealed by the sealing portion 16 on the printed wiring board.

Note that the first wiring 32A and the second wiring 32B are formed by, for example, forming a wiring made of a copper (Cu) thin film on the substrate 31 by a plating method, and growing nickel (Ni) and gold (Au) successively on the formed wiring by a plating method.

Thus, the semiconductor light-emitting device 30 of the third embodiment is achieved by mounting the LED chip 12 on the printed wiring board, and thereafter, transfermolding a material obtained by mixing the composite material of the matrix material 16a and the nano-particle 16b with the fluorescent material 16c.

Thereby, also in the semiconductor light-emitting device 30 of the third embodiment, the light resistance and heat resistance of the sealing portion 16 are improved, and the light extraction efficiency is also improved, as in the semiconductor light-emitting device 10 of the first embodiment.

Fourth Embodiment

Hereinafter, a semiconductor light-emitting device according to a fourth embodiment of the present invention will be described with reference to the drawings.

Figure 7:
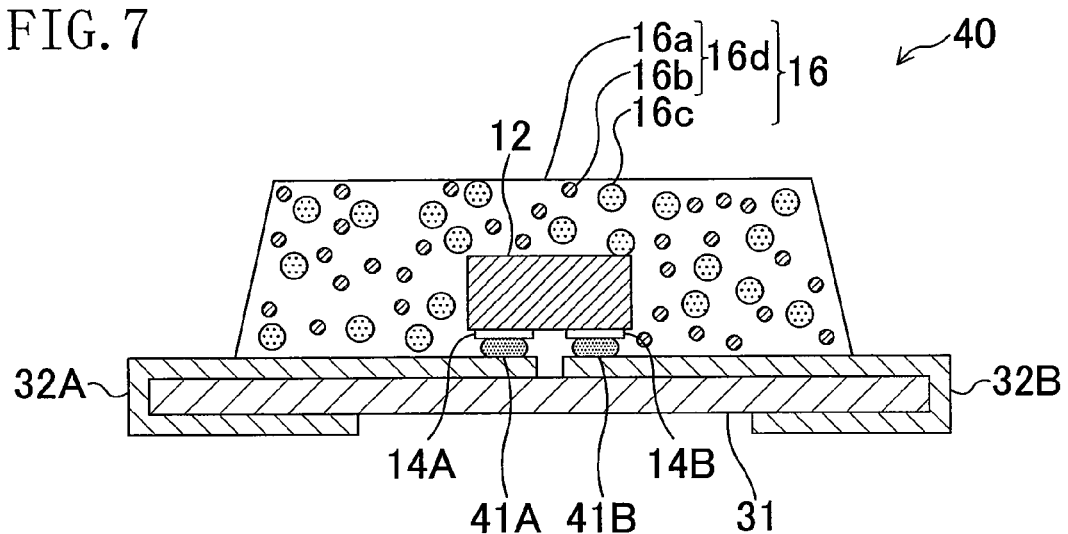
FIG. 7 A schematic cross-sectional view of a structure of a semiconductor light-emitting device according to a fourth embodiment of the present invention.

FIG. 7 is a schematic cross-sectional view of a structure of a white LED device which is the semiconductor light-emitting device of the fourth embodiment of the present invention. Also here, the same parts as those shown in FIG. 1 are indicated by the same symbols and will not be described.

As shown in FIG. 7, in the semiconductor light-emitting device 40 of the fourth embodiment, an LED chip 12 is mounted on a printed wiring board having a substrate 31 and at least a first wiring 32A and a second wiring 32B selectively formed on a front surface and a rear surface of the substrate 31, using a so-called flip-chip (face-down) mounting method, where an upper surface of the LED chip 12 is opposed to a major surface of the substrate 31.

Specifically, of a first electrode 14A and a second electrode 14B which are formed in the LED chip 12 and are each opposed to the substrate 31, the first electrode 14A is electrically connected via a first bump 41A to the first wiring 32A, and the second electrode 14B is electrically connected via a second bump 41B to the second wiring 32B.

Surroundings of the LED chip 12 which is electrically connected to the first wiring 32A and the second wiring 32B are sealed on the printed wiring board by a sealing portion 16.

The sealing portion 16 comprises a sealing material 16d which is a composite material including a matrix material 16a and nano-particles 16b made of an inorganic material which are uniformly distributed in the matrix material 16a, and a fluorescent material 16c. The materials constituting the sealing portion 16 may be similar to those constituting the sealing portion 16 of the first embodiment.

Note that, for example, gold (Au) can be used as a constituent material for the first bump 41A and the second bump 41B.

Thus, the semiconductor light-emitting device 40 of the fourth embodiment is achieved by flip-chip mounting the LED chip 12 on the printed wiring board, and thereafter, transfermolding a material obtained by mixing the composite material of the matrix material 16a and the nano-particle 16b with the fluorescent material 16c.

Therefore, also in the semiconductor light-emitting device 40 of the fourth embodiment, the light resistance and heat resistance of the sealing portion 16 are improved, and the light extraction efficiency is also improved, as in the semiconductor light-emitting devices 10 and 30 of the first and third embodiments.

Also, in the semiconductor light-emitting device 40 of the fourth embodiment, the LED chip 12 is electrically connected to the printed wiring board via a bump, but not a wire. Therefore, the thickness can be reduced as compared to the semiconductor light-emitting device 30 of the third embodiment.

Fifth Embodiment

Hereinafter, a semiconductor light-emitting device according to a fifth embodiment of the present invention will be described with reference to the drawings.

Figure 8:
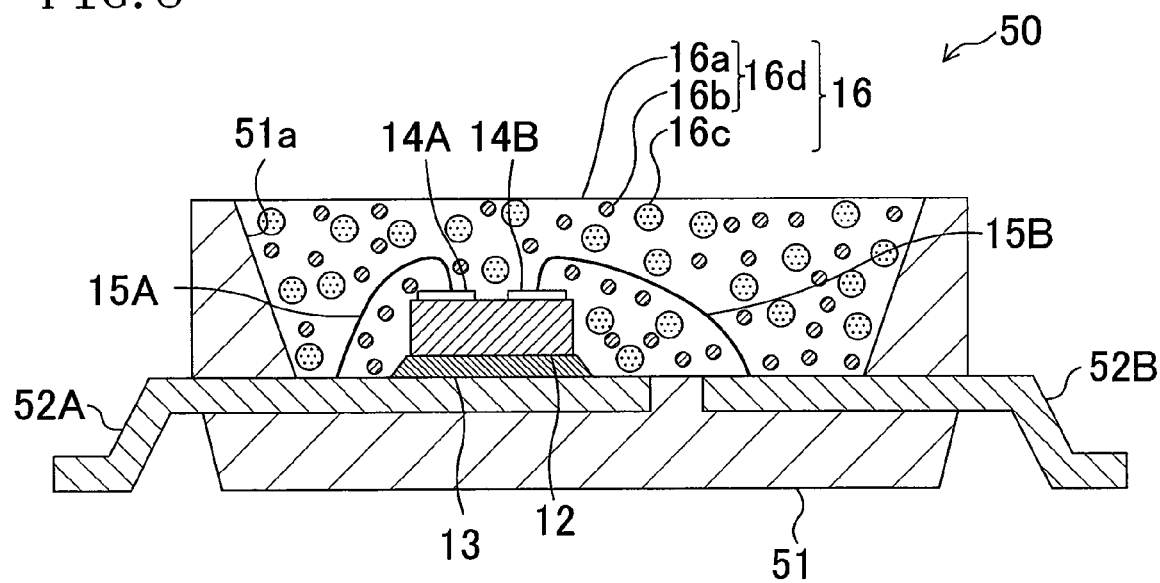
FIG. 8 A schematic cross-sectional view of a structure of a semiconductor light-emitting device according to a fifth embodiment of the present invention.

FIG. 8 is a schematic cross-sectional view of a structure of a white LED device which is the semiconductor light-emitting device of the fifth embodiment of the present invention. Also here, the same parts as those shown in FIG. 1 are indicated by the same symbols and will not be described.

As shown in FIG. 8, in the semiconductor light-emitting device 50 of the fifth embodiment, an LED chip 12 is fixed onto a bottom surface of a hollow portion 51a in a case material 51 having the hollow portion 51a. The case material 51 is a heat-resistant resin material, such as, for example, a liquid crystal polymer or the like. At least a first lead 52A and a second lead 52B are inserted and formed in the case material 51. Note that, in view of reflection with respect to visual light, a white heat-resistant resin material is preferably used.

The first lead 52A and the second lead 52B are exposed from the bottom surface of the hollow portion 51a of the case material 51, and the LED chip 12 is fixed via a chip fixing paste material 13 to an exposed region of the first lead 52A.

Of a first electrode 14A and a second electrode 14B formed on an upper surface of the LED chip 12, the first electrode 14A is electrically connected via a first wire 15A to the first lead 52A, and the second electrode 14B is electrically connected via a second wire 15B to the second lead 52B.

In the fifth embodiment, the LED chip 12 fixed onto the bottom surface of the hollow portion 51a of the case material 51, is sealed by filling the hollow portion 51a of the case material 51 with the sealing portion 16.

The sealing portion 16 comprises a sealing material 16d which is a composite material including a matrix material 16a and nano-particles 16b made of an inorganic material which are uniformly distributed in the matrix material 16a, and a fluorescent material 16c. The materials constituting the sealing portion 16 may be similar to those constituting the sealing portion 16 of the first embodiment.

Note that, here, portions outside the case material 51 of the first lead 52A and the second lead 52B are each in the shape of a so-called Gull Wing (GW) type terminal. Note that the outer shape of each of the leads 52A and 52B is not limited to the GW type, and may be molded in a J shape.

Thus, also in the semiconductor light-emitting device 50 of the fifth embodiment, the light resistance and heat resistance of the sealing portion 16 are improved, and the light extraction efficiency is also improved, as in the semiconductor light-emitting devices 10, 30 and 40 of the first, third and fourth embodiments.

Note that, instead of the sealing portions 16 of the third, fourth and fifth embodiments, the LED chip 12 may be directly covered with a sealing material 16d including nano-particles 16b made of an inorganic material, and the sealing material 16d may be covered with a matrix material 16a including a fluorescent material 16c, as with the first sealing portion 26A and the second sealing portion 26B of the second embodiment.

Also, in the first to fifth embodiments, a predetermined space may be provided partly between the composite material and the semiconductor chip.

Figure 9:
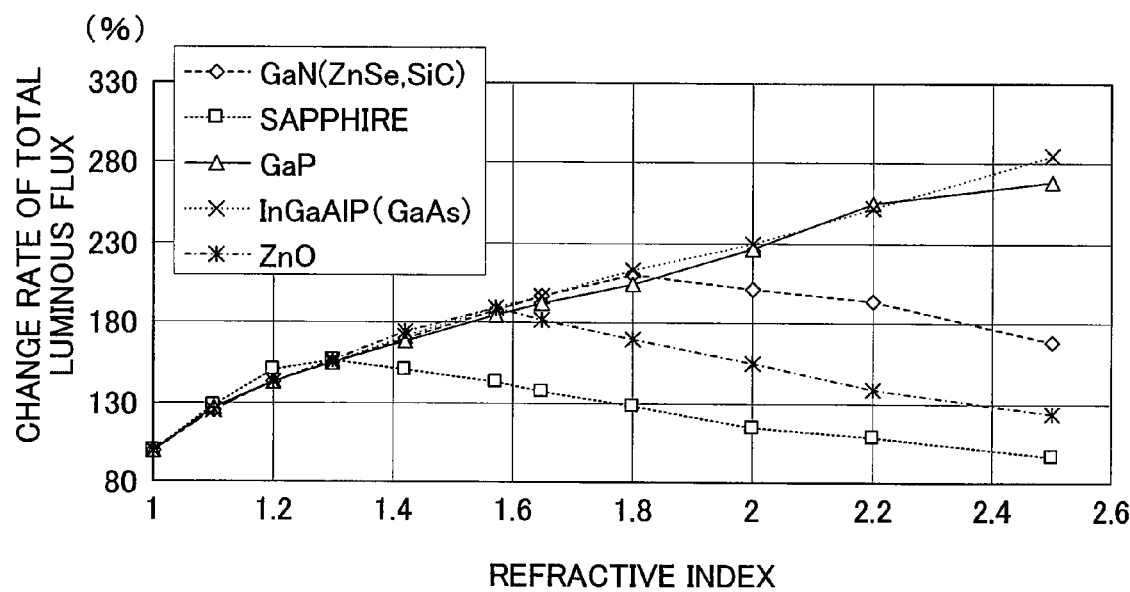
FIG. 9 (a) is a graph obtained by simulation, showing a relationship between the refractive index of the sealing portion and a change rate of total luminous flux of radiated light for each substrate material included in an LED chip in the semiconductor light-emitting device of the fifth embodiment of the present invention. (b) is a graph obtained by simulation, showing a relationship between the refractive index of the sealing portion and the total luminous flux for each substrate material included in an LED chip in the semiconductor light-emitting device of the fifth embodiment of the present invention.
Figure 9:
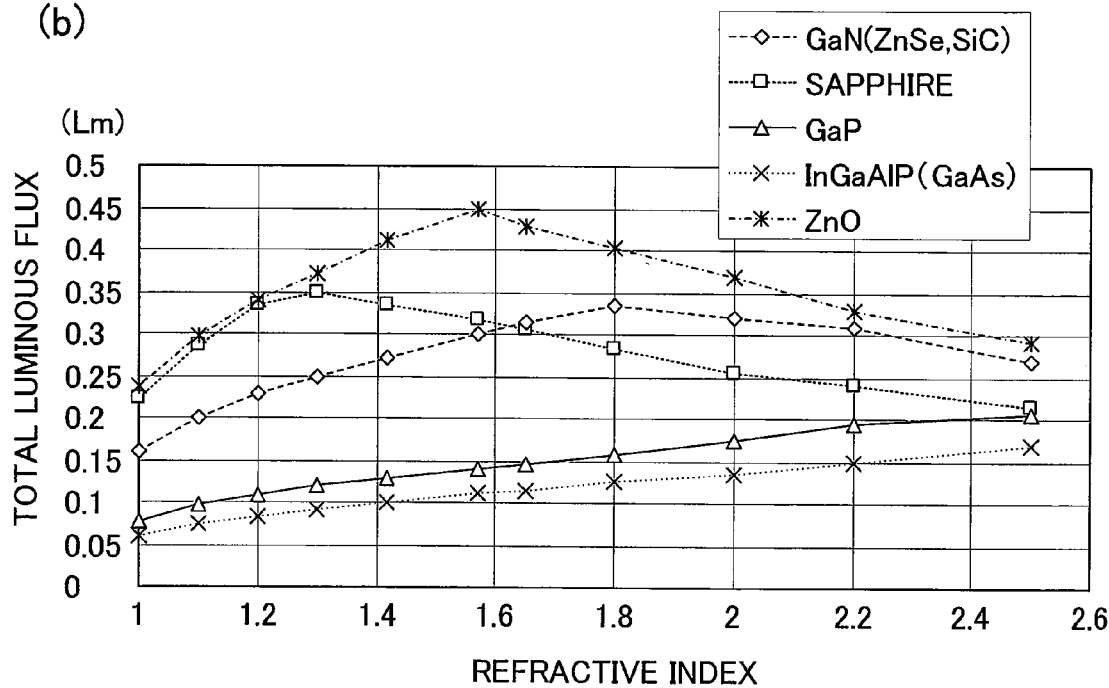

FIG. 9(a) shows a relationship between the refractive index of the sealing portion 16 and the change rate of the total luminous flux of radiated light, which was obtained by simulation of each material for the substrate included in the LED chip 12 of the semiconductor light-emitting device 50 of the fifth embodiment. FIG. 9(b) shows a relationship between the refractive index of the sealing portion 16 and total luminous flux, which was obtained by similar simulation. Here, the substrate materials which were used in the simulation are shown in [Table 1]. Also, the refractive index of each substrate material in [Table 1] is a representative value in the visual light region for the material.

TABLE 1

| Substrate materials | Refractive index |
|---|---|
| GaN | 2.5 |
| ZnSe | 2.5 |
| SiC | 2.6 |
| Sapphire | 1.7 |
| GaP | 3.3 |
| InGaAlP | 3.45 |
| GaAs | 3.66 |
| ZnO | 2.15 |

As can be seen from FIGS. 9(a) and 9(b), the refractive index of the sealing portion 16 is preferably 1.2 or more and 2.5 or less. Also, when zinc oxide (ZnO), gallium nitride (GaN), silicon carbide (SiC) or the like, which has a refractive index of more than 2.0, is used as the substrate material, the refractive index of the sealing portion 16 is preferably 1.4 or more and 2.2 or less, more preferably 1.6 or more and 2.0 or less.

Sixth Embodiment

Hereinafter, a semiconductor light-emitting device according to a sixth embodiment of the present invention will be described with reference to the drawings.

Figure 10:
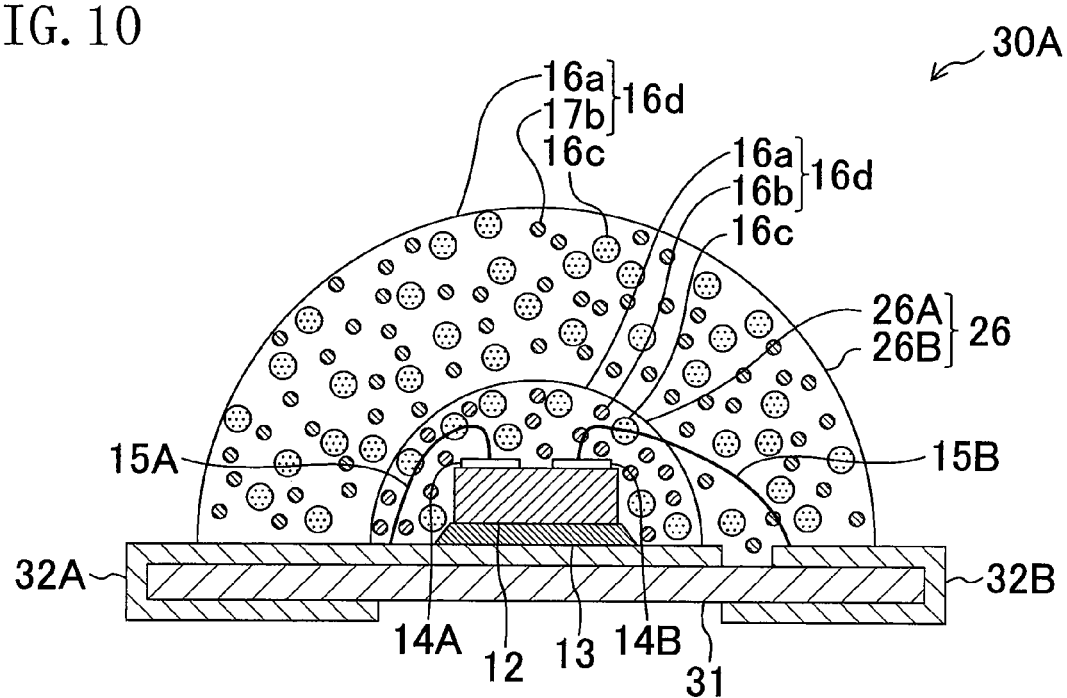
FIG. 10 A schematic cross-sectional view of a structure of a semiconductor light-emitting device according to a sixth embodiment of the present invention.

FIG. 10 is a schematic cross-sectional view of a structure of a white LED device which is the semiconductor light-emitting device of the sixth embodiment of the present invention. Also here, the same parts as those shown in FIGS. 1 and 6 are indicated by the same symbols and will not be described.

As shown in FIG. 10, in the semiconductor light-emitting device 30A of the sixth embodiment, an LED chip 12 is provided on a printed wiring board having a substrate 31 and at least a first wiring 32A and a second wiring 32B selectively formed on a front surface and a rear surface of the substrate 31, by so-called junction-up (face-up) mounting, where a rear surface of the LED chip 12 is opposed to a major surface of the substrate 31.

A sealing portion 26 comprises a first sealing portion 26A which is in the shape of a hemisphere and directly covers the semiconductor light-emitting device chip 12, and a second sealing portion 26B which is in the shape of a hemisphere and directly covers the first sealing portion 26A.

The first sealing portion 26A comprises a sealing material 16d which is a composite material including a matrix material 16a and first nano-particles 16b made of an inorganic material which are uniformly distributed in the matrix material 16a, and a fluorescent material 16c.

The second sealing portion 26B comprises a sealing material 16d which is a composite material including a matrix material 16a and second nano-particles 17b made of an inorganic material which are uniformly distributed in the matrix material 16a, and a fluorescent material 16c. Here, materials for the first sealing portion 26A and the second sealing portion 26B may be similar to those for the sealing portion 16 of the first embodiment. Note that, in the sixth embodiment, the material for the first nano-particle 16b is selected which has a larger refractive index than that of the second nano-particle 17b.

When the LED chip 12 as well as the crystal growth substrate (epitaxial substrate) are made of a gallium nitride (GaN)-based semiconductor, the difference in refractive index between the sealing portion and the air is large even if the refractive index of the sealing portion is set to be about 1.8, which allows the highest extraction efficiency, by adding nano-particles to GaN, whose refractive index is about 2.5 as shown in [Table 1].

Therefore, in the sixth embodiment, the value of the refractive index of the first sealing portion 26A near the LED chip 12 is set to be larger than the value of the refractive index of the second sealing portion 26B far from the LED chip 12. Specifically, as the second nano-particle 17b added to the second sealing portion 26B, an inorganic material is used which has a refractive index smaller than the refractive index of the first nano-particle 16b added to the first sealing portion 26A.

With this structure, the refractive index of the second sealing portion 26B which contacts the air is smaller than the refractive index of the first sealing portion 26A which contacts the LED chip 12, so that the difference in refractive index between the second sealing portion 26B and the air is reduced. Therefore, the total reflection of radiated light on an interface between the second sealing portion 26B and the air can be reduced, thereby making it possible to improve the light resistance and heat resistance of the sealing portion 26, and further improve the light extraction efficiency.

Also, in the sixth embodiment, the outer shapes of the first sealing portion 26A and the second sealing portion 26B are both shaped into a hemisphere by, for example, a potting method, so that the total reflection of radiated light is further reduced.

Although the fluorescent material 16c is here added to both the first sealing portion 26A and the second sealing portion 26B, the fluorescent material 16c may be added to only one of them.

First Variation of Sixth Embodiment

Figure 11:
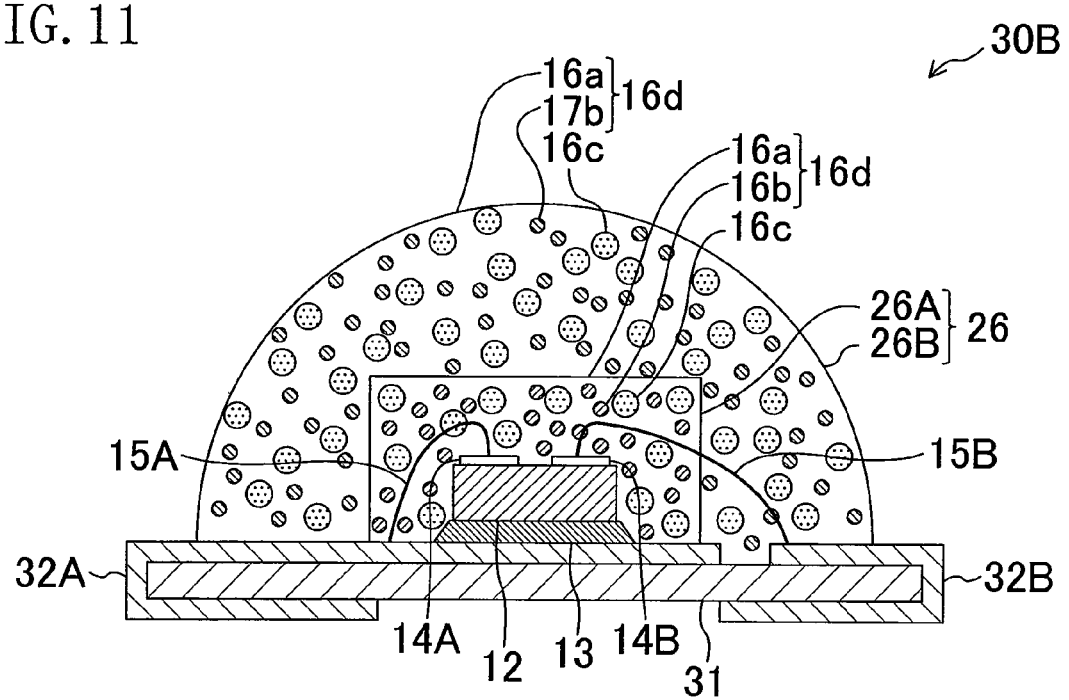
FIG. 11 A schematic cross-sectional view of a structure of a semiconductor light-emitting device according to a first variation of the sixth embodiment of the present invention.

FIG. 11 is a schematic cross-sectional view of a structure of a white LED device which is a semiconductor light-emitting device according to a first variation of the sixth embodiment of the present invention.

As shown in FIG. 11, in the semiconductor light-emitting device 30B of the first variation, a first sealing portion 26A which covers an LED chip 12 has a cross-section having a quadrangular outer shape.

Thereby, in the case of this first sealing portion 26A, a sealing material 16d can be formed by a printing method, resulting in an improvement in productivity.

Second Variation of Sixth Embodiment

Figure 12:
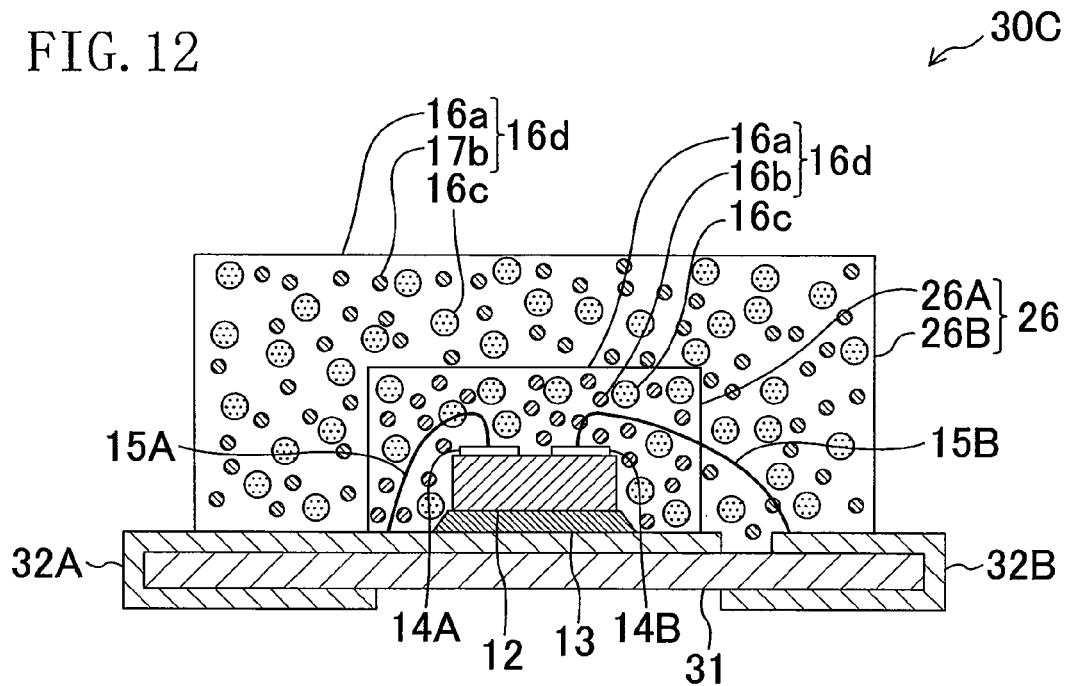
FIG. 12 A schematic cross-sectional view of a structure of a semiconductor light-emitting device according to a second variation of the sixth embodiment of the present invention.

FIG. 12 is a schematic cross-sectional view of a structure of a white LED device which is a semiconductor light-emitting device according to a second variation of the sixth embodiment of the present invention.

As shown in FIG. 12, in the semiconductor light-emitting device 30C of the second variation, a first sealing portion 26A which directly covers an LED chip 12 and a second sealing portion 26B which covers the first sealing portion both have a cross-section having a quadrangular outer shape.

Thereby, in the case of this first sealing portion 26A, a sealing material 16d can be formed by a printing method, and the second sealing portion 26B can be formed by a transfer-molding method, resulting in an improvement in productivity. In addition, the sealing portion 26 has a flat upper surface, thereby making it easy to handle the device.

Third Variation of Sixth Embodiment

Figure 13:
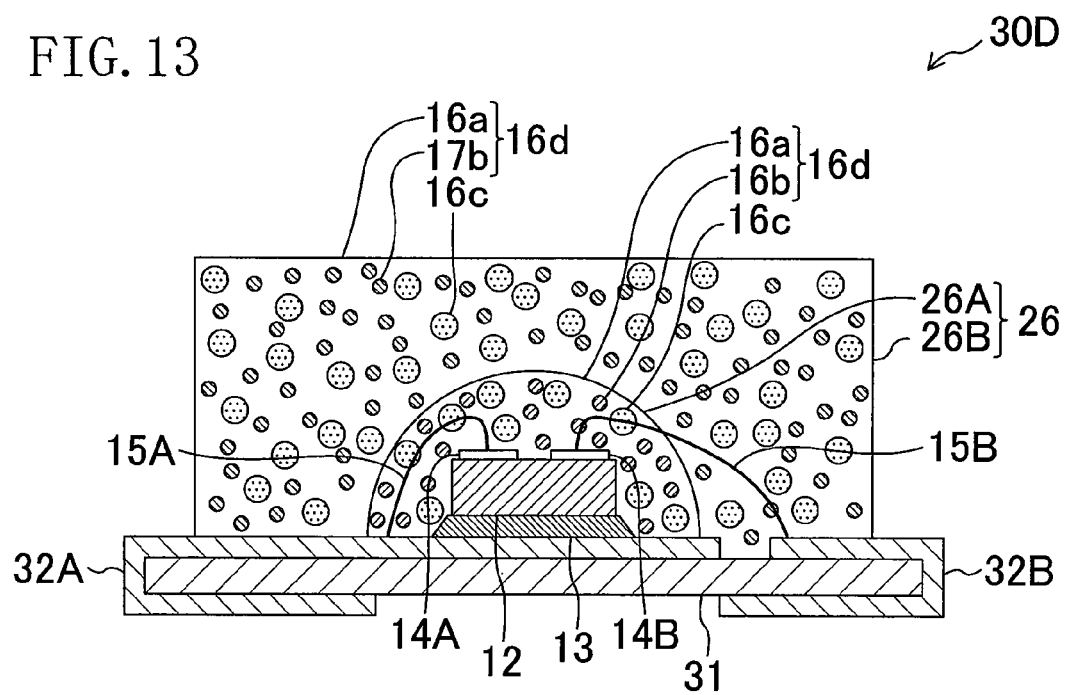
FIG. 13 A schematic cross-sectional view of a structure of a semiconductor light-emitting device according to a third variation of the sixth embodiment of the present invention.

FIG. 13 is a schematic cross-sectional view of a structure of a white LED device which is a semiconductor light-emitting device according to a third variation of the sixth embodiment of the present invention.

As shown in FIG. 13, in the semiconductor light-emitting device 30D of the third variation, a first sealing portion 26A which directly covers the LED chip 12 has a hemispherical outer shape, and a second sealing portion 26B which covers the first sealing portion 26A has a cross-section having a quadrangular outer shape.

Thereby, the total reflection is reduced by the first sealing portion 26A having a hemispherical outer shape, and handling of the device is facilitated by the second sealing portion 26B having a flat upper surface.

Fourth Variation of Sixth Embodiment

Figure 14:
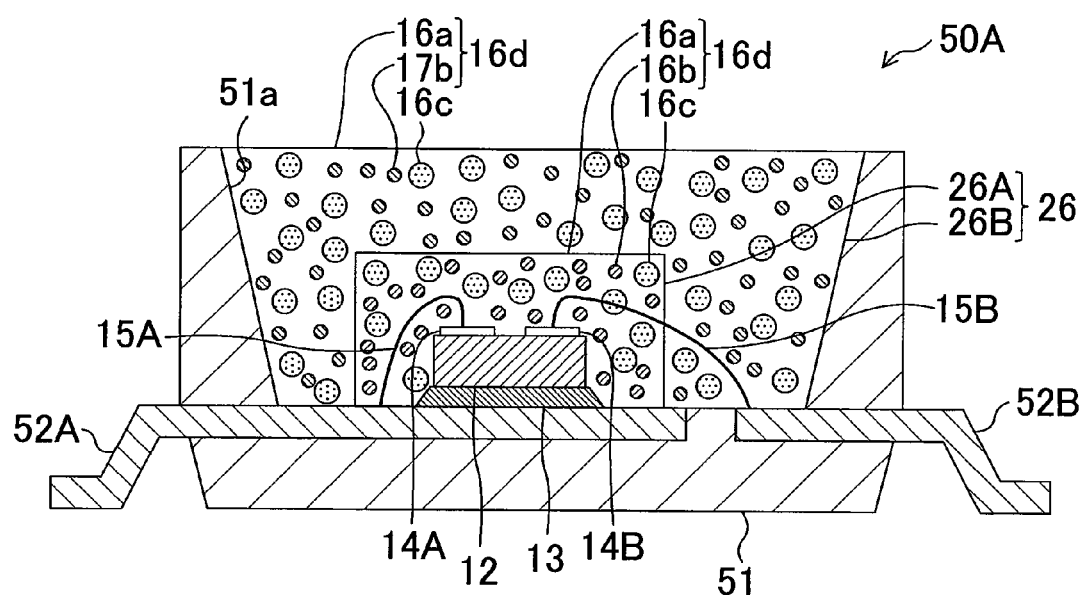
FIG. 14 A schematic cross-sectional view of a structure of a semiconductor light-emitting device according to a fourth variation of the sixth embodiment of the present invention.

FIG. 14 is a schematic cross-sectional view of a structure of a white LED device which is a semiconductor light-emitting device according to a fourth variation of the sixth embodiment of the present invention.

As shown in FIG. 14, in the semiconductor light-emitting device 50A of the fourth variation, an LED chip 12 is fixed onto a bottom surface of a hollow portion 51a in a case material 51 having the hollow portion 51a by a face-up method, as in the fifth embodiment.

Here, a first sealing portion 26A which directly covers the LED chip 12 and a second sealing portion 26B which covers the first sealing portion 26A both have a quadrangular cross-section.

In this variation, when a white heat-resistant resin material is used as the case material 51, an inner wall of the case material 51 is further subjected to metallizing (deposition or the like of a metal, such as aluminum (Al) or the like), so that the inner wall surface of the case material 51 functions as a reflection surface. In addition, the inner wall surface of the case material 51 has a reverse taper shape which gradually becomes wider from a lower portion thereof to an upper portion thereof. Therefore, the light extraction efficiency of the sealing portion 26 is improved not only by the structure in which the refractive index difference between the first nano-particle 16b and the second nano-particle 17b is provided, but also by the case material 51 and its shape.

Note that, when the first sealing portion 26A is formed by a printing method and cannot be directly printed onto the bottom surface of the hollow portion 51a of the case material 51, the LED chip 12 may be previously mounted on a sub-mount material, the first sealing portion 26A may be formed by the printing method, and thereafter, the sub-mount material may be mounted on the bottom surface of the case material 51, for example.

Figure 15:
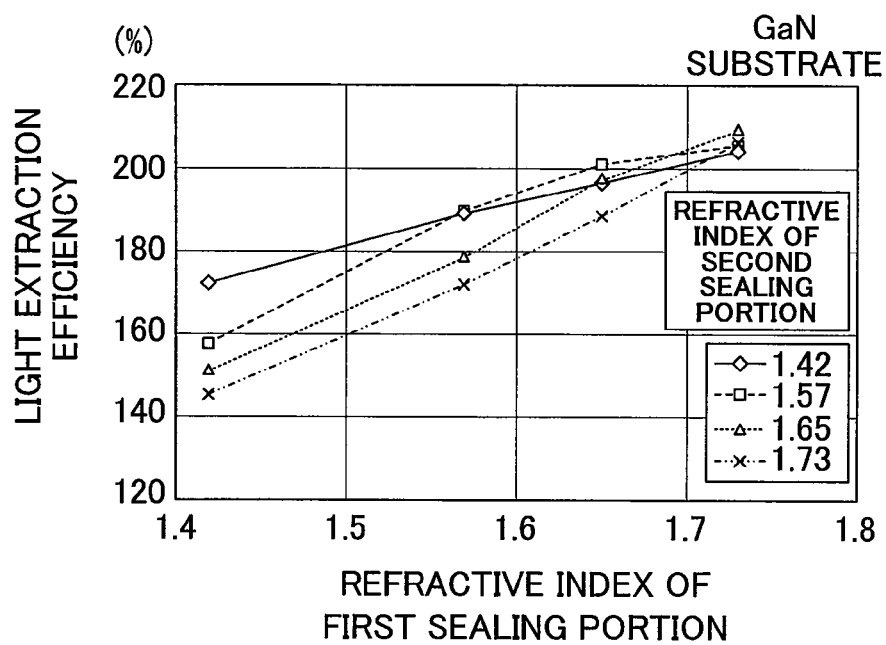
FIGS. 15 (a) and (b) are graphs showing obtained by simulation, showing a relationship between refractive indices of a first sealing portion and a second sealing portion and light extraction efficiency in the semiconductor light-emitting device of the fourth variation of the sixth embodiment of the present invention.
Figure 15:
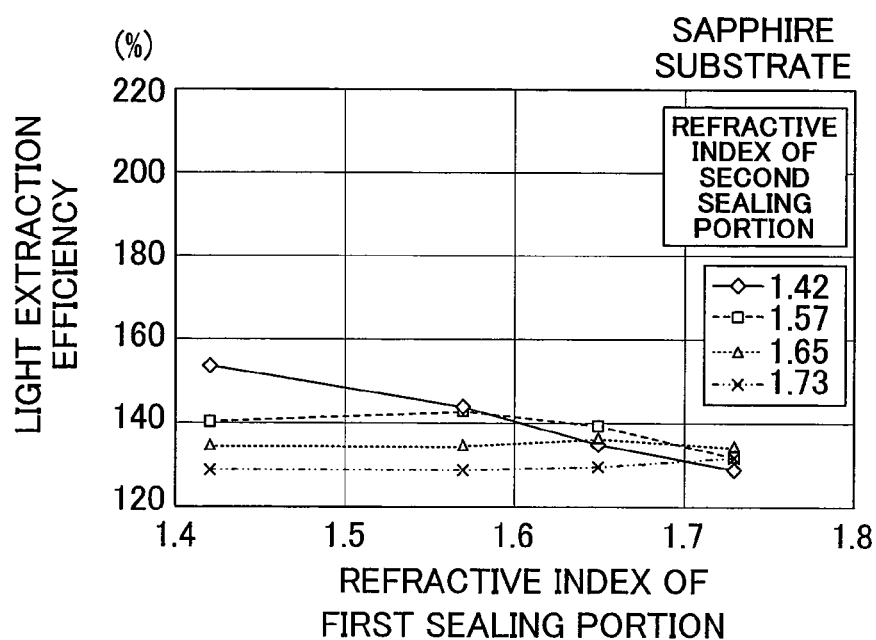

FIGS. 15(a) and 15(b) show the results of simulation of a relationship between the refractive index of each of the first sealing portion 26A and the second sealing portion 26B and the light extraction efficiency in the semiconductor light-emitting device 50A of the fourth variation of the sixth embodiment. Here, FIG. 15(a) shows a case where GaN is used as a substrate material for the LED chip 12, and FIG. 15(b) shows a case where sapphire is used as the substrate material. Here, it is assumed that the first sealing portion 26A has a thickness of 500 µm, and the second sealing portion 26B has a thickness of 200 µm.

As can be seen from FIGS. 15(a) and 15(b), when the substrate of the LED chip 12 is made of GaN, the larger the refractive index of the first sealing portion 26A, the higher the light extraction efficiency. When the substrate of the LED chip 12 is made of sapphire, the influence of a change in the refractive index of the first sealing portion 26A is small.

Also, no matter whether the substrate is made of GaN or sapphire, the smaller the refractive index of the second sealing portion 26B, the higher the light extraction efficiency, but the smaller the change rate of the light extraction efficiency with respect to the refractive index of the first sealing portion 26A.

Fifth Variation of Sixth Embodiment

Figure 16:
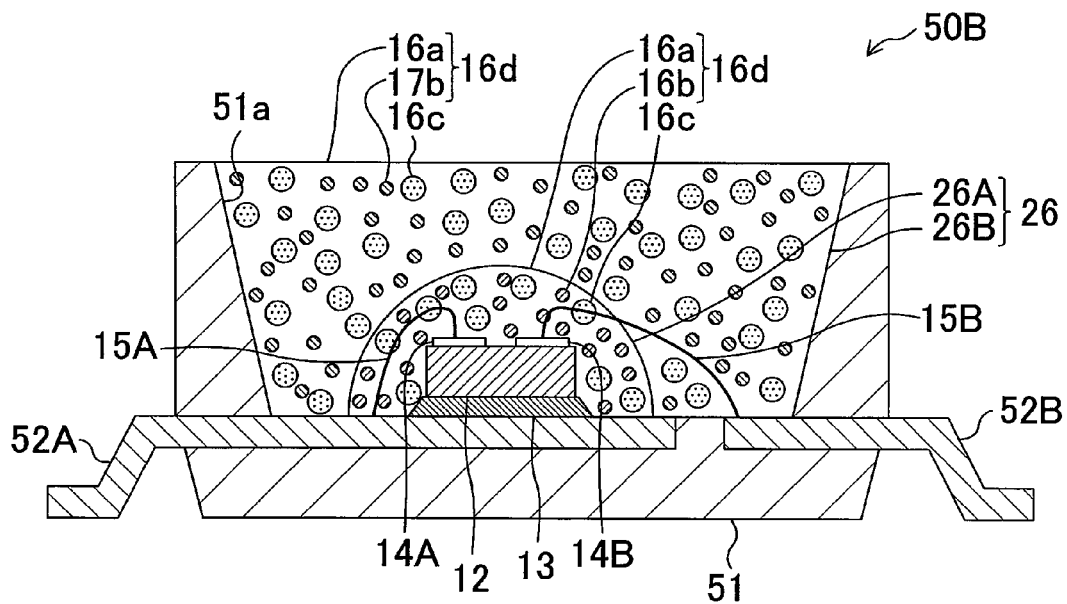
FIG. 16 A schematic cross-sectional view of a structure of a semiconductor light-emitting device according to a fifth variation of the sixth embodiment of the present invention.

FIG. 16 is a schematic cross-sectional view of a structure of a white LED device which is a semiconductor light-emitting device according to a fifth variation of the sixth embodiment of the present invention.

As shown in FIG. 16, in the semiconductor light-emitting device 50B of the fifth variation, an LED chip 12 is fixed onto a bottom surface of a hollow portion 51a in a case material 51 having the hollow portion 51a.

Here, a first sealing portion 26A which directly covers the LED chip 12 has a hemispherical outer shape, and a second sealing portion 26B which covers the first sealing portion 26A has a cross-section having a quadrangular outer shape.

Thereby, the reflection is reduced by the first sealing portion 26A having a hemispherical outer shape, and the light extraction efficiency is improved by the case material 51.

Sixth Variation of Sixth Embodiment

Figure 17:
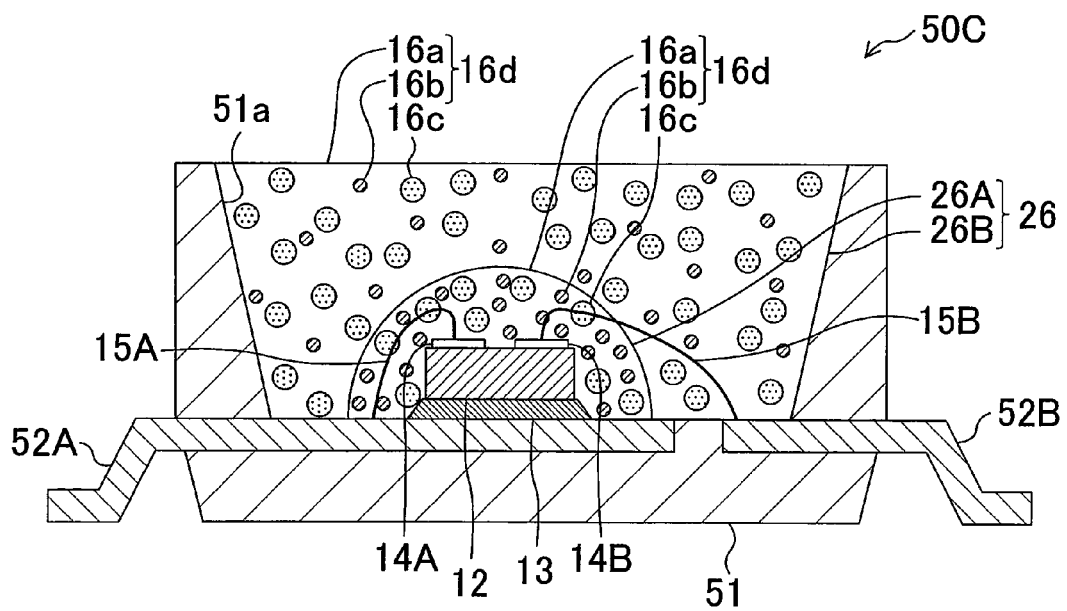
FIG. 17 A schematic cross-sectional view of a structure of a semiconductor light-emitting device according to a sixth variation of the sixth embodiment of the present invention.

FIG. 17 is a schematic cross-sectional view of a structure of a white LED device which is a semiconductor light-emitting device according to a sixth variation of the sixth embodiment of the present invention.

As shown in FIG. 17, in the semiconductor light-emitting device 50C of the sixth variation, nano-particles 16b added to a sealing material 16d for a second sealing portion 26B and nano-particles 16b added to a sealing material 16d for a first sealing portion 26A are caused to have the same composition, and in addition, the proportion of the nano-particles 16b in the sealing material 16d of the first sealing portion 26A is caused to be higher than the proportion of the nano-particles 16b in the sealing material 16d of the second sealing portion 26B. In other words, the added concentration of the nano-particles 16b in the second sealing portion 26B is caused to be smaller than the added concentration of the nano-particles 16b in the first sealing portion 26A. Here, the difference in added concentration may be provided by a concentration gradient or stepwise changes.

Also in this case, the refractive index of the second sealing portion 26B is smaller than the refractive index of the first sealing portion 26A.

Note that, in this variation, the nano-particles 16b added to the first sealing portion 26A and the nano-particles 16b added to the second sealing portion 26B are made of inorganic materials having the same composition and have different added concentrations. Instead of this, the nano-particles 16b added to the first sealing portion 26A and the nano-particles 16b added to the second sealing portion 26B may have different compositions and different added concentrations as long as the refractive index of the second sealing portion 26B is smaller than the refractive index of the first sealing portion 26A.

Although it has been assumed in FIG. 17 that the first sealing portion 26A which directly covers the LED chip 12 has a hemispherical outer shape, the first sealing portion 26A may have a cross-section having a quadrangular outer shape as in FIG. 14 described in the fourth variation of the sixth embodiment.

Also in the sixth embodiment and the first to third variations of the sixth embodiment, as in this variation, the nano-particle 17b added to the sealing material 16d of the second sealing portion 26B may be replaced with the nano-particle 16b and may be caused to have the same composition as that of the nano-particle 16b added to the sealing material 16d of the first sealing portion 26A, and the proportion of the nano-particles 16b in the sealing material 16d of the first sealing portion 26A may be caused to be higher than the proportion of the nano-particles 16b in the sealing material 16d of the second sealing portion 26B.

Seventh Variation of Sixth Embodiment

In the sixth embodiment and its variations, the fluorescent material 16c is added to both the first sealing portion 26A and the second sealing portion 26B. Alternatively, the fluorescent material 16c may be added to only one of the first sealing portion 26A and the second sealing portion 26B.

Figure 18:
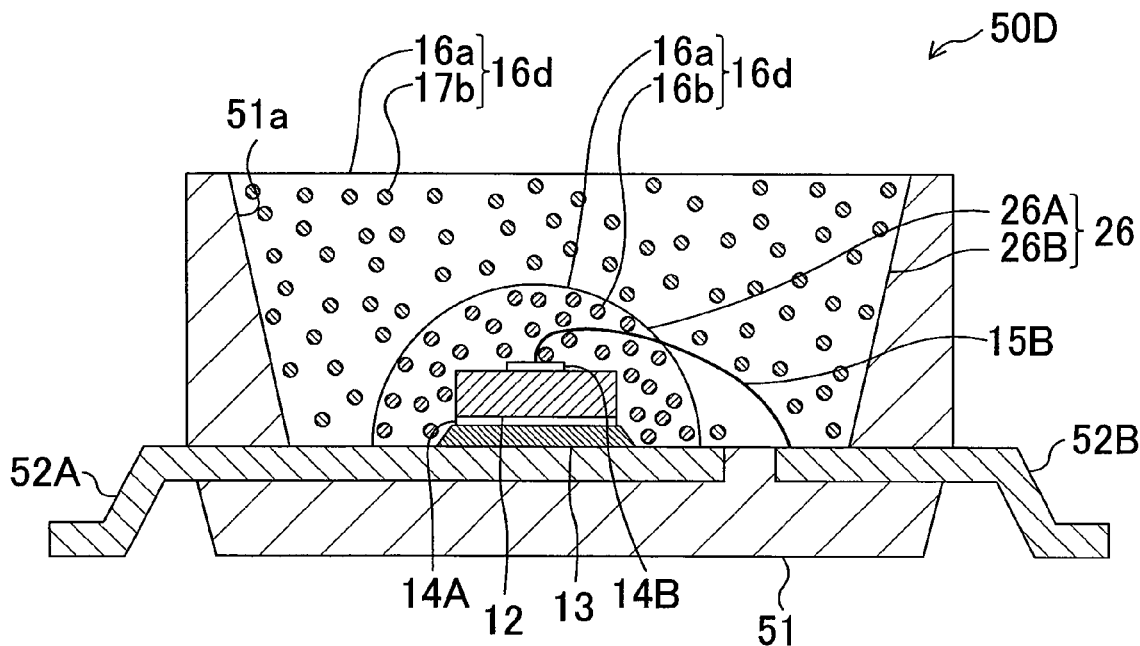
FIG. 18 A schematic cross-sectional view of a structure of a semiconductor light-emitting device according to a seventh variation of the sixth embodiment of the present invention.

In a semiconductor light-emitting device 50D according to a seventh variation shown in FIG. 18, a gallium phosphide (GaP)-based semiconductor, which can emit green light, is used for an LED chip 12. In this case, the fluorescent material 16c does not need to be added to the sealing portion 26.

When a GaP-based semiconductor is used for the LED chip 12, a first electrode 14A and a second electrode 14B are formed on a lower surface and an upper surface of the LED chip 12, respectively, and are opposed to each other. The first electrode 14A is electrically connected via a chip fixing paste material 13 having conductivity, such as a Ag paste material or the like, to a first lead 52A, and the second electrode 14B is electrically connected via a wire 15B to a second lead 52B.

Although the sealing portion 26 has a double-layer structure including the first sealing portion 26A and the second sealing portion 26B in the sixth embodiment and its variations, the present invention is not limited to the double-layer structure and may have a multilayer structure having three or more layers. Note that, in the case of the multilayer structure having three or more layers, the refractive indices of the sealing portions need to be successively reduced with distance from the LED chip 12.

Seventh Embodiment

Hereinafter, a semiconductor light-emitting device according to a seventh embodiment of the present invention will be described with reference to the drawings.

Figure 19:
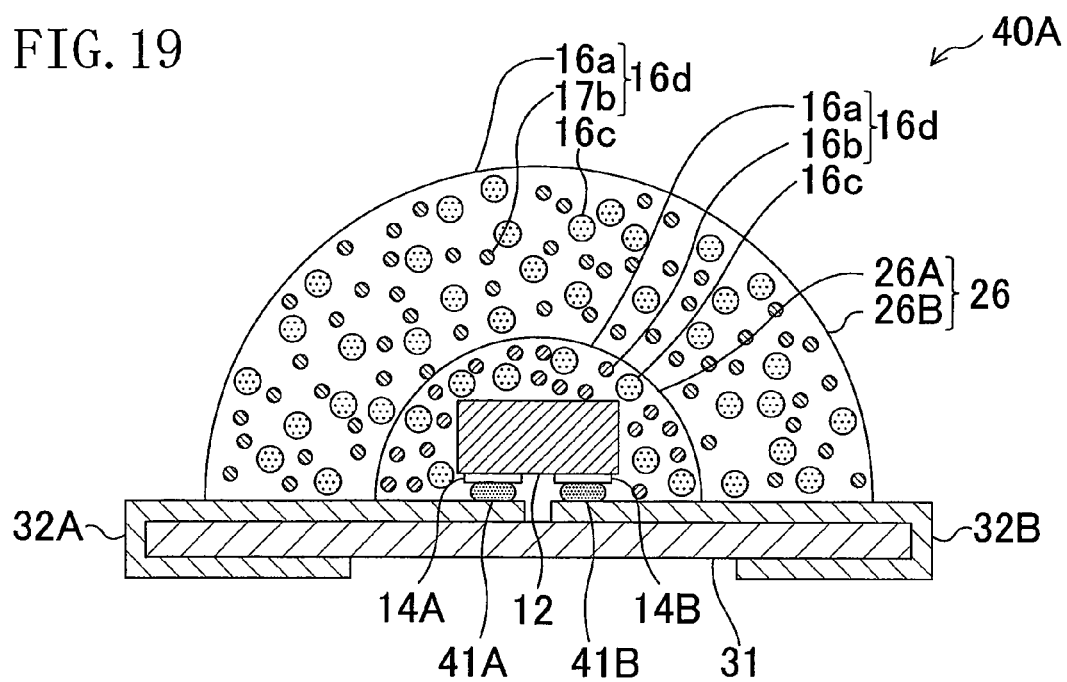
FIG. 19 A schematic cross-sectional view of a structure of a semiconductor light-emitting device according to a seventh embodiment of the present invention.

FIG. 19 is a schematic cross-sectional view of a structure of a white LED device which is the semiconductor light-emitting device of the seventh embodiment of the present invention. Also here, the same parts as those shown in FIGS. 1 and 7 are indicated by the same symbols and will not be described.

As shown in FIG. 19, in the semiconductor light-emitting device 40A of the seventh embodiment, an LED chip 12 is provided on a printed wiring board having a substrate 31 and at least a first wiring 32A and a second wiring 32B selectively formed on a front surface and a rear surface of the substrate 31 by flip-chip mounting, where an upper surface of the LED chip 12 is opposed to a major surface of the substrate 31.

A sealing portion 26 comprises a first sealing portion 26A which is in the shape of a hemisphere and directly covers the semiconductor light-emitting device chip 12, and a second sealing portion 26B which is in the shape of a hemisphere and directly covers the first sealing portion 26A.

The first sealing portion 26A comprises a sealing material 16d which is a composite material including a matrix material 16a and first nano-particles 16b made of an inorganic material which are uniformly distributed in the matrix material 16a, and a fluorescent material 16c.

The second sealing portion 26B comprises a sealing material 16d which is a composite material including a matrix material 16a and second nano-particles 17b made of an inorganic material which are uniformly distributed in the matrix material 16a, and a fluorescent material 16c. Here, the materials constituting the first sealing portion 26A and the second sealing portion 26B may be similar to the materials constituting the sealing portion 16 of the first embodiment. Note that a material for the first nano-particle 16b needs to be selected which has a larger refractive index than that of the second nano-particle 17b.

Thereby, also in the seventh embodiment, as in the sixth embodiment, the value of the refractive index of the first sealing portion 26A near the LED chip 12 is caused to be larger than the value of the refractive index of the second sealing portion 26B far from the LED chip 12.

Specifically, with this structure, the refractive index of the second sealing portion 26B which contacts the air is smaller than the refractive index of the first sealing portion 26A which contacts the LED chip 12, so that the difference in refractive index between the second sealing portion 26B and the air is reduced. Therefore, the total reflection of radiated light on an interface between the second sealing portion 26B and the air can be reduced, thereby making it possible to improve the light resistance and heat resistance of the sealing portion 26, and further improve the light extraction efficiency.

Also, in this embodiment, the outer shapes of the first sealing portion 26A and the second sealing portion 26B are both shaped into a hemisphere by, for example, a potting method, so that the total reflection of radiated light is further reduced. Although the fluorescent material 16c is added to both the first sealing portion 26A and the second sealing portion 26B in the seventh embodiment, the fluorescent material 16c may be added to only one of them.

First Variation of Seventh Embodiment

Figure 20:
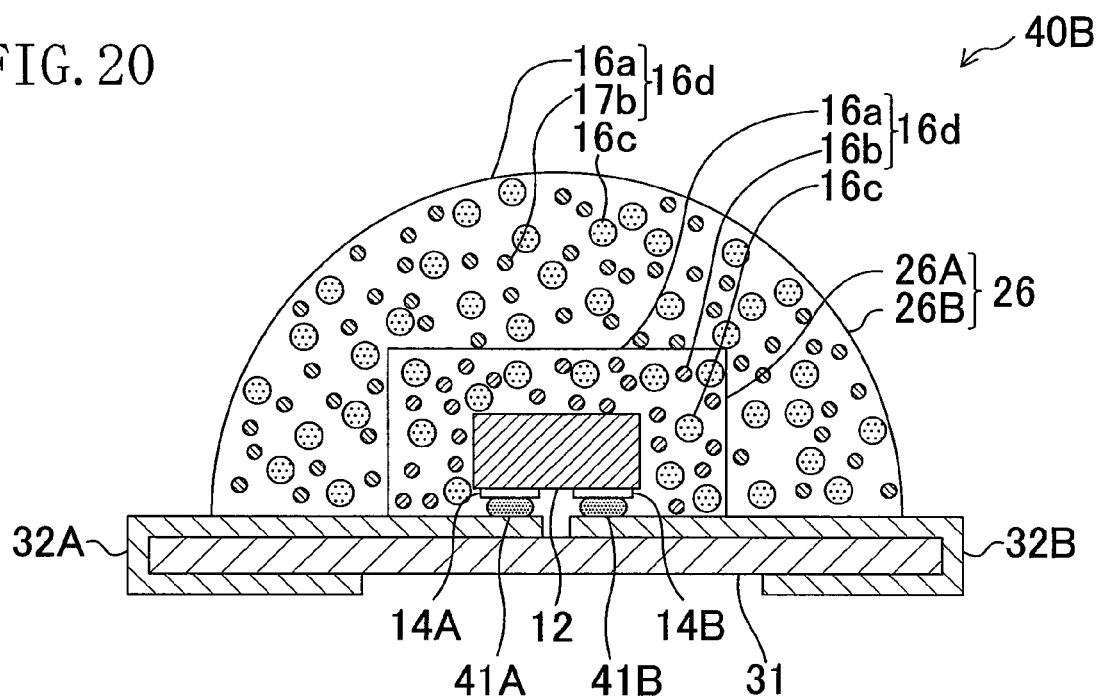
FIG. 20 A schematic cross-sectional view of a structure of a semiconductor light-emitting device according to a first variation of the seventh embodiment of the present invention.

FIG. 20 is a schematic cross-sectional view of a structure of a white LED device which is a semiconductor light-emitting device according to a first variation of the seventh embodiment of the present invention.

As shown in FIG. 20, in the semiconductor light-emitting device 40B of the first variation, a first sealing portion 26A which directly covers an LED chip 12 has a cross-section having a quadrangular outer shape.

Thereby, in the case of this first sealing portion 26A, the sealing material 16d can be formed by a printing method, resulting in an improvement in productivity.

Second Variation of Seventh Embodiment

Figure 21:
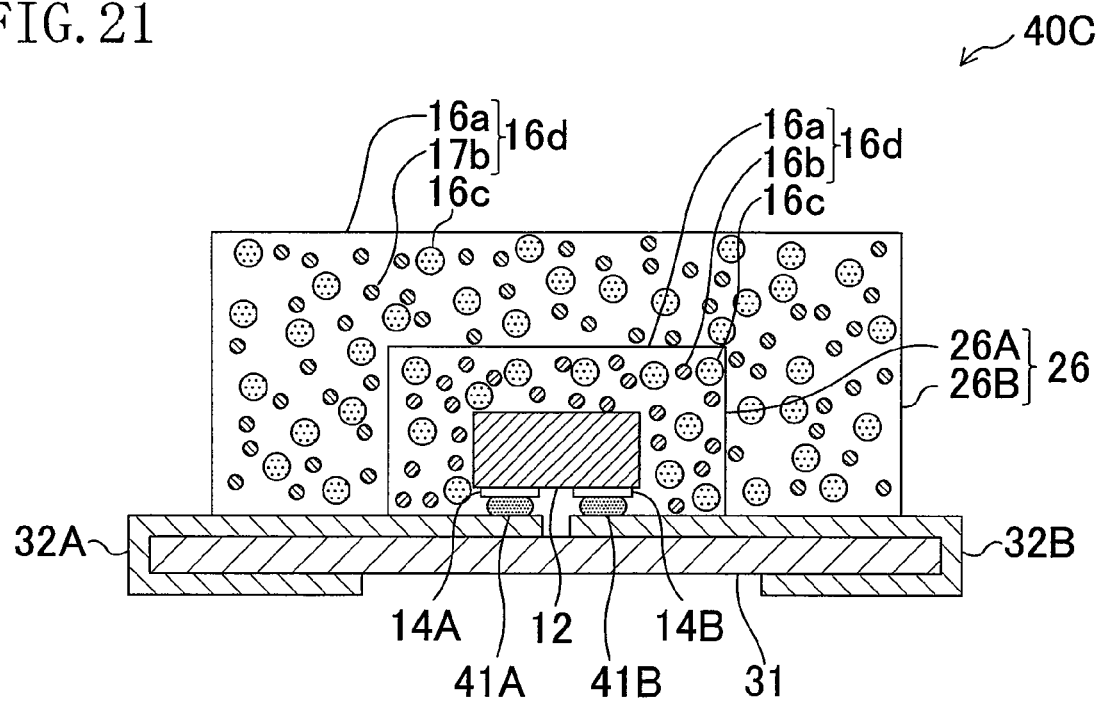
FIG. 21 A schematic cross-sectional view of a structure of a semiconductor light-emitting device according to a second variation of the seventh embodiment of the present invention.

FIG. 21 is a schematic cross-sectional view of a structure of a white LED device which is a semiconductor light-emitting device according to a second variation of the seventh embodiment of the present invention.

As shown in FIG. 21, in the semiconductor light-emitting device 40C of the second variation, a first sealing portion 26A which directly covers an LED chip 12 and a second sealing portion 26B which covers the first sealing portion both have a cross-section having a quadrangular outer shape.

Thereby, in the case of this first sealing portion 26A, the sealing material 16d can be formed by a printing method, and the second sealing portion 26B can be formed by a transfer-molding method, resulting in an improvement in productivity. In addition, the sealing portion 26 has a flat upper surface, thereby making it easy to handle the device.

Third Variation of Seventh Embodiment

Figure 22:
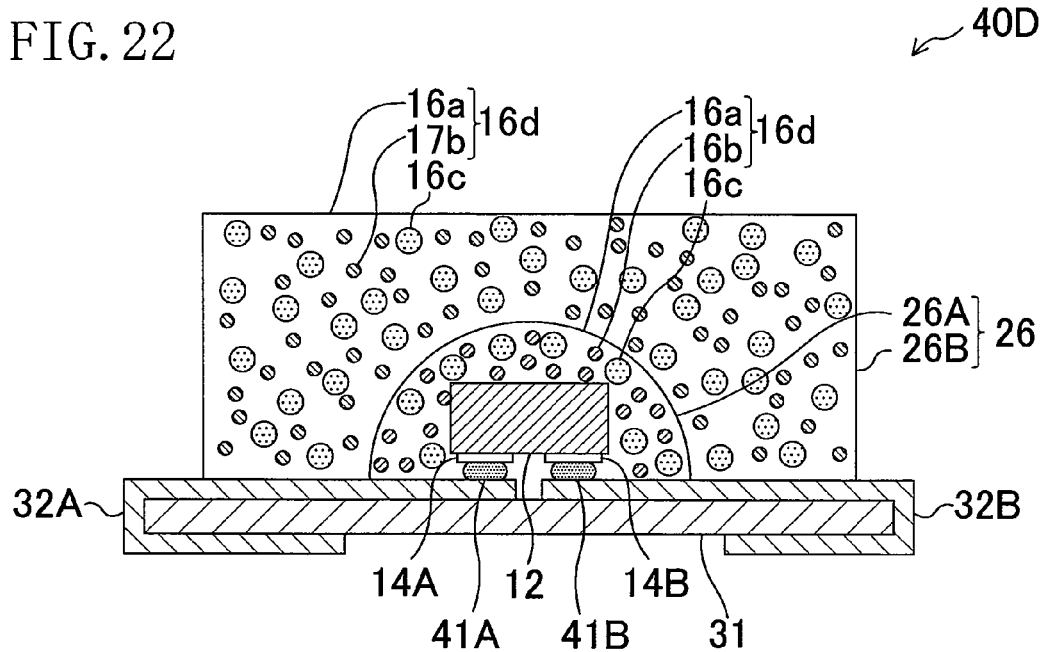
FIG. 22 A schematic cross-sectional view of a structure of a semiconductor light-emitting device according to a third variation of the seventh embodiment of the present invention.

FIG. 22 is a schematic cross-sectional view of a structure of a white LED device which is a semiconductor light-emitting device according to a third variation of the seventh embodiment of the present invention.

As shown in FIG. 22, in the semiconductor light-emitting device 40D of the third variation, a first sealing portion 26A which directly covers the LED chip 12 has a hemispherical outer shape, and a second sealing portion 26B which covers the first sealing portion 26A has a cross-section having a quadrangular outer shape.

Thereby, the total reflection is reduced by the first sealing portion 26A having a hemispherical outer shape, and handling of the device is facilitated by the second sealing portion 26B having a flat upper surface.

Fourth Variation of Seventh Embodiment

Figure 23:
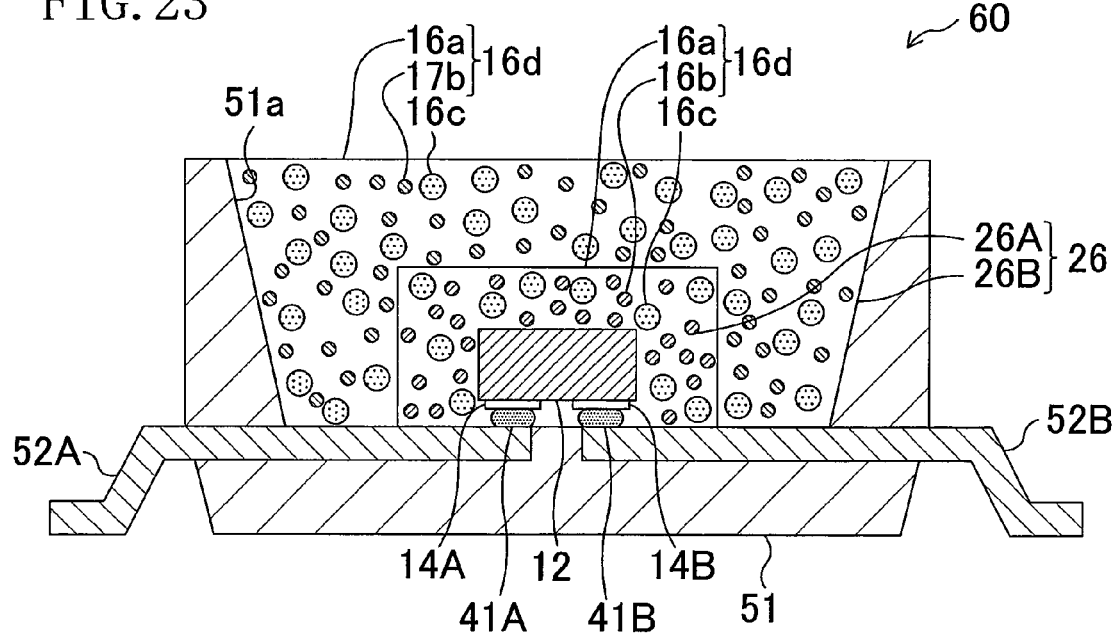
FIG. 23 A schematic cross-sectional view of a structure of a semiconductor light-emitting device according to a fourth variation of the seventh embodiment of the present invention.

FIG. 23 is a schematic cross-sectional view of a structure of a white LED device which is a semiconductor light-emitting device according to a fourth variation of the seventh embodiment of the present invention.

As shown in FIG. 23, in the semiconductor light-emitting device 60 of the fourth variation, an LED chip 12 is fixed onto a bottom surface of a hollow portion 51a in a case material 51 having the hollow portion 51a by flip-chip mounting.

Here, a first sealing portion 26A which directly covers the LED chip 12 and a second sealing portion 26B which covers the first sealing portion 26A both have a quadrangular cross-section.

In this variation, when a white heat-resistant resin material is used as the case material 51, an inner wall surface of the case material 51 functions as a reflection surface. In addition, the inner wall surface of the case material 51 has a reverse taper shape which gradually becomes wider from a lower portion thereof to an upper portion thereof. Therefore, the light extraction efficiency of the sealing portion 26 is improved not only by the structure in which a difference in refractive index between a first nano-particle 16b and a second nano-particle 17b is provided, but also by the case material 51 and its shape.

Fifth Variation of Seventh Embodiment

Figure 24:
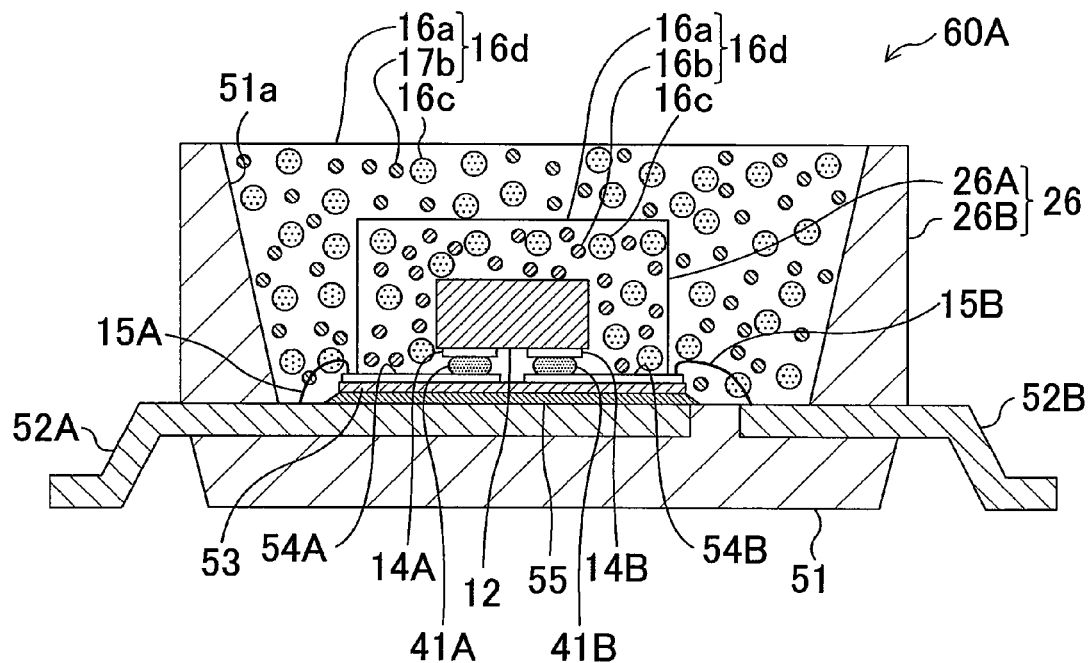
FIG. 24 A schematic cross-sectional view of a structure of a semiconductor light-emitting device according to a fifth variation of the seventh embodiment of the present invention.

FIG. 24 is a schematic cross-sectional view of a structure of a white LED device which is a semiconductor light-emitting device according to a fifth variation of the seventh embodiment of the present invention.

As shown in FIG. 24, in the semiconductor light-emitting device 60A of the fifth variation, an LED chip 12 is provided via a sub-mount material 53 on a bottom surface of a hollow portion 51a in a case material 51 having the hollow portion 51a by flip-chip mounting.

The LED chip 12 is flip-chip mounted on the sub-mount material 53 made of, for example, a ceramic, on an upper surface of which a first sub-mount electrode 54A and a second sub-mount electrode 54B are formed.

Specifically, a first sealing portion 26A is formed by a printing method, covering the LED chip 12. The sub-mount material 53 having the LED chip 12 sealed by the first sealing portion 26A, is mounted on a bottom surface of a case material 51. Of the first sub-mount electrode 54A and the second sub-mount electrode 54B formed on the upper surface of the sub-mount material 53, the first sub-mount electrode 54A is electrically connected via a first wire 15A to a first lead 52A, and the second sub-mount electrode 54B is electrically connected via a second wire 15B to a second lead 52B.

Note that a zener diode may be used as the sub-mount material 53.

Also, although the first sealing portion 26A of FIG. 24 has a cross-section having a quadrangular outer shape, the outer shape of the first sealing portion 26A may have a hemispherical outer shape.

Sixth Variation of Seventh Embodiment

Figure 25:
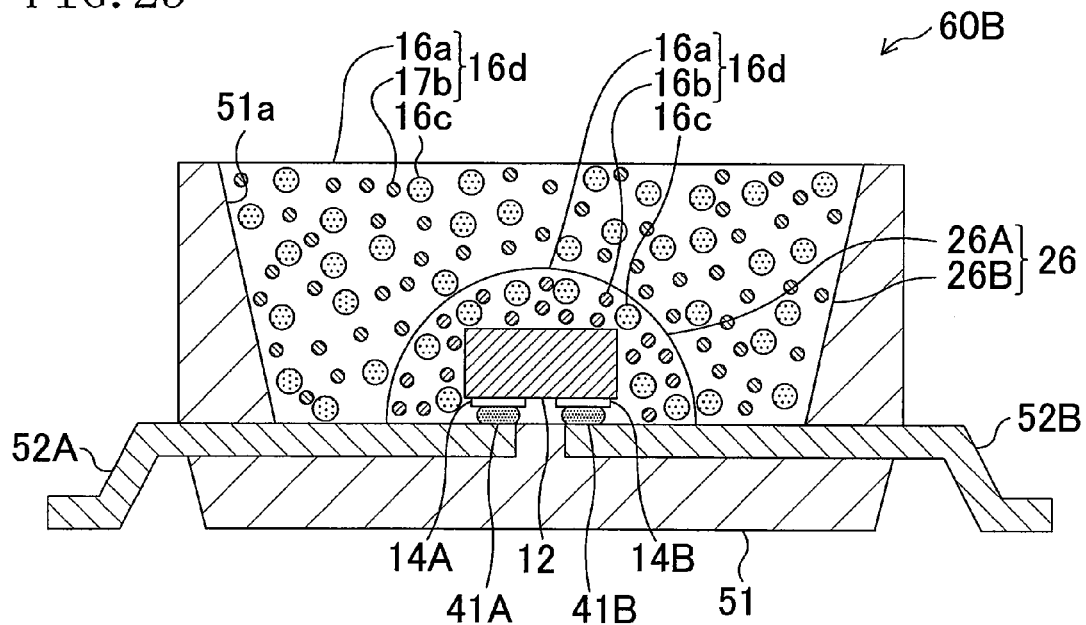
FIG. 25 A schematic cross-sectional view of a structure of a semiconductor light-emitting device according to a sixth variation of the seventh embodiment of the present invention.

FIG. 25 is a schematic cross-sectional view of a structure of a white LED device which is a semiconductor light-emitting device according to a sixth variation of the seventh embodiment of the present invention.

As shown in FIG. 25, in the semiconductor light-emitting device 60B of the sixth variation, an LED chip 12 is fixed onto a bottom surface of a hollow portion 51a in a case material 51 having the hollow portion 51a.

Here, a first sealing portion 26A which directly covers the LED chip 12 has a hemispherical outer shape, and a second sealing portion 26B which covers the first sealing portion 26A has a cross-section having a quadrangular outer shape.

Thereby, the total reflection is reduced by the first sealing portion 26A having a hemispherical outer shape, and the light extraction efficiency is improved by the case material 51.

Seventh Variation of Seventh Embodiment

Figure 26:
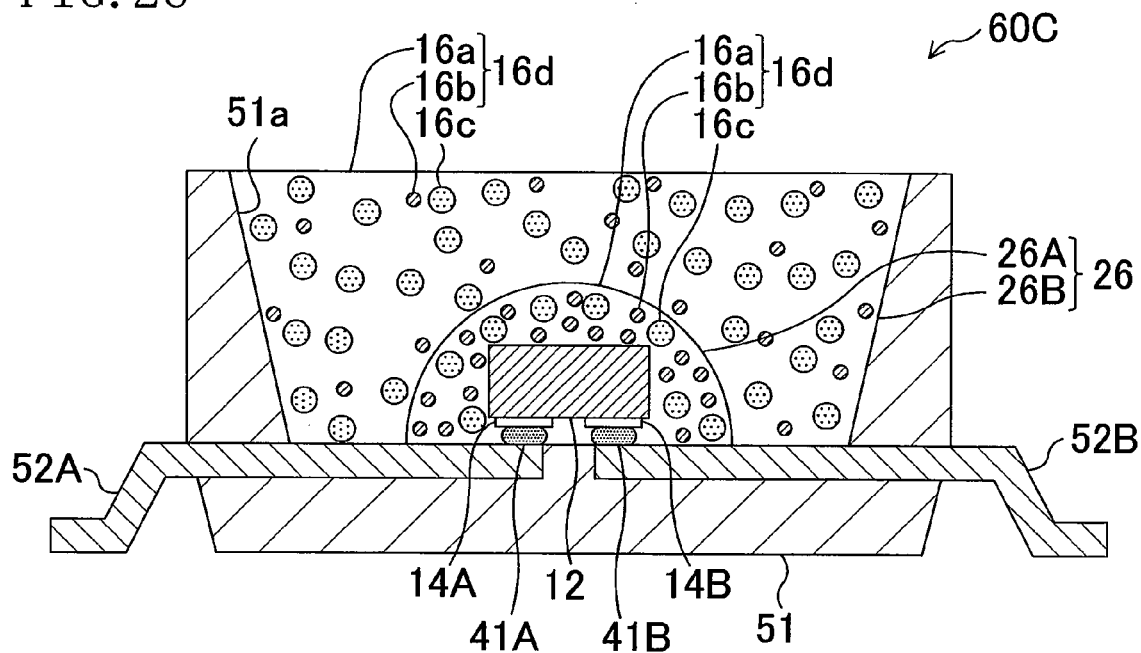
FIG. 26 A schematic cross-sectional view of a structure of a semiconductor light-emitting device according to a seventh variation of the seventh embodiment of the present invention.

FIG. 26 is a schematic cross-sectional view of a structure of a white LED device which is a semiconductor light-emitting device according to a seventh variation of the seventh embodiment of the present invention.

As shown in FIG. 26, in the semiconductor light-emitting device 60C of the seventh variation, nano-particles 16b added to a sealing material 16d of a second sealing portion 26B and nano-particles 16b added to a sealing material 16d of a first sealing portion 26A are caused to have the same composition, and in addition, the proportion of the nano-particles 16b in the sealing material 16d of the first sealing portion 26A is caused to be higher than the proportion of the nano-particles 16b in the sealing material 16d of the second sealing portion 26B. In other words, the added concentration of the nano-particles 16b in the second sealing portion 26B is caused to be smaller than the added concentration of the nano-particles 16b in the first sealing portion 26A. Here, the difference in added concentration may be provided by a concentration gradient or stepwise changes.

Also in this case, the refractive index of the second sealing portion 26B is smaller than the refractive index of the first sealing portion 26A.

Note that, in this variation, the nano-particles 16b added to the first sealing portion 26A and the nano-particles 16b added to the second sealing portion 26B are made of inorganic materials having the same composition and have different added concentrations. Instead of this, the nano-particles 16b added to the first sealing portion 26A and the nano-particles 16b added to the second sealing portion 26B may have different compositions and different added concentrations as long as the refractive index of the second sealing portion 26B is smaller than the refractive index of the first sealing portion 26A.

Although it has been assumed in FIG. 26 that the first sealing portion 26A which directly covers the LED chip 12 has a hemispherical outer shape, the first sealing portion 26A may have a cross-section having a quadrangular outer shape as in FIG. 23 described in the fourth variation of the seventh embodiment.

Also in the seventh embodiment and the first to third and fifth variations of the seventh embodiment, as in this variation, the nano-particle 17b added to the sealing material 16d of the second sealing portion 26B may be replaced with the nano-particle 16b and may be caused to have the same composition as that of the nano-particle 16b added to the sealing material 16d of the first sealing portion 26A, and the proportion of the nano-particles 16b in the sealing material 16d of the first sealing portion 26A may be caused to be higher than the proportion of the nano-particles 16b in the sealing material 16d of the second sealing portion 26B.

Although the fluorescent material 16c is added to both the first sealing portion 26A and the second sealing portion 26B in the seventh embodiment and its variations, the fluorescent material 16c may be added to only one of them.

Although the sealing portion 26 has a double-layer structure including the first sealing portion 26A and the second sealing portion 26B in the seventh embodiment and its variations, the present invention is not limited to the double-layer structure and may have a multilayer structure having three or more layers. Note that, in the case of the multilayer structure having three or more layers, the refractive indices of the sealing portions need to be successively reduced with distance from the LED chip 12 increases.

Eighth Embodiment

Hereinafter, a semiconductor light-emitting device according to an eighth embodiment of the present invention will be described with reference to the drawings.

Figure 27:
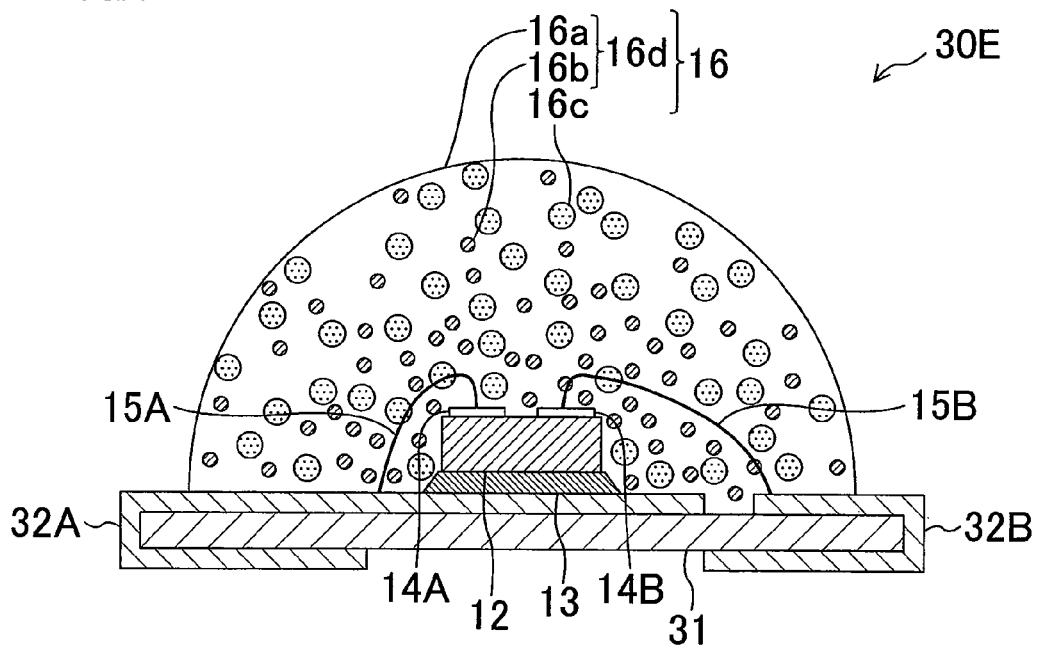
FIG. 27 A schematic cross-sectional view of a structure of a semiconductor light-emitting device according to an eighth embodiment of the present invention.

FIG. 27 is a schematic cross-sectional view of a structure of a white LED device which is the semiconductor light-emitting device of the eighth embodiment of the present invention. Also here, the same parts as those shown in FIGS. 1 and 6 are indicated by the same symbols and will not be described.

As shown in FIG. 27, in the semiconductor light-emitting device 30E of the eighth embodiment, an LED chip 12 is provided on a printed wiring board having a substrate 31 and at least a first wiring 32A and a second wiring 32B selectively formed on a front surface and a rear surface of the substrate 31, using so-called junction-up (face-up) mounting, where a rear surface of the LED chip 12 is opposed to a major surface of the substrate 31.

A sealing portion 16 comprises a sealing material 16d which is a composite material including a matrix material 16a and nano-particles 16b made of an inorganic material which are uniformly distributed in the matrix material 16a, and a fluorescent material 16c. The sealing portion 16 may comprise the same materials which are included in the sealing portion 16 of the first embodiment. Note that, in the eighth embodiment, the proportion of the nano-particles 16b in the composite material is caused to be higher in an inner region thereof near the LED chip 12 than in an outer region thereof.

When the LED chip 12 as well as the crystal growth substrate (epitaxial substrate) are made of a gallium nitride (GaN)-based semiconductor, the difference in refractive index between the sealing portion and the air is large even if the refractive index of the sealing portion is set to be about 1.8, which allows the highest extraction efficiency, by adding nano-particles to GaN, whose refractive index is about 2.5 as shown in [Table 1].

Therefore, in the eighth embodiment, the value of the refractive index of the inner region near the LED chip 12 of the sealing portion 16 is set to be larger than the value of the refractive index of the outer region. Specifically, the concentration of the nano-particles 16b added to the sealing portion 16 is caused to be high in the inner region and is decreased outward, so that the refractive index of the outer region of the sealing portion 16 is caused to be smaller than that of the inner region. In this case, the concentration of the nano-particles 16b may be decreased from the inner region to the outer region gradually or stepwise.

Therefore, with this structure, the refractive index of the outer region which contacts the air is smaller than the refractive index of the inner region which contacts the LED chip 12, so that the difference in refractive index between the outer region of the sealing portion 16 and the air is reduced. Therefore, the total reflection of radiated light on an interface between the sealing portion 16 and the air can be reduced, thereby making it possible to improve the light resistance and heat resistance of the sealing portion 16, and further improve the light extraction efficiency.

Also, in this embodiment, the outer shape of the sealing portion 16 is shaped into a hemisphere by, for example, a potting method, so that the total reflection of radiated light is further reduced. Here, in order to cause the added concentration of the nano-particles 16b to be high in the inner region and low in the outer region, a liquid composite material before curing is potted in a plurality of divided amounts, for example. Specifically, potting may be performed so that the added proportion of the nano-particles 16b in a composite material for the outer region is smaller than the added proportion of the nano-particles 16b in a composite material for the inner region. In this case, as the nano-particles 16b in the second time and later, other nano-particles made of an inorganic material having a refractive index smaller than the refractive index of the nano-particle 16b in the first time, may be selected. Thereafter, curing is performed to obtain the sealing portion 16 made of the composite material, thereby making it possible to form the structure of this embodiment.

Although the fluorescent material 16c is added to the sealing portion 16 in the eighth embodiment, the fluorescent material 16*c* does not need to be added to the sealing portion 16 in the case of a green LED device or the like in which a GaP-based semiconductor is used for the LED chip 12.

First Variation of Eighth Embodiment

Figure 28:
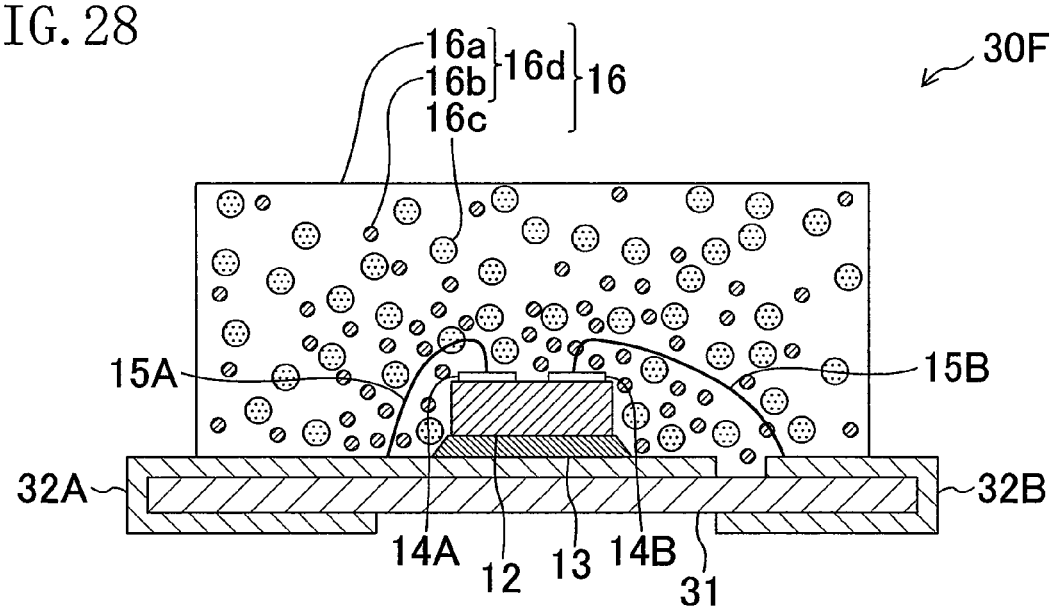
FIG. 28 A schematic cross-sectional view of a structure of a semiconductor light-emitting device according to a first variation of the eighth embodiment of the present invention.

FIG. 28 is a schematic cross-sectional view of a structure of a white LED device which is a semiconductor light-emitting device according to a first variation of the eighth embodiment of the present invention.

As shown in FIG. 28, in the semiconductor light-emitting device 30F of the first variation, a sealing portion 16 in which the added concentration of nano-particles 16*b* is gradually decreased outward has a cross-section having a quadrangular outer shape.

A sealing material 16*d* of the sealing portion 16 of this variation can be formed by performing, a plurality of times, a transfermolding method which causes the added concentration of the nano-particles 16*b* to be smaller in an outer portion of the sealing portion 16 than in an inner portion thereof.

Second Variation of Eighth Embodiment

Figure 29:
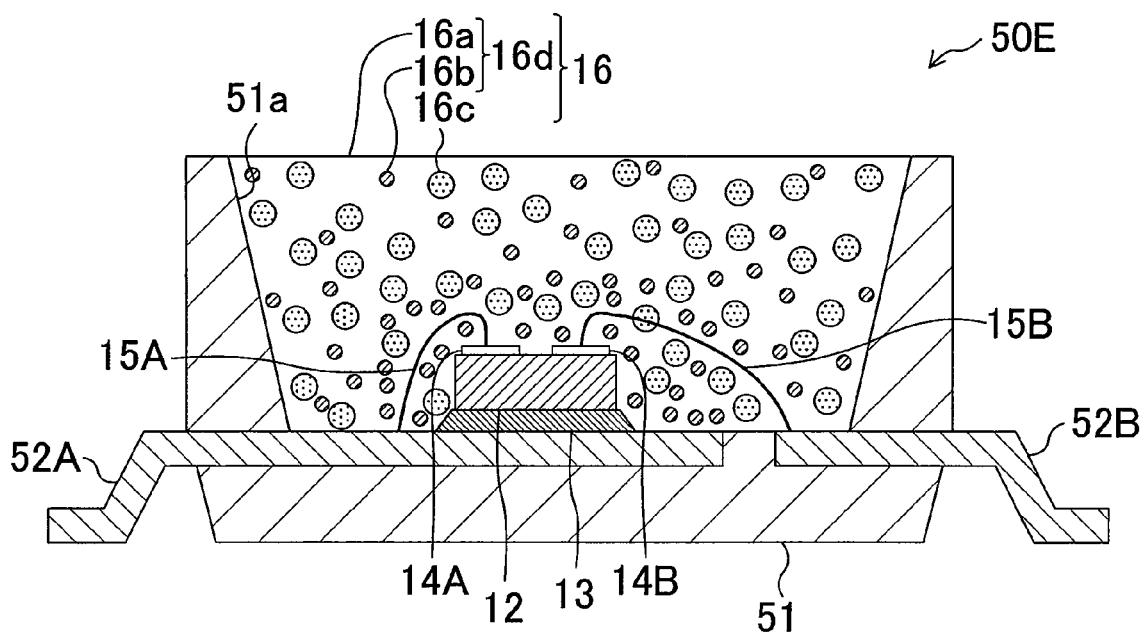
FIG. 29 A schematic cross-sectional view of a structure of a semiconductor light-emitting device according to a second variation of the eighth embodiment of the present invention.

FIG. 29 is a schematic cross-sectional view of a structure of a white LED device which is a semiconductor light-emitting device according to a second variation of the eighth embodiment of the present invention.

As shown in FIG. 29, in the semiconductor light-emitting device 50E of the second variation, an LED chip 12 is fixed onto a bottom surface of a hollow portion 51*a* in a case material 51 having the hollow portion 51*a* by a face-up method, as in the fifth embodiment.

Here, a sealing portion 26A of the LED chip 12 has a quadrangular cross-section.

In this variation, when a white heat-resistant resin material is used as the case material 51, an inner wall of the case material 51 is further subjected to metallizing (deposition or the like of a metal, such as aluminum (Al) or the like), so that the inner wall surface of the case material 51 functions as a reflection surface. In addition, the inner wall surface of the case material 51 has a reverse taper shape which gradually becomes wider from a lower portion thereof to an upper portion thereof. Therefore, the light extraction efficiency of the sealing portion 26 is improved not only by providing a gradually decreasing refractive-index difference in the sealing portion 16 by decreasing the added concentration of nano-particles 16 outward, but also by the case material 51 and its shape.

Note that the sealing portion 16 of this variation can be formed by performing a potting method a plurality of times.

Ninth Embodiment

Hereinafter, a semiconductor light-emitting device according to a ninth embodiment of the present invention will be described with reference to the drawings.

Figure 30:
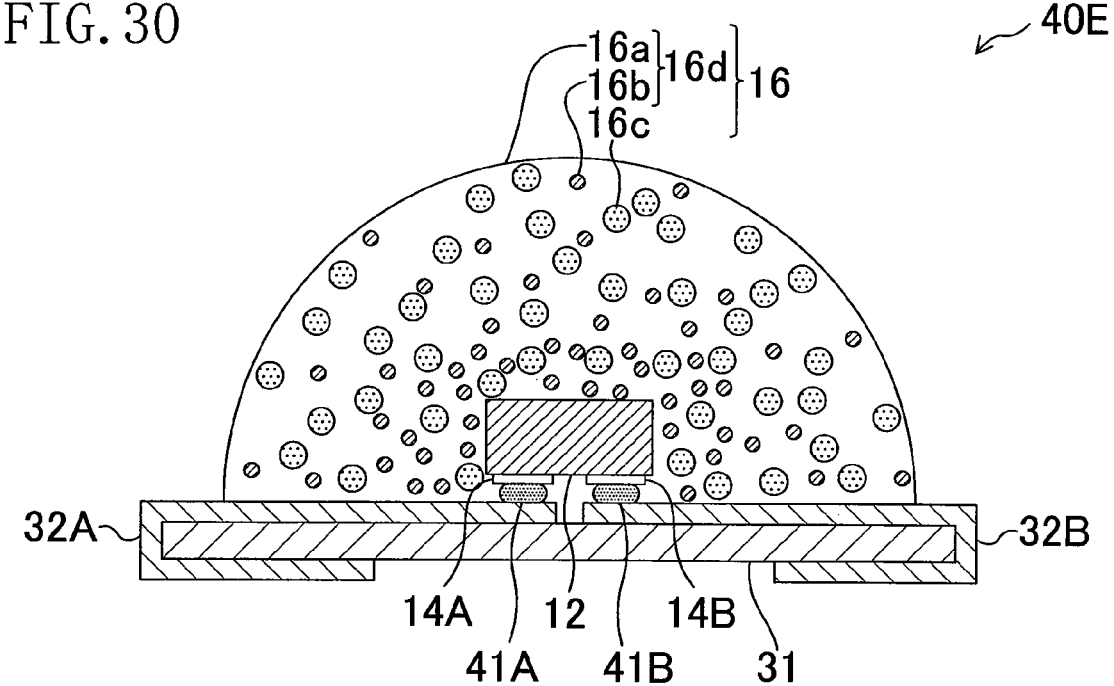
FIG. 30 A schematic cross-sectional view of a structure of a semiconductor light-emitting device according to a ninth embodiment of the present invention.

FIG. 30 is a schematic cross-sectional view of a structure of a white LED device which is the semiconductor light-emitting device of the ninth embodiment of the present invention. Also here, the same parts as those shown in FIGS. 1 and 7 are indicated by the same symbols and will not be described.

As shown in FIG. 30, in the semiconductor light-emitting device 40E of the ninth embodiment, an LED chip 12 is provided on a printed wiring board having a substrate 31 and at least a first wiring 32A and a second wiring 32B selectively formed on a front surface and a rear surface of the substrate 31 by flip-chip mounting, where an upper surface of the LED chip 12 is opposed to a major surface of the substrate 31.

A sealing portion 16 comprises a sealing material 16*d* which is a composite material including a matrix material 16*a* and nano-particles 16*b* made of an inorganic material which are uniformly distributed in the matrix material 16*a*, and a fluorescent material 16*c*. The sealing portion 16 may comprise the same materials which are included in the sealing portion 16 of the first embodiment. Note that, in the ninth embodiment, the proportion of the nano-particles 16*b* in the composite material is caused to be higher in an inner region thereof near the LED chip 12 than in an outer region thereof.

Thereby, in the ninth embodiment, the value of the refractive index of the inner region near the LED chip 12 of the sealing portion 16 is set to be larger than the value of the outer region, as in the sixth and eighth embodiments.

Specifically, with this structure, the refractive index of the outer region which contacts the air is smaller than the refractive index of the inner region which contacts the LED chip 12, so that the difference in refractive index between the outer region of the sealing portion 16 and the air is reduced. Therefore, the total reflection of radiated light on an interface between the sealing portion 16 and the air can be reduced, thereby making it possible to improve the light resistance and heat resistance of the sealing portion 16, and further improve the light extraction efficiency. Here, the added concentration of the nano-particles 16*b* may be decreased from the inner region to the outer region gradually or stepwise.

Also, in this embodiment, the outer shape of the sealing portion 16 is shaped into a hemisphere by, for example, a potting method, so that the total reflection of radiated light is further reduced. Here, in order to cause the added concentration of the nano-particles 16*b* to be high in the inner region and low in the outer region, a liquid composite material before curing is potted in a plurality of divided amounts, for example. Specifically, potting may be performed so that the added proportion of the nano-particles 16*b* in a composite material for the outer region is smaller than the added proportion of the nano-particles 16*b* in a composite material for the inner region. In this case, as the nano-particles 16*b* in the second time and later, other nano-particles made of an inorganic material having a refractive index smaller than the refractive index of the nano-particle 16*b* in the first time, may be selected. Thereafter, curing is performed to obtain the sealing portion 16 made of the composite material, thereby making it possible to form the structure of this embodiment.

Also, in the ninth embodiment, the outer shape of the sealing portion 16 is shaped into a hemisphere by, for example, a potting method, so that the total reflection of radiated light is further reduced.

Although the fluorescent material 16*c* is here added to the sealing portion 16, the fluorescent material 16*c* does not need to be added to the sealing portion 16 in the case of a green LED device or the like in which a GaP-based semiconductor is used for the LED chip 12.

First Variation of Ninth Embodiment

Figure 31:
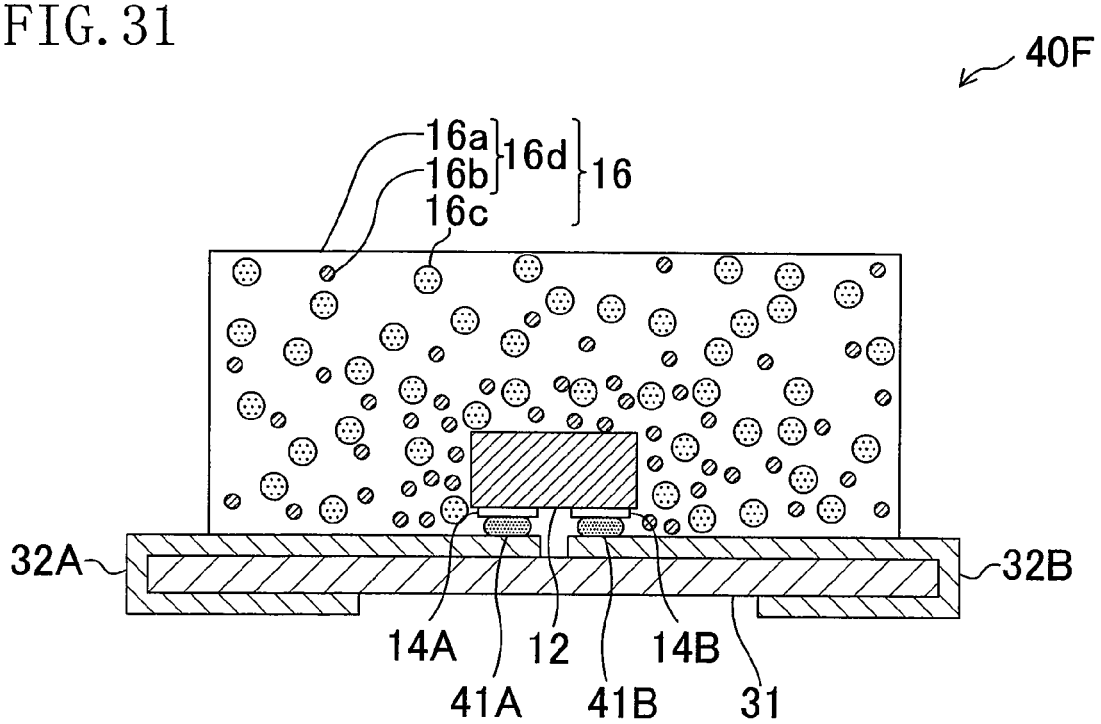
FIG. 31 A schematic cross-sectional view of a structure of a semiconductor light-emitting device according to a first variation of the ninth embodiment of the present invention.

FIG. 31 is a schematic cross-sectional view of a structure of a white LED device which is a semiconductor light-emitting device according to a first variation of the ninth embodiment of the present invention.

As shown in FIG. 31, in the semiconductor light-emitting device 40F of the first variation, a sealing portion 16 in which the added concentration of nano-particles 16*b* is gradually decreased outward has a cross-section having a quadrangular outer shape.

A sealing material 16d of the sealing portion 16 of this variation can be formed by performing, a plurality of times, a transfermolding method which causes the added concentration of the nano-particles 16b to be smaller in an outer portion of the sealing portion 16 than in an inner portion thereof.

Second Variation of Ninth Embodiment

Figure 32:
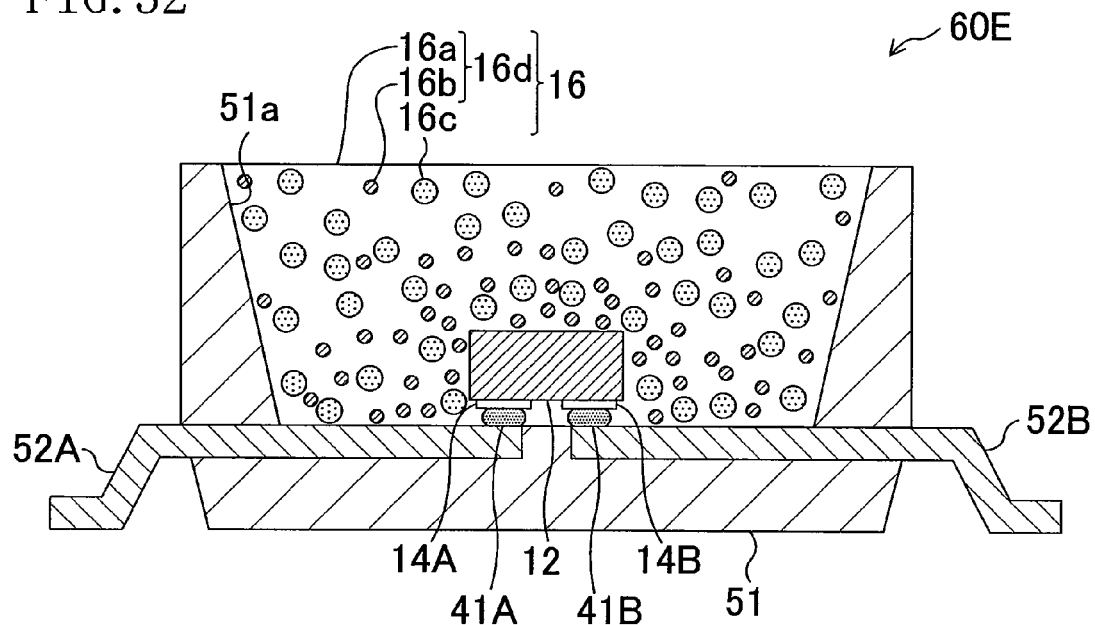
FIG. 32 A schematic cross-sectional view of a structure of a semiconductor light-emitting device according to a second variation of the ninth embodiment of the present invention.

FIG. 32 is a schematic cross-sectional view of a structure of a white LED device which is a semiconductor light-emitting device according to a second variation of the ninth embodiment of the present invention.

As shown in FIG. 32, in the semiconductor light-emitting device 60E of the second variation, an LED chip 12 is fixed onto a bottom surface of a hollow portion 51a in a case material 51 having the hollow portion 51a by flip mounting.

Here, a sealing portion 16 for the LED chip 12 has a quadrangular cross-section.

In this variation, when a white heat-resistant resin material is used as the case material 51, an inner wall of the case material 51 is further subjected to metallizing (deposition or the like of a metal, such as aluminum (Al) or the like), so that the inner wall surface of the case material 51 functions as a reflection surface. In addition, the inner wall surface of the case material 51 has a reverse taper shape which gradually becomes wider from a lower portion thereof to an upper portion thereof. Therefore, the light extraction efficiency of the sealing portion 16 is improved not only by providing a gradually decreasing refractive index difference in the sealing portion 16 by decreasing the added concentration of the nano-particles 16b outward, but also by the case material 51 and its shape.

Note that the sealing portion 16 of this variation can be formed by performing a potting method a plurality of times.

Also, in this variation, as described in the fifth variation of the seventh embodiment, an LED chip 12 may be provided via a sub-mount material 53 on a bottom surface of a hollow portion 51a in a case material 51 having the hollow portion 51a by flip-chip mounting.

Tenth Embodiment

Figure 33:
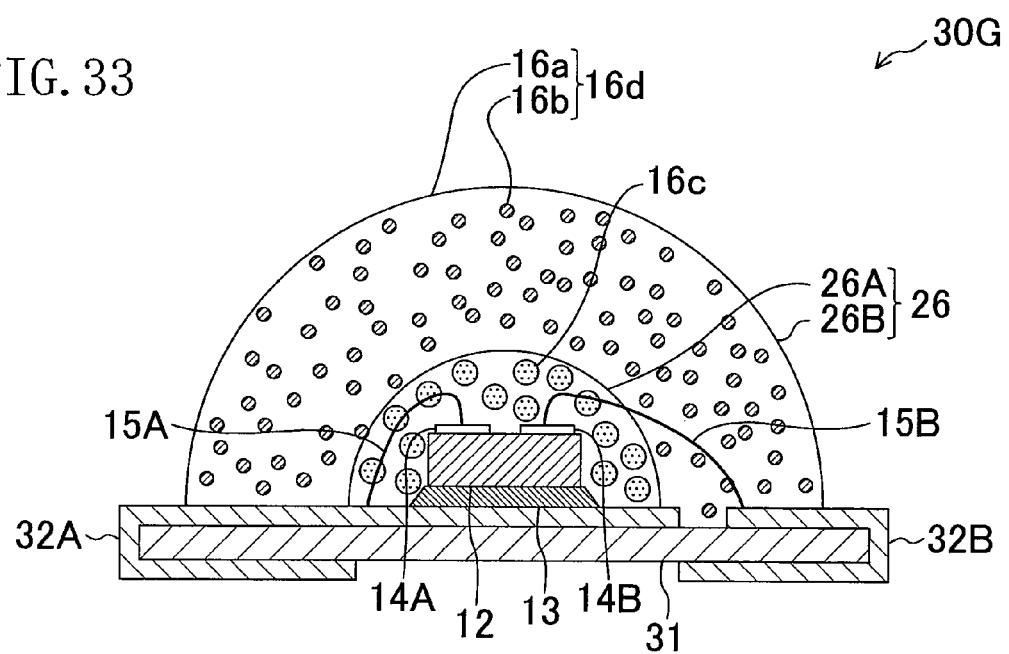
FIG. 33 A schematic cross-sectional view of a structure of a semiconductor light-emitting device according to a tenth embodiment of the present invention.

FIG. 33 is a schematic cross-sectional view of a structure of a white LED device which is a semiconductor light-emitting device according to a tenth embodiment of the present invention. Also here, the same parts as those shown in FIGS. 6 and 10 are indicated by the same symbols and will not be described.

As shown in FIG. 33, in the semiconductor light-emitting device 30G of the tenth embodiment, an LED chip 12 is provided on a printed wiring board having a substrate 31 and at least a first wiring 32A and a second wiring 32B selectively formed on a front surface and a rear surface of the substrate 31, using so-called junction-up (face-up) mounting, where a rear surface of the LED chip 12 is opposed to a major surface of the substrate 31.

A sealing portion 26 comprises a first sealing portion 26A which is in the shape of a hemisphere and directly covers the semiconductor light-emitting device chip 12, and a second sealing portion 26B which is in the shape of a hemisphere and directly covers the first sealing portion 26A.

The first sealing portion 26A comprises a resin material into which a fluorescent material 16c is kneaded. The second sealing portion 26B comprises a sealing material 16d which is a composite material including a matrix material 16a and nano-particles 16b made of an inorganic material which are uniformly distributed in the matrix material 16a.

Figure 34:
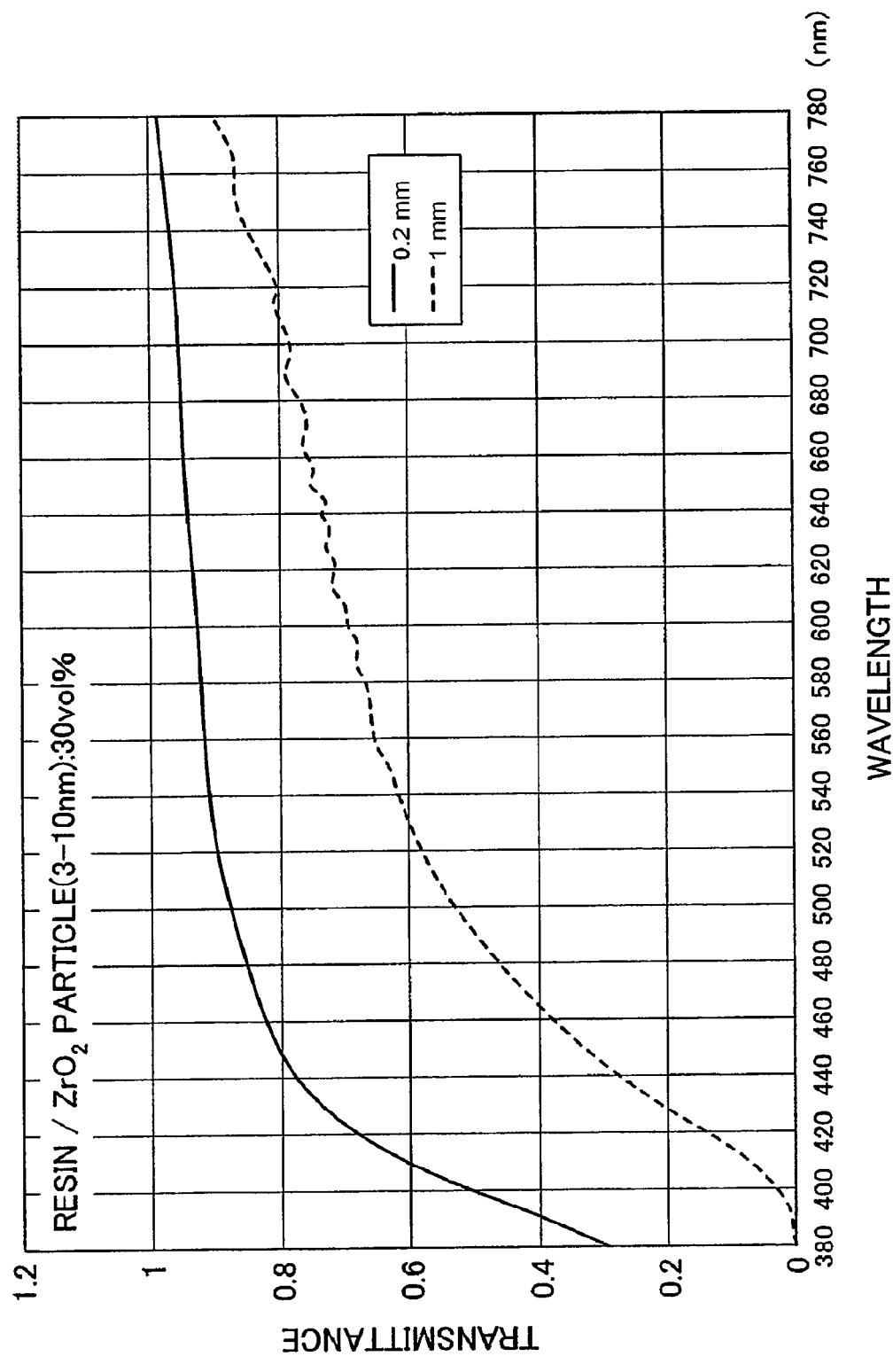
FIG. 34 A graph showing a relationship between the wavelength and transmittance of light of a sealing material where the proportion of nano-particles in a matrix material is 30% by volume, in the semiconductor light-emitting device of the tenth embodiment of the present invention.

FIG. 34 shows a relationship between the wavelength and transmittance of light when zirconium oxide ($ZrO_2$) having a diameter of 3 nm to 10 nm is used as the nano-particle 16b added to the second sealing portion 26B, and the proportion of the nano-particles 16b to the matrix material 16a is 30% by volume. It will be understood from FIG. 34 that the transmittance of light significantly decreases in a short-wavelength region. As used herein, this phenomenon is referred to as a "filter effect".

Figure 35:
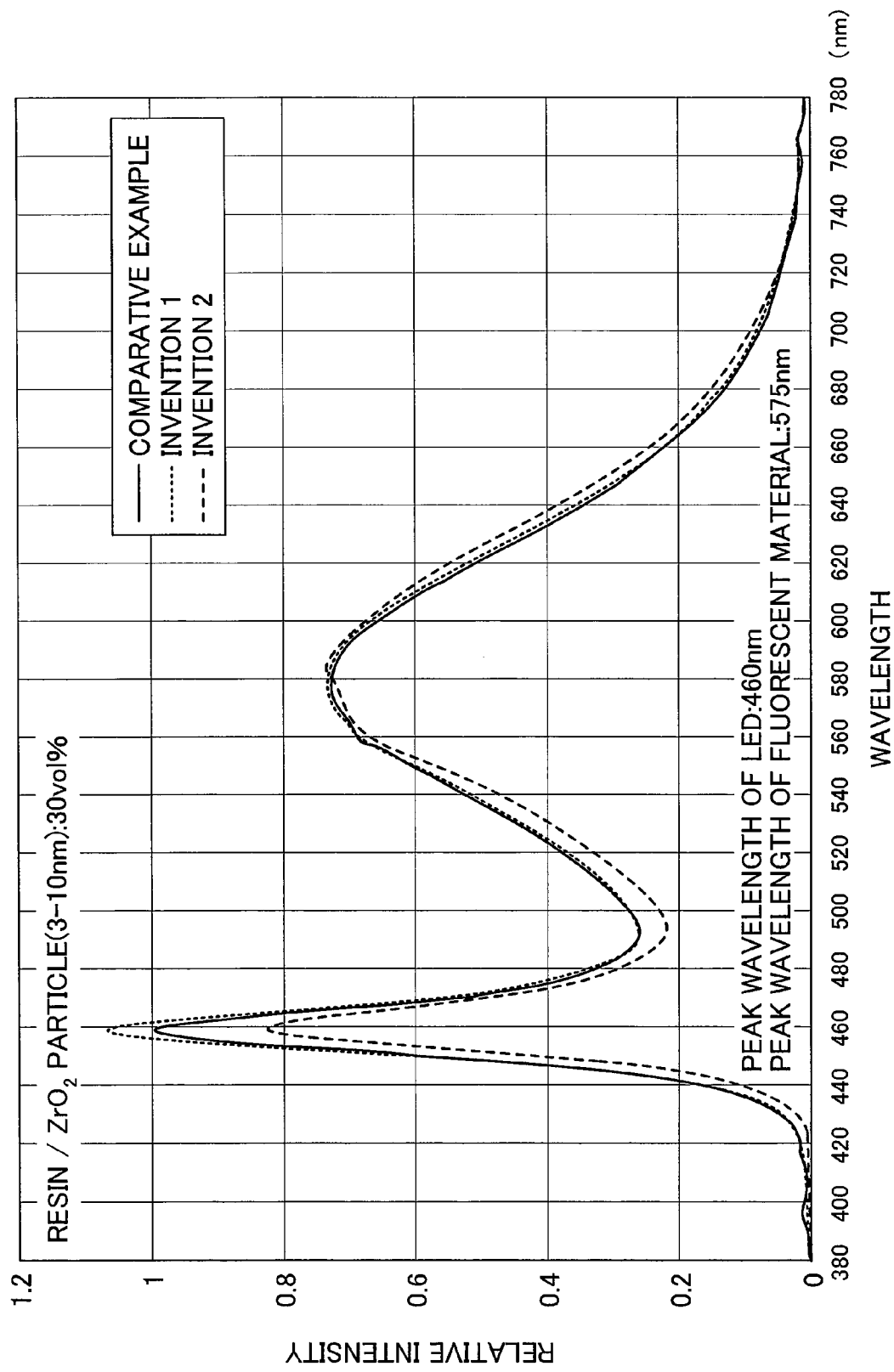
FIG. 35 A graph showing spectra of emitted light in the semiconductor light-emitting device of the tenth embodiment of the present invention.

According to the semiconductor light-emitting device 30G of the tenth embodiment, an effect similar to that of the first embodiment is obtained, and in addition, spectral components in a red region are relatively increased by the above-described filter effect as shown in FIG. 35. Specifically, radiated light from the LED chip 12 and combined light excited by the fluorescent material 16c are scattered by the nano-particles 16b, so that spectral components in blue to ultraviolet regions are attenuated, resulting in a relative increase in the spectral components in the red region. Note that a semiconductor light-emitting device which was used for measurement has the structure of FIG. 23 in which the LED chip 12 is mounted on the case material 51. Also, the radiated light of the LED chip 12 is blue light having a peak wavelength of 460 nm, and the excited light of the fluorescent material 16c is yellow light having a peak wavelength of 575 nm. Note that the fluorescent material 16c is a mixture of a fluorescent material for an orange color having a peak wavelength of 590 nm and a fluorescent material for a green color having a peak wavelength of 535 nm.

Thereby, as shown in [Table 2], an average color rendering index Ra increases, and color temperature decreases. Here, a high average color rendering index Ra indicates an excellent level of color reproducibility of an object illuminated under a light source, and low color temperature indicates a warm color of a light source.

TABLE 2

| | Comparative Example | Invention 1 | Invention 2 |
|---|---|---|---|
| Thickness | none | 0.2 mm | 1 mm |
| Color temperature | 4400 K | 4400 K | 3900 K |
| Ra | 74 | 76 | 74 |

Here, the comparative example indicates a case where no second sealing portion 26B is provided, the invention 1 indicates a case where the second sealing portion 26B including the nano-particles 16b has a thickness of 0.2 mm, and the invention 2 indicates a case where the second sealing portion 26B has a thickness of 1 mm.

As can be seen from Table 2, the invention 1 has an average color rendering index higher than that of the comparative example, and the invention 2 has a color temperature smaller by 400 K than that of the comparative example. Note that color temperature has a duv (difference from a black body locus on the chromaticity coordinates) of ±0.002.

Note that a fluorescent material which provides green light or yellow light may be added to both the first sealing portion 26A and the second sealing portion 26B (a first variation of the tenth embodiment). Even in this case, the nano-particle 16b added to the second sealing portion 26B attenuates spectral components in blue to ultraviolet regions of combined light, so that spectral components in a red region relatively increase.

Also, a first fluorescent material which provides green light or yellow light may be added to the first sealing portion 26A, and the nano-particle 16b and a second fluorescent material which provides red light may be added to the second sealing portion 26B (second variation). In this case, green light or yellow light from the first fluorescent material is absorbed by the second fluorescent material for a red color, which is in turn excited, so that spectral components in a red region are further increased. Thereby, the average color rendering index is further increased and the color temperature is further decreased.

Also, a first fluorescent material which provides red light may be added to the first sealing portion 26A, and the nano-particle 16b and a second fluorescent material which provides green light or yellow light may be added to the second sealing portion 26B (third variation). In this case, since the first fluorescent material for a red color does not absorb green light or yellow light which is emitted by the second fluorescent material, the conversion efficiency of radiated light from the LED chip 12 is improved.

Also, in the tenth embodiment and its variations, the refractive index of the first sealing portion 26A is preferably caused to be lower than the refractive index of the LED chip, and the refractive index of the second sealing portion 26B is preferably caused to be smaller than the refractive index of the first sealing portion 26A, as in the sixth embodiment. In this case, the light extraction efficiency is improved.

Note that, when the wavelength of radiated light of the LED chip 12 ranges from a blue-violet region of 410 nm or less to an ultraviolet region of 380 nm or less, but not in a blue region, a fluorescent material for a blue color is added to at least the first sealing portion 26A in addition to a fluorescent material for a green color and a fluorescent material for a red or yellow color, so that white combined light can be obtained.

Also, the outer shape of the semiconductor light-emitting device 30G and the mounting method of the LED chip 12 are not limited to those of FIG. 33, and may be similar to those of the second embodiment, the first to fifth variations of the sixth embodiment, or the first to sixth variations of the seventh embodiment.

Fourth Variation of Tenth Embodiment

Figure 36:
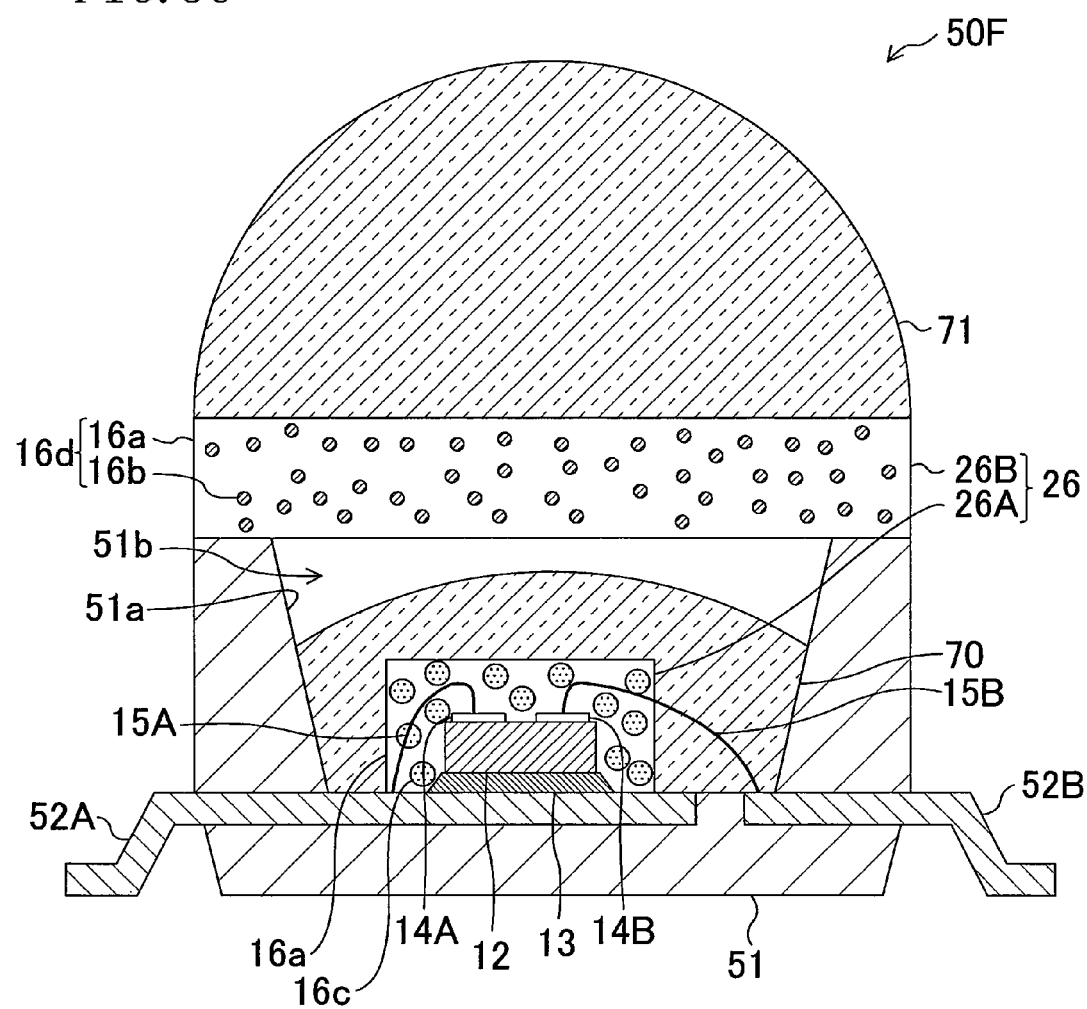
FIG. 36 A schematic cross-sectional view of a structure of a semiconductor light-emitting device according to a fourth variation of the tenth embodiment of the present invention.

FIG. 36 is a schematic cross-sectional view of a structure of a white LED device which is a semiconductor light-emitting device according to a fourth variation of the tenth embodiment of the present invention. Also here, the same parts as those shown in FIGS. 8 and 14 are indicated by the same symbols and will not be described.

As shown in FIG. 36, in the semiconductor light-emitting device 50F of the fourth variation, an LED chip 12 is fixed onto a bottom surface of a hollow portion 51a in a case material 51 having the hollow portion 51a by a face-up method, as in the fifth embodiment.

A first sealing portion 26A comprises a resin material into which a fluorescent material 16c is kneaded. A second sealing portion 26B comprises a sealing material 16d which is a composite material including a matrix material 16a and nano-particles 16b made of an inorganic material which are uniformly distributed in the matrix material 16a.

The fourth variation is characterized in that the first sealing portion 26A contacts the LED chip 12 and covers surroundings thereof, while the second sealing portion 26B is provided on an upper end surface of the case 51 and in parallel with the bottom surface of the case 51, so that an interstice portion 51b is formed between the first sealing portion 26A and the second sealing portion 26B.

Further, a first lens 70 which covers the first sealing portion 26A is formed in the interstice portion 51b, and a second lens portion 71 which covers the second sealing portion 26B is formed over the second sealing portion 26B. Here, the first lens 70 and the second lens 71 can be made of, for example, a silicone resin, an epoxy resin, an olefin resin, an acrylic resin, an urea resin, an imide resin, a polycarbonate resin, glass or the like. Note that the second lens 71 does not necessarily need to be provided.

Thus, according to this variation, even when the interstice portion 51b is provided between the first sealing portion 26A and the second sealing portion 26B, the filter effect can lead to an increase in average color rendering index and a decrease in color temperature, which are effects of the tenth embodiment.

The lenses 70 and 71 of this variation can be formed by a potting method. Also, the second sealing portion 26B can be previously formed in the shape of a plate, and can be fixed onto the upper end surface of the case 51.

Fifth Variation of Tenth Embodiment

Figure 37:
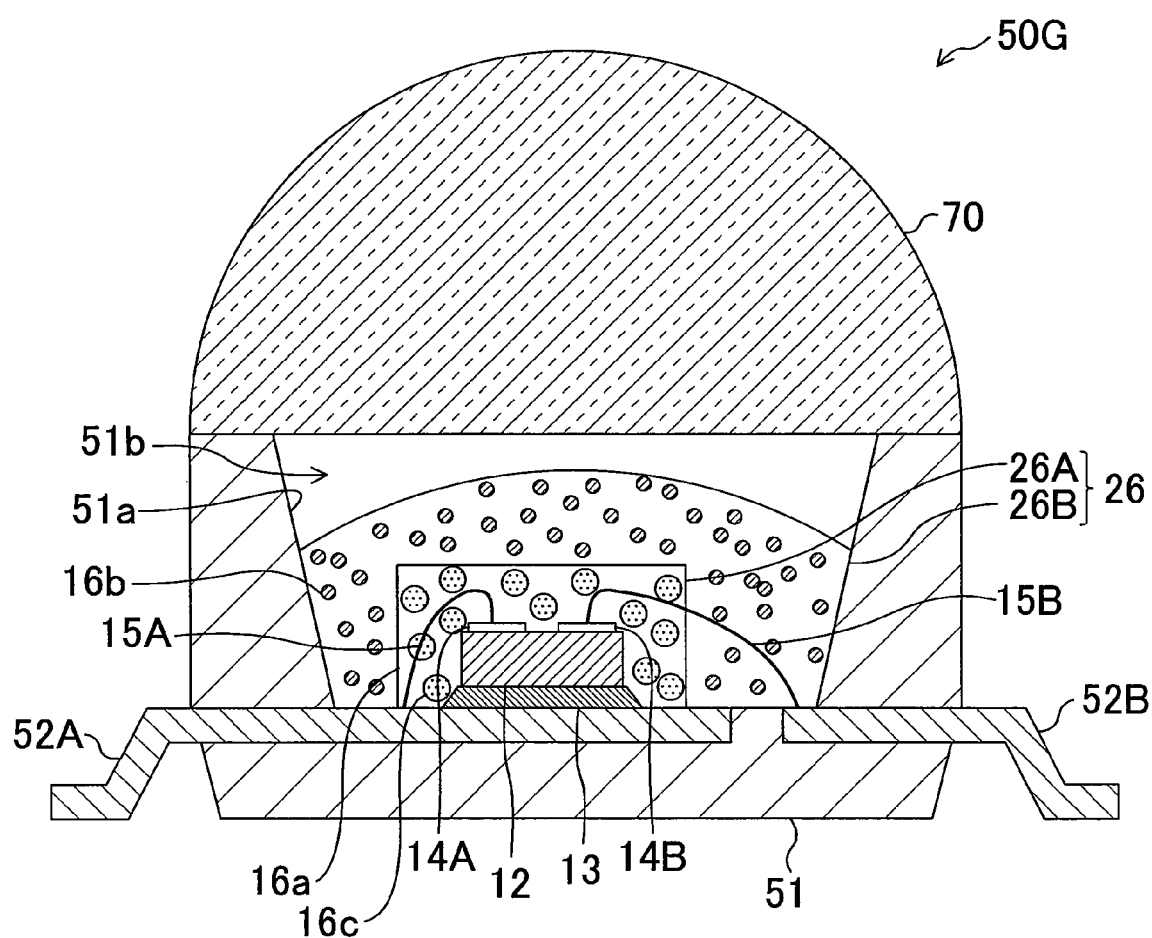
FIG. 37 A schematic cross-sectional view of a structure of a semiconductor light-emitting device according to a fifth variation of the tenth embodiment of the present invention.

FIG. 37 is a schematic cross-sectional view of a structure of a white LED device which is a semiconductor light-emitting device according to a fifth variation of the tenth embodiment of the present invention. Also here, the same parts as those shown in FIGS. 8 and 14 are indicated by the same symbols and will not be described.

As shown in FIG. 37, in the semiconductor light-emitting device 50G of the fifth variation of the tenth embodiment, an LED chip 12 is fixed onto a bottom surface of a hollow portion 51a in a case material 51 having the hollow portion 51a by a face-up method, as in the fifth embodiment.

The first sealing portion 26A comprises a resin material into which a fluorescent material 16c is kneaded. The second sealing portion 26B comprises a sealing material 16d which is a composite material including a matrix material 16a and nano-particles 16b made of an inorganic material which are uniformly distributed in the matrix material 16a.

The fifth variation is characterized in that the first sealing portion 26A contacts the LED chip 12 and covers surroundings thereof, while the second sealing portion 26B is provided, filling the hollow portion 51a of the case 51 while leaving an upper portion of the hollow portion 51a so that an interstice portion 51b is formed in the upper portion of the hollow portion 51a.

Further, a lens 70 is formed on an upper end surface of the case 51, covering the interstice portion 51b.

Note that, when the first sealing portion 26A functions as a lens, the lens 70 does not necessarily need to be provided.

Thus, according to this variation, even when the interstice portion 51b is provided between the second sealing portion 26B and the lens 70, the filter effect can lead to an increase in average color rendering index and a decrease in color temperature, which are effects of the tenth embodiment.

Note that the lens 70 of this variation may be previously molded using a molding die or the like and may be then fixed onto the upper end surface of the case 51.

Sixth Variation of Tenth Embodiment

Figure 38:
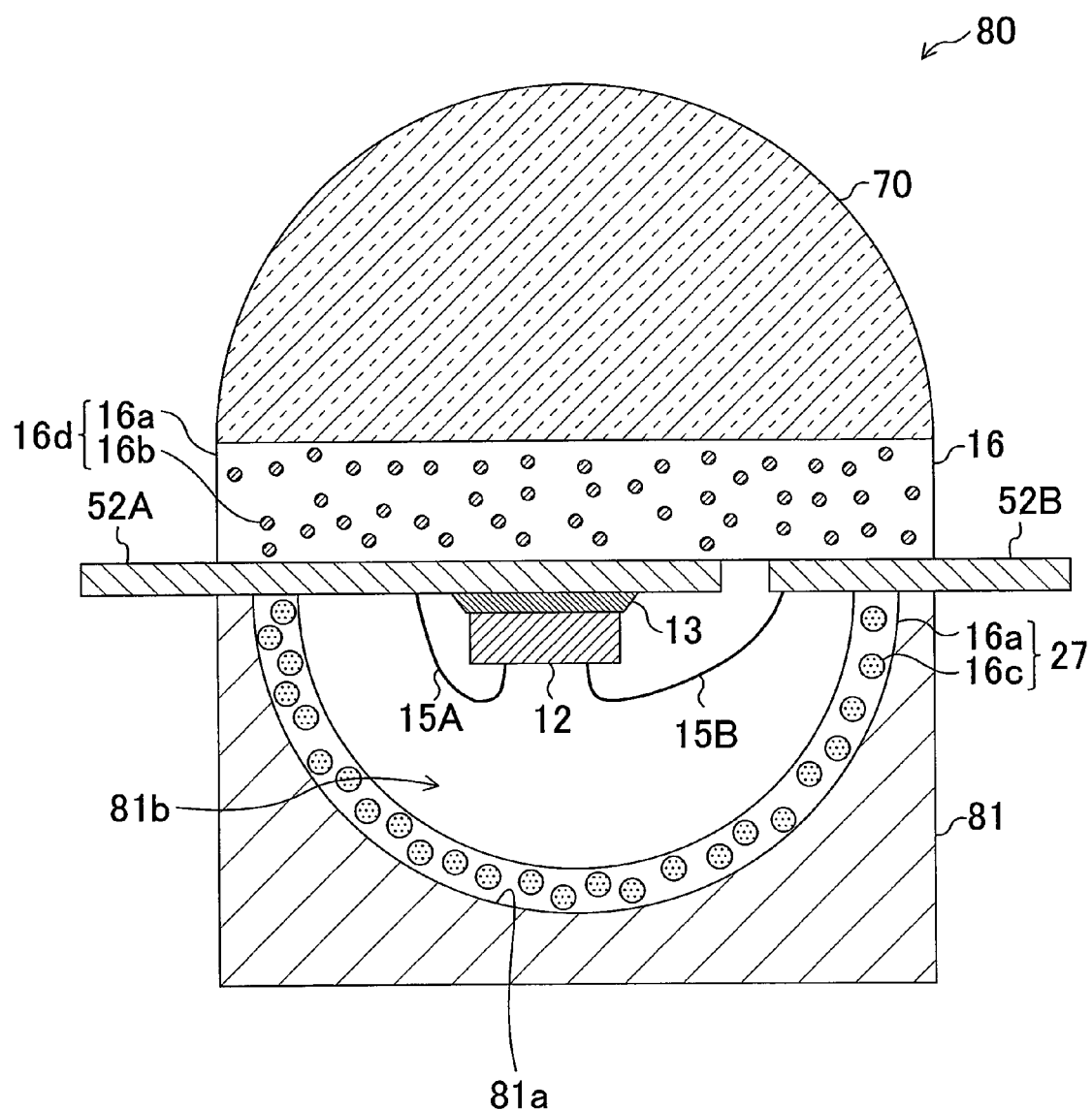
FIG. 38 A schematic cross-sectional view of a structure of a semiconductor light-emitting device according to a sixth variation of the tenth embodiment of the present invention.

FIG. 38 is a schematic cross-sectional view of a structure of a white LED device which is a semiconductor light-emitting device according to a sixth variation of the tenth embodiment of the present invention. Also here, the same parts as those shown in FIGS. 8 and 37 are indicated by the same symbols and will not be described.

As shown in FIG. 38, the semiconductor light-emitting device 80 of the sixth variation of the tenth embodiment comprises a reflector 81 which is made of, for example, a heat-resistant resin material, such as a liquid crystal polymer or the like. At least a first lead 52A and a second lead 52B are fixed to an upper end portion of the reflector 81. The reflector 81 has a reflection portion 81a having an inwardly concave shape, i.e., a hemispherical surface shape or a parabolic shape. The reflector 81 also serves as a case. Note that, in view of reflection with respect to visual light, the reflector 81 is preferably made of a white heat-resistant resin material, or the reflection portion 81a is metallized with a metal, such as aluminum or the like.

The LED chip 12 is fixed onto a lower surface of the first lead 52A by a face-up method. Specifically, mounting is performed so that an upper surface of the LED chip 12 is opposed to a bottom portion of the reflection portion 81a.

A fluorescent material layer 27 made of a resin material into which a fluorescent material 16c is kneaded is formed on a reflection surface of the reflection portion 81a. An interstice portion 81b is formed between the fluorescent material layer 27 and the LED chip 12. A sealing portion 16 is formed on an upper end surface of the reflector 81, covering the interstice portion 81b as well as the leads 52A and 52B. The sealing portion 16 comprises a sealing material 16d which is a composite material including a matrix material 16a and nano-particles 16b made of an inorganic material which are uniformly distributed in the matrix material 16a, and a fluorescent material 16c.

A lens 70 is formed on the sealing portion 16. Note that the lens 70 does not necessarily need to be provided.

Thus, even when the LED chip 12 is provided in the vicinity of a focus of the reflection portion 81a of the reflector 81, an effect of the present invention can be obtained.

Note that the interstice portion 81b of the reflector 81 may be filled with a sealing resin material, or further, a composite material having the same composition as that of the sealing portion 16 or a composite material having a different refractive index.

Eleventh Embodiment

Figure 39:
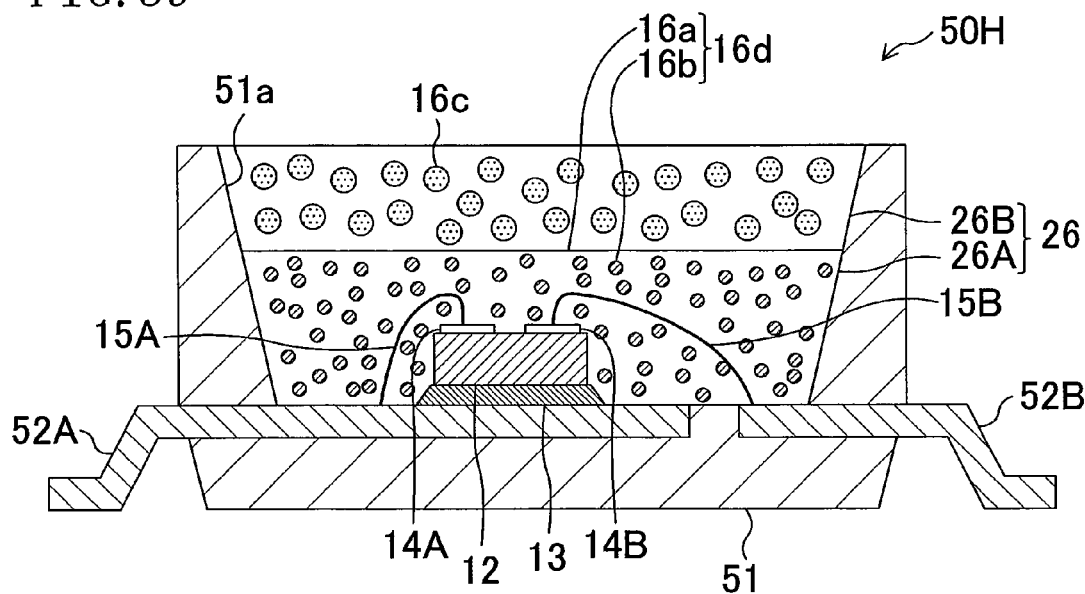
FIG. 39 A schematic cross-sectional view of a structure of a semiconductor light-emitting device according to an eleventh embodiment of the present invention.

FIG. 39 is a schematic cross-sectional view of a structure of a white LED device which is a semiconductor light-emitting device according to an eleventh embodiment of the present invention. Also here, the same parts as those shown in FIGS. 8 and 14 are indicated by the same symbols and will not be described.

As shown in FIG. 39, in the semiconductor light-emitting device 50H of the eleventh embodiment, an LED chip 12 is fixed onto a bottom surface of a hollow portion 51a in a case material 51 having the hollow portion 51a by a face-up method, as in the fifth embodiment.

A white heat-resistant resin material is used as the case material 51, or further, an inner wall and a bottom surface of the hollow portion 51a of the case material 51 are subjected to metallizing (deposition or the like of a metal, such as aluminum (Al) or the like), so that the inner wall surface of the case material 51 functions as a reflection surface.

A sealing portion 26 comprises a first sealing portion 26A which directly covers the LED chip 12 and fills a lower portion of the hollow portion 51a of the case material 51, and a second sealing portion 26B which is formed in the shape of a layer on the first sealing portion 26A.

The first sealing portion 26A comprises a sealing material 16d which is a composite material including a matrix material 16a and nano-particles 16b made of an inorganic material which are uniformly distributed in the matrix material 16a. The second sealing portion 26B comprises a resin material into which a fluorescent material 16c is kneaded.

With this structure, a portion of radiated light from the LED chip 12 which is reflected by the fluorescent material 16c added to the second sealing portion 26B, and a portion of light emitted by the fluorescent material 16c, are reflected by an interface between the inner wall or bottom surface of the hollow portion 51a of the case material 51 and the first sealing portion 26A, and is then transmitted through the first sealing portion 26A again.

According to the semiconductor light-emitting device 50H of the eleventh embodiment, an effect similar to that of the first embodiment is obtained, and in addition, spectral components in a red region are relatively increased by the above-described filter effect that combined light in blue to ultraviolet regions is attenuated. Thereby, the average color rendering index is increased and the color temperature is decreased.

Note that, when radiated light of the LED chip 12 is blue light, a fluorescent material which provides green light or yellow light may be added to both the first sealing portion 26A and the second sealing portion 26B (a first variation of the eleventh embodiment). Even in this case, the nano-particle 16b added to the first sealing portion 26A attenuates spectral components in blue to ultraviolet regions of combined light, so that spectral components in a red region relatively increase.

Also, a first fluorescent material which provides green light or yellow light may be added to the first sealing portion 26A, and a second fluorescent material which provides red light may be added to the second sealing portion 26B (second variation). In this case, green light or yellow light from the first fluorescent material is absorbed by the second fluorescent material for a red color, which is in turn excited, so that the average color rendering index is further increased and the color temperature is further decreased.

Also, a first fluorescent material which provides red light may be added to the first sealing portion 26A, and a second fluorescent material which provides green light or yellow light may be added to the second sealing portion 26B (third variation). In this case, since the first fluorescent material for a red color does not absorb green light or yellow light which is emitted by the second fluorescent material, the conversion efficiency of radiated light from the LED chip 12 is improved.

Also, in the eleventh embodiment and its variations, the refractive index of the first sealing portion 26A is preferably caused to be smaller than the refractive index of the LED chip 12, and the refractive index of the second sealing portion 26B is preferably caused to be smaller than the refractive index of the first sealing portion 26A, as in the sixth embodiment. In this case, the light extraction efficiency is improved.

Also, the outer shape of the semiconductor light-emitting device 50H and the mounting method of the LED chip 12 are not limited to those of FIG. 39, and may be similar to those of the second embodiment, the sixth embodiment, the first to fifth variations of the sixth embodiment, the seventh embodiment, or the first to sixth variations of the seventh embodiment.

Fourth Variation of Eleventh Embodiment

Figure 40:
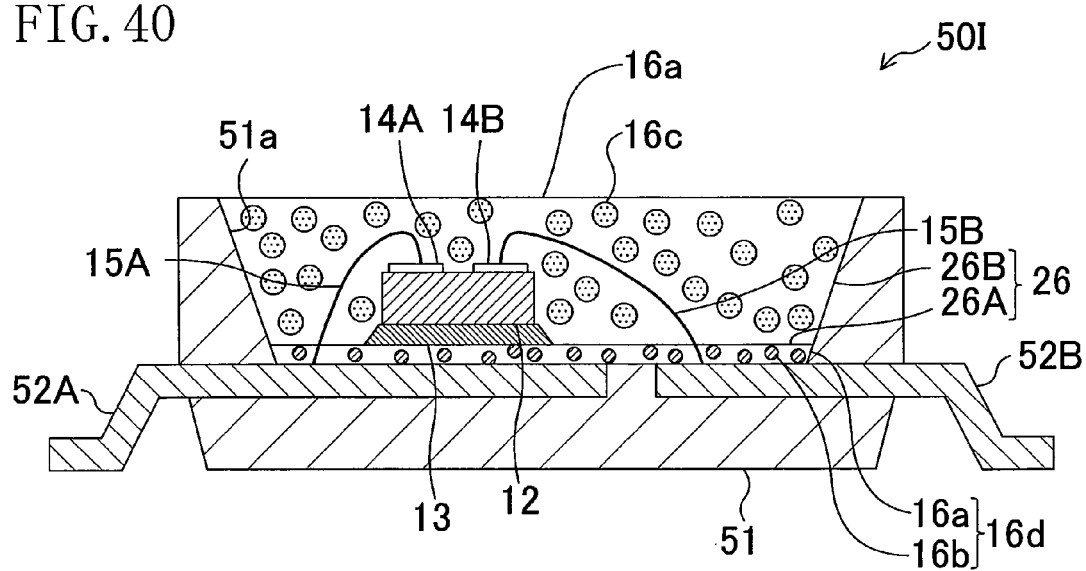
FIG. 40 A schematic cross-sectional view of a structure of a semiconductor light-emitting device according to a fourth variation of the eleventh embodiment of the present invention.

FIG. 40 is a schematic cross-sectional view of a structure of a white LED device which is a semiconductor light-emitting device according to a fourth variation of the eleventh embodiment of the present invention. Also here, the same parts as those shown in FIGS. 8 and 14 are indicated by the same symbols and will not be described.

As shown in FIG. 40, in the semiconductor light-emitting device 50I of the fourth variation, a sealing portion 26 comprises a first sealing portion 26A as an underlying layer formed below an LED chip 12 and a second sealing portion 26B which is formed on the first sealing portion 26A, covering the LED chip 12, and fills a hollow portion 51a of a case material 51.

Specifically, the first sealing portion 26A is formed on a bottom surface of the case material 51, and the LED chip 12 is fixed onto the first sealing portion 26A via a chip fixing paste material 13 which is transparent to visible light, by a face-up method. A white heat-resistant resin material is used as the case material 51, or further, a bottom surface or an inner wall surface of the hollow portion 51a of the case material 51 is subjected to metallizing (deposition or the like of a metal, such as aluminum (Al) or the like), so that the inner wall surface of the case material 51 functions as a reflection surface.

The first sealing portion 26A comprises a sealing material 16d which is a composite material including a matrix material 16a and nano-particles 16b made of an inorganic material which are uniformly distributed in the matrix material 16a. The second sealing portion 26B comprises a resin material into which a fluorescent material 16c is kneaded.

With this structure, a portion of radiated light from the LED chip 12 which is reflected by the fluorescent material 16c added to the second sealing portion 26B, and a portion of excited light from the fluorescent material 16c, are reflected by an interface between the hollow portion 51a of the case material 51 and the first sealing portion 26A, and is then transmitted through the first sealing portion 26A again. As a result, spectral components in a red region are relatively increased by the above-described filter effect, so that the average color rendering index is increased and the color temperature is decreased.

In addition, since the nano-particle 16b is added to the first sealing portion 26A which is the underlying layer for the LED chip 12, the heat radiation performance of the LED chip 12 is improved.

Also, since the chip fixing paste material 13 is a transparent paste material, and the bottom surface of the hollow portion 51a of the case material 51 is metallized with a metal, the light extraction efficiency is improved.

Note that nano-particles may be added to the second sealing portion 26B so that the second sealing portion 26B is caused to be a composite material. In this case, the nano-particle is preferably selected which causes the refractive index of the second sealing portion 26B to be smaller than the refractive index of the first sealing portion 26A.

Fifth Variation of Eleventh Embodiment

Figure 41:
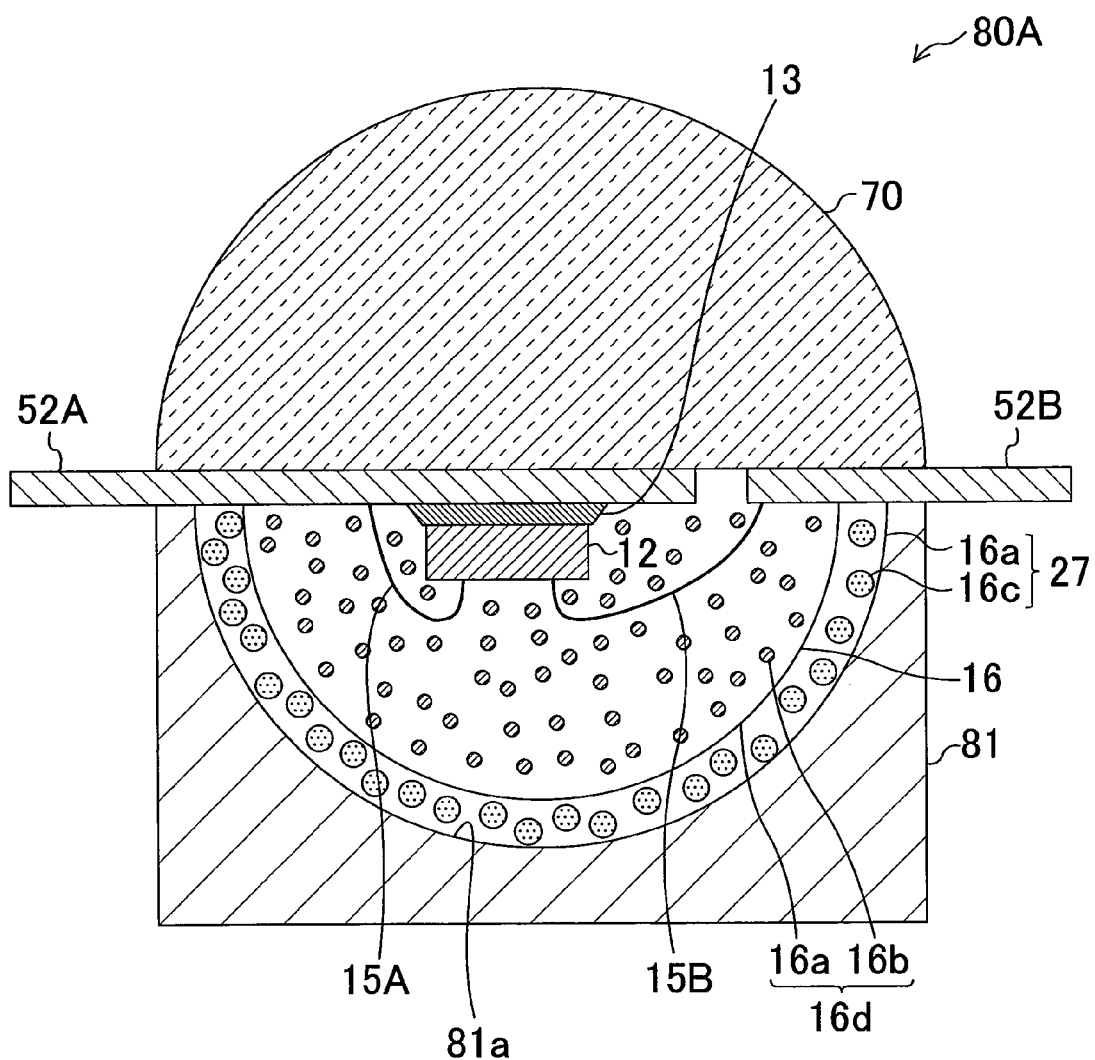
FIG. 41 A schematic cross-sectional view of a structure of a semiconductor light-emitting device according to a fifth variation of the eleventh embodiment of the present invention.

FIG. 41 is a schematic cross-sectional view of a structure of a white LED device which is a semiconductor light-emitting device according to a fifth variation of the eleventh embodiment of the present invention. Also here, the same parts as those shown in FIG. 38 are indicated by the same symbols and will not be described.

As shown in FIG. 41, the semiconductor light-emitting device 80A of the fifth variation of the eleventh embodiment comprises a reflector 81 which is made of, for example, a heat-resistant resin material, such as a liquid crystal polymer or the like. At least a first lead 52A and a second lead 52B are fixed to an upper end portion of the reflector 81. The reflector 81 has a reflection portion 81a having an inwardly concave shape, i.e., a hemispherical surface shape or a parabolic shape. The reflector 81 also serves as a case. Note that the reflector 81 is preferably made of a white heat-resistant resin material, or the reflection portion 81a is metallized with a metal, such as aluminum or the like.

The LED chip 12 is fixed onto a lower surface of the first lead 52A by a face-up method. Specifically, mounting is performed so that an upper surface of the LED chip 12 is opposed to a bottom portion of the reflection portion 81a.

A fluorescent material layer 27 made of a resin material into which a fluorescent material 16c is kneaded is formed on a reflection surface of the reflection portion 81a. An interstice between the fluorescent material layer 27 and the LED chip 12 is filled with a sealing portion 16. The sealing portion 16 comprises a sealing material 16d which is a composite material including a matrix material 16a and nano-particles 16b made of an inorganic material which are uniformly distributed in the matrix material 16a.

A lens 70 is formed on an upper end surface of the reflector 81, covering the leads 52A and 52B. Note that the lens 70 does not necessarily need to be provided.

With this structure, a portion of radiated light from the LED chip 12 which is reflected by the fluorescent material 16c added to the fluorescent material layer 27, and a portion of light emitted by the fluorescent material 16c, are reflected by the reflection portion 81a of the reflector 81, and is then passed through the sealing portion 16 again. As a result, spectral components in a red region are relatively increased by the above-described filter effect, so that the average color rendering index is increased and the color temperature is decreased.

Note that the sealing portion 16 may have a double-layer structure of at least a first sealing portion and a second sealing portion as in the sixth embodiment, and the refractive index of the second sealing portion positioned outside the first sealing portion may be caused to be lower than the refractive index of the first sealing portion.

Twelfth Embodiment

Hereinafter, a semiconductor light-emitting device according to a twelfth embodiment of the present invention will be described with reference to the drawings.

Figure 42:
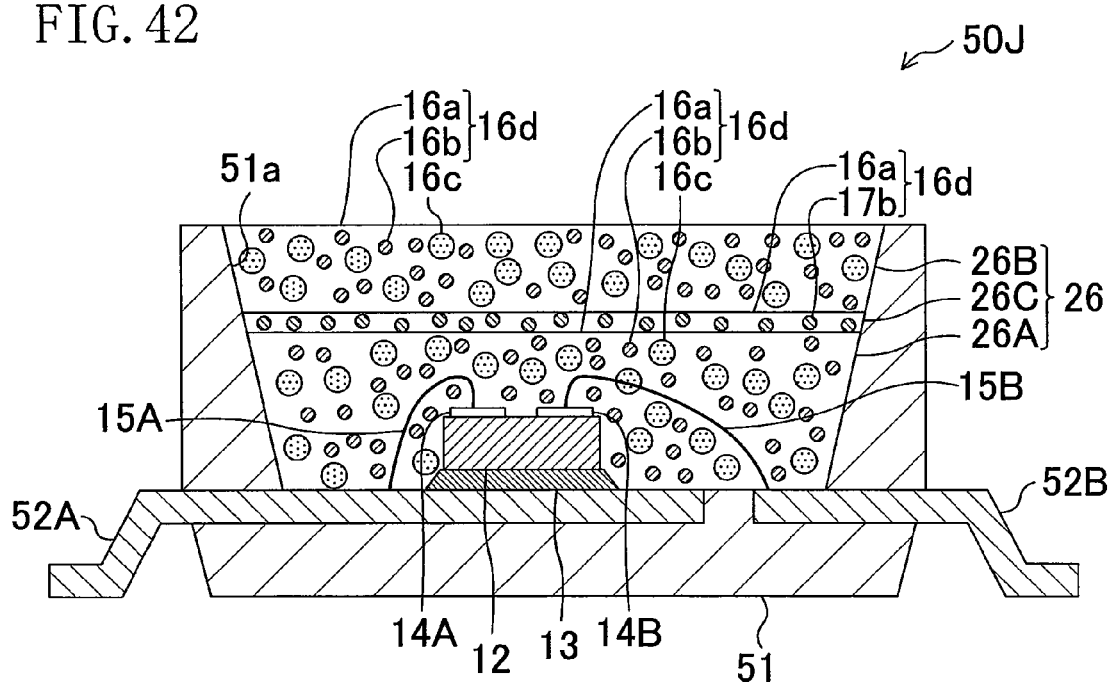
FIG. 42 A schematic cross-sectional view of a structure of a semiconductor light-emitting device according to a twelfth embodiment of the present invention.

FIG. 42 is a schematic cross-sectional view of a structure of a white LED device which is the semiconductor light-emitting device of the twelfth embodiment of the present invention. Also here, the same parts as those shown in FIGS. 8 and 14 are indicated by the same symbols and will not be described.

As shown in FIG. 42, in the semiconductor light-emitting device 50J of the twelfth embodiment, an LED chip 12 is fixed onto a bottom surface of a hollow portion 51a in a case material 51 having the hollow portion 51a by a face-up method, as in the fifth embodiment.

A sealing portion 26 comprises a first sealing portion 26A which directly covers the LED chip 12 and fills a lower portion of the hollow portion 51a of the case material 51, and a second sealing portion 26B which is formed in the shape of a layer on the first sealing portion 26A via a third sealing portion 26C.

The first sealing portion 26A and the second sealing portion 26B comprise a sealing material 16d which is a composite material including a matrix material 16a and nano-particles 16b made of an inorganic material which are uniformly distributed in the matrix material 16a, and a fluorescent material 16c.

The third sealing portion 26C comprises a sealing material 16d which is a composite material including a matrix material 16a and second nano-particles 17b made of an inorganic material capable of absorbing ultraviolet light, such as zinc oxide, titanium oxide, cerium oxide or the like, which are uniformly distributed in the matrix material 16a.

According to the semiconductor light-emitting device 50J of the twelfth embodiment, an effect similar to that of the first embodiment is obtained, and in addition, since the third sealing portion 26C is provided as an ultraviolet light absorbing layer between the first sealing portion 26A and the second sealing portion 26B, light components in an ultraviolet region included in radiated light from the LED chip 12 are absorbed by the third sealing portion 26C. As a result, as the matrix material 16a included in the second sealing portion 26B, an epoxy resin can be used which has an excellent level of water resistance and heat resistance and is easily changed into yellow by ultraviolet light.

Note that, in the sealing portion 26, preferably, the refractive index of the second sealing portion 26B is lower than the refractive index of the third sealing portion 26C, and the refractive index of the third sealing portion 26C is lower than the refractive index of the first sealing portion 26A.

Also, the first sealing portion 26A and the second sealing portion 26B do not necessarily need to include the second nano-particle 17b. The fluorescent material 16c may be included in either the first sealing portion 26A or the third sealing portion 26C. Note that, when radiated light of the LED chip 12 mainly includes ultraviolet light, the first sealing portion 26A needs to include the fluorescent material 16c.

Figure 43:
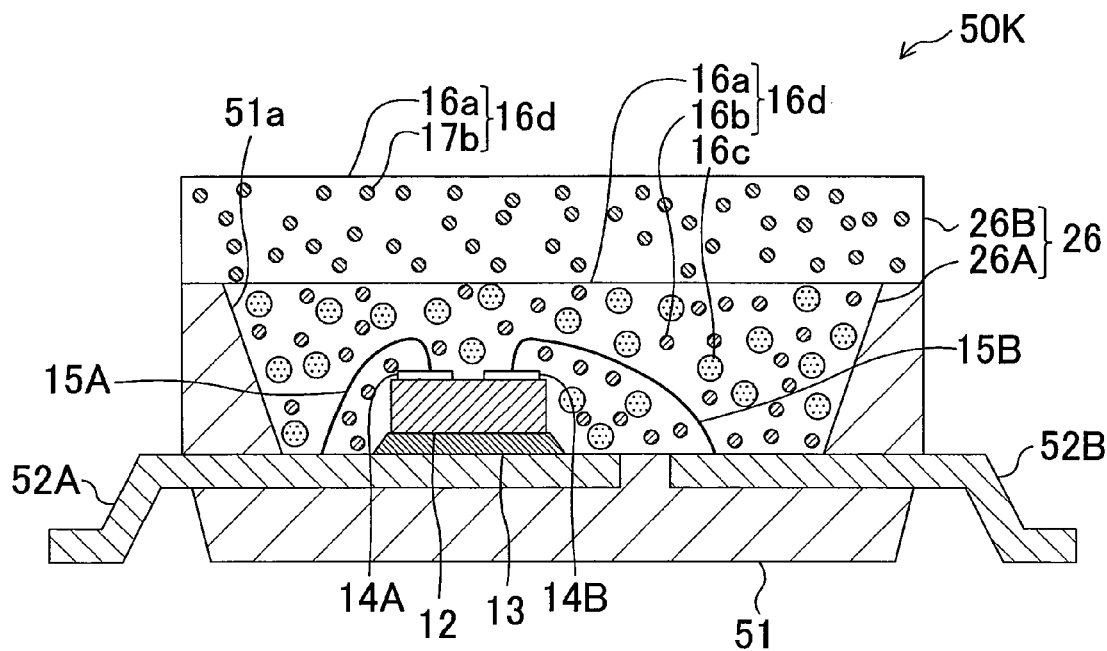
FIG. 43 A schematic cross-sectional view of a structure of a semiconductor light-emitting device according to a thirteenth embodiment of the present invention.

Also, the outer shape of the semiconductor light-emitting device 50J and the mounting method of the LED chip 12 are not limited to those of FIG. 43, and may be similar to those of the second embodiment, the sixth embodiment, the first to fifth variations of the sixth embodiment, the seventh embodiment or the first to sixth variations of the seventh embodiment.

Thirteenth Embodiment

Hereinafter, a semiconductor light-emitting device according to a thirteenth embodiment of the present invention will be described with reference to the drawings.

FIG. 43 is a schematic cross-sectional view of a structure of a white LED device which is the semiconductor light-emitting device of the thirteenth embodiment of the present invention. Here, the same parts as those shown in FIG. 8 are indicated by the same symbols and will not be described.

As shown in FIG. 43, in the semiconductor light-emitting device 50K of the thirteenth embodiment, an LED chip 12 is fixed onto a bottom surface of a hollow portion 51a in a case material 51 having the hollow portion 51a by a face-up method, as in the fifth embodiment.

A sealing portion 26 comprises a first sealing portion 26A which directly covers the LED chip 12 and fills the hollow portion 51a of the case material 51, and a second sealing portion 26B which is formed on an upper surface of the first sealing portion 26A, covering the first sealing portion 26A.

The first sealing portion 26A comprises a sealing material 16d which is a composite material including a matrix material 16a and nano-particles 16b made of an inorganic material which are uniformly distributed in the matrix material 16a, and a fluorescent material 16c.

The second sealing portion 26B comprises a sealing material 16d which is a composite material including a matrix material 16a and second nano-particles 16d made of an inorganic material capable of absorbing ultraviolet light, such as zinc oxide, titanium oxide, cerium oxide or the like, which are uniformly distributed in the matrix material 16a. Thus, by using the sealing material 16d which is a composite material, the composite material is likely to scatter light having a wavelength of ultraviolet light, in addition to the adsorption effect of the nano-particle 16b, so that an effect of suppressing transmission of ultraviolet light is considerably improved.

According to the semiconductor light-emitting device 50K of the thirteenth embodiment, an effect similar to that of the first embodiment is obtained, and in addition, since the second sealing portion 26B is provided as an ultraviolet light absorbing layer on the first sealing portion 26A, light components in an ultraviolet region included in radiated light from the LED chip 12 are absorbed by the third sealing portion 26B. As a result, undesired ultraviolet light can be prevented from being output from the semiconductor light-emitting device 50K.

In addition, the second sealing portion 26B which absorbs ultraviolet light is provided outside the first sealing portion 26A, so that the sealing material 16d and the fluorescent material 16c are prevented from being degraded due to external incident ultraviolet light.

Note that the wavelength region of radiated light of the LED chip 12 is not limited to blue to ultraviolet regions. Therefore, the semiconductor light-emitting device 50K is not limited to a white LED device.

Also, the first sealing portion 26A does not necessarily need to include the first nano-particle 16b.

Also, the outer shape of the semiconductor light-emitting device 50K and the mounting method of the LED chip 12 are not limited to those of FIG. 43, and may be similar to those of the first to fourth embodiments.

Variation of Thirteenth Embodiment

Figure 44:
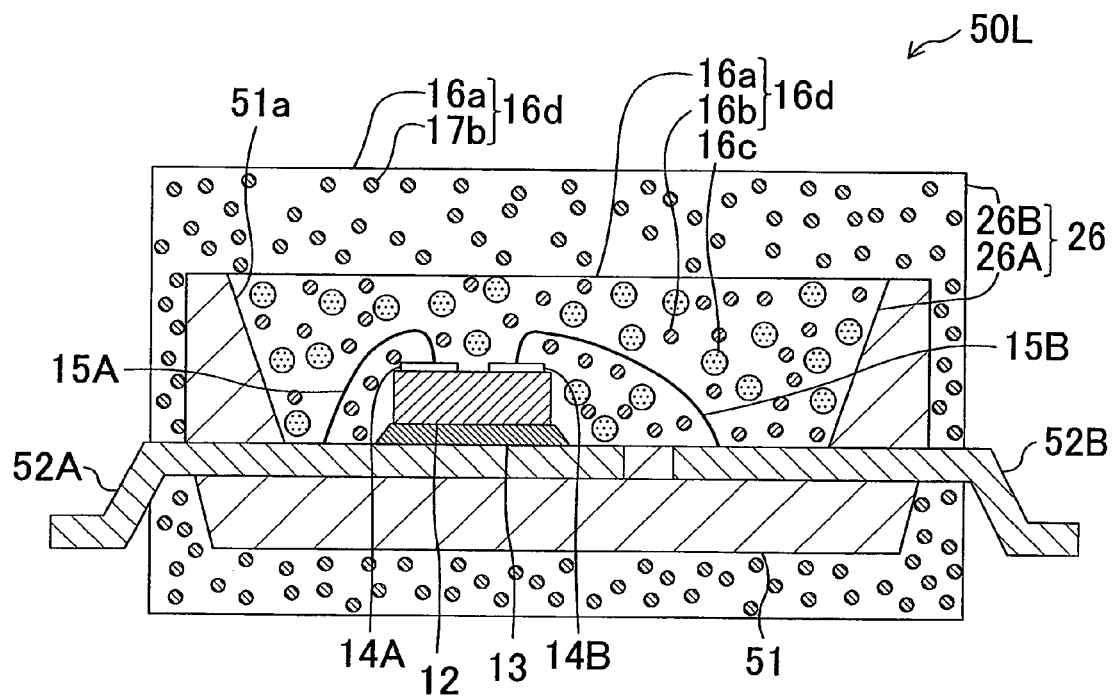
FIG. 44 A schematic cross-sectional view of a structure of a semiconductor light-emitting device according to a variation of the thirteenth embodiment of the present invention.
Figure 45:
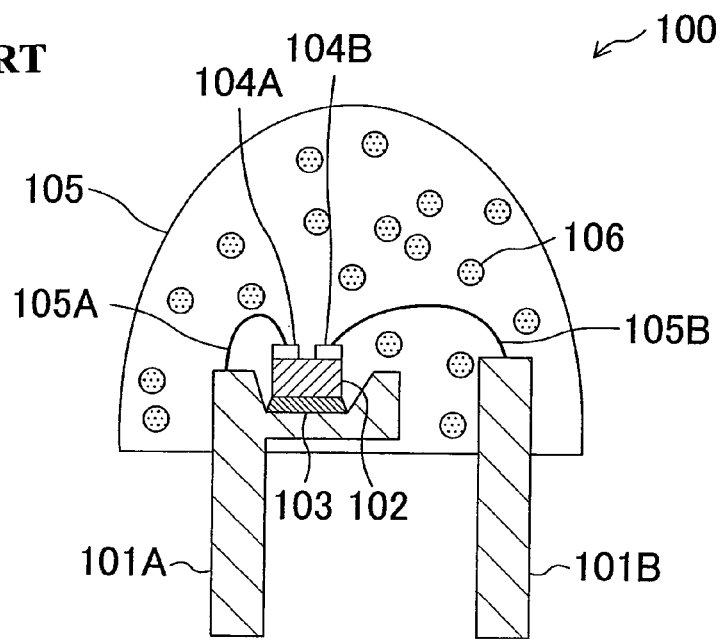
FIG. 45 A schematic cross-sectional view showing a conventional semiconductor light-emitting device.

FIG. 44 is a schematic cross-sectional view of a structure of a white LED device which is a semiconductor light-emitting device according to a variation of the thirteenth embodiment of the present invention.

As shown in FIG. 44, in the semiconductor light-emitting device 50L of this variation, a second sealing portion 26B including second nano-particles 17 capable of absorbing ultraviolet light is formed, covering all surroundings of a case material 51 including not only an upper surface, but also a side surface and a bottom surface of the case material 51.

With this structure, an effect similar to that of the thirteenth embodiment is obtained, and in addition, the heat radiation performance of the case material 51 can be improved.

The second sealing portion 26B which covers the surroundings of the case material 51 is formed, for example, as follows. After the first sealing portion 26A is formed, the first sealing portion 26A is dipped in a liquid sealing material 16d in which the second nano-particles 17 are distributed (dipping method).

Note that, in the sixth embodiment, the first to sixth variations of the sixth embodiment, the seventh embodiment, the first to seventh variations of the seventh embodiment, the tenth embodiment, the eleventh embodiment, the first to fourth variations of the eleventh embodiment, the twelfth embodiment, the thirteenth embodiment, and the variation of the thirteenth embodiment, the matrix material 16a of the first sealing portion 26A is assumed to be the same as the matrix material 16a of the second sealing portion 26B. In this case, the adhesion between the sealing portions is preferably improved, so that the sealing portions are not likely to be peeled off each other, for example. The adhesion between the sealing portions is relatively largely attributed to the adhesion between the matrix materials of these sealing portions. When the sealing portions are made of a composite material, since the proportion of the matrix material is low, the adhesion between the sealing portions can be increased by using the same matrix material for the sealing portions.

Also, although it has been assumed in all embodiments and their variations described above that most of the semiconductor light-emitting devices are a white LED device, the present invention is not limited to the white LED device, and may be applicable to a semiconductor light-emitting device in which an LED chip is sealed by a sealing material to which nano-particles are added.

Note that, if a composite material is used as a sealing portion, the sealing portion is preferably adapted to suppress the attenuation of the transmission amount of emitted light no matter whether the sealing portion has a single-layer structure or a double-layer structure. Note that the structure of the sealing portion may be determined, depending on the application. For example, when the color rendering property is controlled as in the tenth embodiment or when an LED chip includes ultraviolet light and the ultraviolet light is desired to be removed, light having a corresponding wavelength is attenuated by the composite material.

The degree of Rayleigh scattering occurring due to the composite material varies depending on the size of the nano-particle, the mixture concentration of the nano-particle, and the thickness of the sealing portion, and also the wavelength of transmitted light. In particular, the shorter the wavelength of light, the larger the degree of scattering. Therefore, the transmission amount may be affected by the light emission wavelength of an LED chip used, or the structure of the sealing portion made of the composite material.

When the composite material used for the sealing portion has a scattering degree of less than 0.3 with respect to the light emission wavelength of the semiconductor light emitting device, the attenuation amount during transmission of emitted light is reduced. Therefore, the light extraction efficiency is improved. In this case, the Rayleigh scattering component of the transmittance of the sealing portion is less than about 25%.

More preferably, when the scattering degree is 0.2 or less, the attenuation amount during transmission of light is further reduced, so that the light extraction efficiency is improved. Note that, in this case, the Rayleigh scattering component of the transmittance is about 20% or less. In particular, when the scattering degree is 0.1 or less, the Rayleigh scattering component of the transmittance is about 10% or less. Further, when the scattering degree is 0.05 or less, the Rayleigh scattering component of the transmittance is about 5% or less, i.e., the sealing portion is almost transparent and the attenuation amount during transmission of light is negligible.

As used herein, the scattering degree has a value which is represented by a product $\alpha t$ of a Rayleigh scattering extinction coefficient $\alpha$ and a thickness $t$ of a composite material portion. The scattering degree is determined by measuring a transmittance T (%) of the composite material portion having a predetermined thickness t, and from that value, calculating the scattering degree $\alpha t = -\ln(T/100)$, where ln represents natural logarithm. The Rayleigh scattering extinction coefficient $\alpha$ can be obtained by dividing the scattering degree by the thickness. The Rayleigh scattering extinction coefficient $\alpha$ is a material parameter which is determined by the particle size of a nano-particle, the refractive index, or the material composition (mixture amount). By determining the value of the Rayleigh scattering extinction coefficient $\alpha$, the optical design of a device, such as the thickness of the sealing portion or the like, can be easily achieved.

Here, other examples of fluorescent materials available for the present invention, which are described in the first embodiment, will be listed for each color.

i. Blue Fluorescent Materials
(1) Halophosphate fluorescent material: $(Sr,Ba)_{10}(PO_4)_6Cl_2:Eu^{2+}, Sr_{10}(PO_4)_6Cl_2:Eu^{2+}$
(2) Silicate fluorescent material=>$Ba_3MgSi_2O_8:Eu^{2+}$ ii. Blue-Green Fluorescent Materials
(1) Aluminate fluorescent material: $Sr_4Al_{14}O_{25}:Eu^{2+}$
(2) Silicate fluorescent material: $Sr_2Si_3O_8 \cdot 2SrCl_2:Eu^{2+}$ iii. Green Fluorescent Materials
(1) Aluminate fluorescent material: $(Ba,Sr,Ca)Al_2O_4:Eu^{2+}$
(2) Silicate fluorescent material: $(Ba,Sr)_2SiO_4:Eu^{2+}$
(3) α-SIALON fluorescent material: $Sr_{1.5}Al_3Si_9N_{16}:Eu^{2+}$, Ca-α-SiAlON:$Yb^{2+}$
(4) β-SIALON fluorescent material: $\beta-Si_3N_4:Eu^{2+}$
(5) Oxynitride fluorescent materials
  Oxonitrido-silicate: $(Ba,Sr,Ca)Si_2O_2N_2:Eu^{2+}$
  Oxonitrido-aluminosilicate: $(Ba,Sr,Ca)_2Si_4AlON_7:Ce^{3+}$, $(Ba,Sr,Ca)Al_{2-x}Si_xO_{4-x}N_x:Eu^{2+}$ (0<x<2)
(6) Nitride Fluorescent Materials
  Nitorido-silicate fluorescent material: $(Ba,Sr,Ca)_2Si_5N_8:Ce^{3+}$
(7) Sulfide Fluorescent Material
  Thiogallate: $SrGa_2S_4:Eu^{2+}$
(8) Garnet fluorescent material: $Ca_3Sc_2Si_3O_{12}:Ce^{3+}$, $BaY_2SiAl_4O_{12}:Ce^{3+}$, $Y_3(Al,Ga)_5O_{12}:Ce^{3+}$
(9) Oxide fluorescent material: $CaSc_2O_4:Ce^{3+}$ iv. Yellow Fluorescent Materials
(1) Silicate fluorescent material: $(Sr,Ba)_2SiO_4:Eu^{2+}$, $Sr_3SiO_5:Eu^{2+}$
(2) Garnet fluorescent material: $(Y,Gd)_3Al_5O_{12}:Ce^{3+}$, $Y_3Al_5O_{12}:Ce^{3+},Pr^{3+}$
(3) Sulfide Fluorescent Material
  Thiogallate: $CaGa_2S_4:Eu^{2+}$
(4) α-SIALON fluorescent material: Ca-α-SiAlON:$Eu^{2+}$, $(0.75(Ca_{0.9}Eu_{0.1})O.2.25AlN.3.25Si_3N_4:Eu^{2+}$, $Ca_{1.5}Al_3Si_9N_{16}:Eu^{2+}$, etc.)

v. Orange Fluorescent Materials
(1) Silicate fluorescent material: $(Sr,Ca)_2SiO_4:Eu^{2+}$
(2) Garnet Fluorescent Material: $Gd_3Al_5O_{12}:Ce^{3+}$
(3) α-SIALON fluorescent material: Ca-α-SiAlON:$Eu^{2+}$ vi. Red Fluorescent Materials
(1) Sulfide fluorescent material: $(Sr,Ca)S:Eu^{2+}$, $La_2O_2S:Eu^{3+},Sm^{3+}$
(2) Silicate fluorescent material: $Ba_3MgSi_2O_8:Eu^{2+},Mn^{2+}$
(3) Nitride or oxynitride fluorescent material: $(Ca,Sr)SiN_2:Eu^{2+}$,
  $(Ca,Sr)AlSiN_3:Eu^{2+}$,
  $Sr_2Si_{5-x}Al_xO_xN_{8-x}:Eu^{2+}$ (0≦x≦1)

Note that a wavelength converting material, such as a metal complex, an organic dye, a pigment or the like, can be used instead of fluorescent materials.

Nano-particles added to a translucent material (a fluorescent material layer, a sealing material) can be expected to provide an improvement in thixotropy, the light scattering effect, the adjustment of the refractive index of the sealing material, an improvement in thermal conductivity, and the like. Examples of the nano-particles include metal compounds, such as $BaSO_4$, ZnS or $V_2O_5$, or a mixture thereof in addition to those described in the first embodiment. The center particle size of the nano-particle is several tens of nanometers to several hundreds of nanometers.

Also, the substrate 31 or a pedestal on which the LED chip 12 is mounted can be made of a ceramic, such as AlN, $Al_2O_3$, BN, AlN, MgO, ZnO, SiC or C, or a mixture of at least two of them, or a metal, such as Al, Cu, Fe or Au, or an alloy including at least two of them. Further, a glass epoxy can be used.

The reflection layer provided in the case material 51 or the reflector 81 can be made of a metal, such as Ag, Au, Ni, Rh or Pd, or an alloy including at least two of them, in addition to Al.

The matrix material 16a of the sealing material 16d can be a resin, such as an epoxy resin, a silicone resin, an acrylic resin, a urea resin, an imide resin, a polycarbonate resin, a polyphenylsulfide resin, a liquid crystal polymer resin or an acrylonitrile-butadiene-styrene (ABS) resin, or a mixture of at least two of them. Silica or heat-resistant hard glass can be used as cap glass. Low-melting glass can be used as sealing glass.

Sealing gas which seals the LED chip can be nitrogen, argon, or dried air.

INDUSTRIAL APPLICABILITY

The present invention provides a semiconductor light-emitting device comprising a long-life and high-luminance LED and the like, and is useful for, for example, a semiconductor light-emitting device in which a semiconductor chip in which a light emitting device is formed is packaged by resin-sealing.

The invention claimed is:

1. A semiconductor light-emitting device comprising:
   a semiconductor chip for emitting light; and
   a sealing portion formed in at least a partial region on a passage path on which the light is passed,
   wherein the sealing portion includes
      a sealing material which is a composite material including a matrix material and particles made of an inorganic material which are distributed in the matrix material, the particle having an effective particle size which is ¼ or less of the wavelength of the light in the matrix material,
   a refractive index being set to become smaller from an inner region near the semiconductor chip to an outer region, and
   a refractive index of the particle included in the inner region is larger than a refractive index of the particle included in the outer region.

2. The semiconductor light-emitting device of claim 1, wherein
   the sealing portion is formed, covering surroundings of the semiconductor chip.

3. The semiconductor light-emitting device of claim 1, wherein
   the sealing portion is formed, contacting the semiconductor chip.

4. The semiconductor light-emitting device of claim 1, wherein
   the sealing portion comprises a first sealing portion made of the sealing material, and a second sealing portion formed outside the first sealing portion and including a fluorescent material.

5. The semiconductor light-emitting device of claim 4, further comprising:
   a reflection member for reflecting the light provided below and lateral to the semiconductor chip in the first sealing portion.

6. The semiconductor light-emitting device of claim 1, wherein
   the sealing portion comprises a first sealing portion including the sealing material, and a second sealing portion formed outside the first sealing portion, and
   the particle is made of a material which absorbing light in an ultraviolet region.

7. The semiconductor light-emitting device of claim 1, wherein
   the sealing portion comprises a first sealing portion including the fluorescent material, and a second sealing portion formed outside the first sealing portion and including the sealing material.

8. The semiconductor light-emitting device of claim 4, wherein
   the first sealing portion and the second sealing portion have a hemispherical outer shape.

9. The semiconductor light-emitting device of claim 4, wherein
   the first sealing portion has a cross-section having a quadrangular outer shape, and the second sealing portion has a hemispherical outer shape.

10. The semiconductor light-emitting device of claim 4, wherein
    the first sealing portion and the second sealing portion have a cross-section having a quadrangular outer shape.

11. The semiconductor light-emitting device of claim 4, wherein
    the first sealing portion has a hemispherical outer shape, and the second sealing portion has a cross-section having a quadrangular outer shape.

12. The semiconductor light-emitting device of claim 1, wherein
    a proportion of the particles in the composite material of the sealing portion is higher in the inner region near the semiconductor chip than in the outer region.

13. The semiconductor light-emitting device of claim 1, wherein
    of the particles included in the sealing portion, the particle included in the inner region of the sealing portion and the particle included in the outer region have different compositions.

14. The semiconductor light-emitting device of claim 1, further comprising:
    a paste material having transparency for fixing the semiconductor chip and the holding material,
    wherein the paste material includes a composite material including a matrix material and particles made of an inorganic material which are distributed in the matrix material, the particle having an effective particle size which is ¼ or less of the wavelength of the light in the matrix material.

15. The semiconductor light-emitting device of claim 14, wherein
    the particle included in the paste material is made of a material for absorbing light in an ultraviolet region.

* * * * *